(12) United States Patent
Hashiya et al.

(10) Patent No.: US 9,882,100 B2
(45) Date of Patent: Jan. 30, 2018

(54) LIGHT-EMITTING DEVICE HAVING SURFACE STRUCTURE FOR LIMITING DIRECTIONAL ANGLE OF LIGHT

(71) Applicant: Panasonic Intellectual Property Management Co., Ltd., Osaka (JP)

(72) Inventors: Akira Hashiya, Osaka (JP); Taku Hirasawa, Kyoto (JP); Yasuhisa Inada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/216,669

(22) Filed: Jul. 21, 2016

(65) Prior Publication Data

US 2017/0054060 A1    Feb. 23, 2017

(30) Foreign Application Priority Data

Aug. 20, 2015   (JP) ................................. 2015-163041

(51) Int. Cl.
*H01L 33/50*   (2010.01)
*H01L 33/22*   (2010.01)
*H01L 33/44*   (2010.01)

(52) U.S. Cl.
CPC ............ *H01L 33/505* (2013.01); *H01L 33/44* (2013.01); *H01L 33/508* (2013.01)

(58) Field of Classification Search
CPC ......... H01L 33/20; H01L 33/22; H01L 33/24; H01L 33/505; H01L 33/44; H01L 33/508
See application file for complete search history.

(56) References Cited

U.S. PATENT DOCUMENTS

| | | | |
|---|---|---|---|
| 5,517,039 A * | 5/1996 | Holonyak, Jr. | ......... H01L 33/44 257/631 |
| 5,732,102 A | 3/1998 | Bouadma | |
| 6,728,034 B1 | 4/2004 | Nakanishi et al. | |
| 7,619,357 B2 | 11/2009 | Onishi et al. | |
| 7,699,482 B2 | 4/2010 | Noguchi | |
| 8,619,363 B1 | 12/2013 | Coleman | |

(Continued)

FOREIGN PATENT DOCUMENTS

| | | |
|---|---|---|
| JP | 9-073807 | 3/1997 |
| JP | 11-283751 | 10/1999 |

(Continued)

OTHER PUBLICATIONS

Non-final Office Action issued in U.S. Appl. No. 14/618,591, dated Nov. 9, 2015.

(Continued)

*Primary Examiner* — Allen Parker
*Assistant Examiner* — Long H Le
(74) *Attorney, Agent, or Firm* — McDermott Will & Emery LLP

(57) ABSTRACT

A light-emitting device includes: a photoluminescent layer that emits light; and a light-transmissive layer on which the emitted light is to be incident. At least one of the photoluminescent layer and the light-transmissive layer defines a surface structure. The surface structure has projections and/or recesses to limit a directional angle of the emitted light. The photoluminescent layer and the light-transmissive layer are curved.

18 Claims, 36 Drawing Sheets

(56) References Cited

U.S. PATENT DOCUMENTS

| | | | |
|---|---|---|---|
| 2002/0180348 A1 | 12/2002 | Oda et al. | |
| 2003/0021314 A1 | 1/2003 | Yoshida et al. | |
| 2003/0169792 A1* | 9/2003 | Kim | H01S 5/06256 372/50.11 |
| 2004/0141108 A1 | 7/2004 | Tanaka et al. | |
| 2004/0233534 A1 | 11/2004 | Nakanishi et al. | |
| 2006/0039433 A1 | 2/2006 | Simpson | |
| 2006/0088066 A1 | 4/2006 | He | |
| 2007/0031097 A1* | 2/2007 | Heikenfeld | G02B 26/02 385/129 |
| 2007/0103931 A1 | 5/2007 | Lee et al. | |
| 2007/0138479 A1* | 6/2007 | Yamazaki | G09G 3/2014 257/72 |
| 2007/0153860 A1 | 7/2007 | Chang-Hasnain et al. | |
| 2008/0069497 A1 | 3/2008 | Tissot et al. | |
| 2008/0149916 A1 | 6/2008 | Baba et al. | |
| 2008/0258160 A1 | 10/2008 | Do | |
| 2008/0303419 A1 | 12/2008 | Fukuda | |
| 2009/0021153 A1 | 1/2009 | Lee et al. | |
| 2009/0129115 A1 | 5/2009 | Fine et al. | |
| 2009/0190068 A1 | 7/2009 | Kawamura | |
| 2009/0206325 A1 | 8/2009 | Biwa et al. | |
| 2009/0267092 A1* | 10/2009 | Fukshima | H01L 33/20 257/98 |
| 2009/0286337 A1 | 11/2009 | Lee et al. | |
| 2010/0074284 A1 | 3/2010 | Aizawa et al. | |
| 2010/0142189 A1 | 6/2010 | Hong et al. | |
| 2010/0164365 A1 | 7/2010 | Yoshino et al. | |
| 2010/0246210 A1 | 9/2010 | Yashiro | |
| 2010/0277887 A1 | 11/2010 | Su et al. | |
| 2011/0101359 A1* | 5/2011 | Kim | H01L 27/3246 257/59 |
| 2011/0198645 A1 | 8/2011 | Jo et al. | |
| 2012/0018705 A1 | 1/2012 | Takazoe et al. | |
| 2012/0106127 A1 | 5/2012 | Hattori et al. | |
| 2012/0119638 A1 | 5/2012 | Sato et al. | |
| 2012/0176766 A1 | 7/2012 | Natsumeda | |
| 2012/0224378 A1 | 9/2012 | Koike et al. | |
| 2012/0286258 A1* | 11/2012 | Naraoka | C09K 11/06 257/40 |
| 2013/0069046 A1* | 3/2013 | Ishizuya | H01L 51/5271 257/40 |
| 2013/0181195 A1* | 7/2013 | Cho | H01L 51/5203 257/40 |
| 2013/0208327 A1 | 8/2013 | Bolle et al. | |
| 2013/0277703 A1 | 10/2013 | Matsuzaki | |
| 2013/0308102 A1 | 11/2013 | Natsumeda et al. | |
| 2014/0022818 A1 | 1/2014 | Natsumeda et al. | |
| 2014/0071683 A1 | 3/2014 | Hamada et al. | |
| 2014/0092620 A1 | 4/2014 | Tissot | |
| 2014/0185316 A1 | 7/2014 | Kim et al. | |
| 2014/0306176 A1 | 10/2014 | Chiu et al. | |
| 2014/0362604 A1 | 12/2014 | Masuda | |
| 2015/0249183 A1 | 9/2015 | Hirasawa et al. | |
| 2015/0249186 A1 | 9/2015 | Inada et al. | |
| 2015/0249187 A1 | 9/2015 | Inada et al. | |
| 2016/0265746 A1 | 9/2016 | Hirasawa et al. | |
| 2016/0265747 A1 | 9/2016 | Nagao et al. | |
| 2016/0265749 A1 | 9/2016 | Inada | |
| 2017/0012232 A1 | 1/2017 | Kataishi et al. | |
| 2017/0075169 A1 | 3/2017 | Hayama | |

FOREIGN PATENT DOCUMENTS

| | | |
|---|---|---|
| JP | 2001-059905 | 3/2001 |
| JP | 2001-155520 | 6/2001 |
| JP | 2007-103901 | 4/2007 |
| JP | 2007-240641 | 9/2007 |
| JP | 2008-130279 | 6/2008 |
| JP | 2008-521211 | 6/2008 |
| JP | 2008-227458 | 9/2008 |
| JP | 2009-140894 | 6/2009 |
| JP | 2010-015874 | 1/2010 |
| JP | 2010-033772 | 2/2010 |
| JP | 2010-097178 | 4/2010 |
| JP | 2010-199357 | 9/2010 |
| JP | 2010-210824 | 9/2010 |
| JP | 2010-231941 | 10/2010 |
| JP | 2010-237311 | 10/2010 |
| JP | 2011-166148 | 8/2011 |
| JP | 2012-093454 | 5/2012 |
| JP | 2012-109334 | 6/2012 |
| JP | 2012-109400 | 6/2012 |
| JP | 2012-182376 | 9/2012 |
| JP | 2013-183020 | 9/2013 |
| JP | 2014-075584 | 4/2014 |
| JP | 2014-082401 | 5/2014 |
| JP | 2014-092645 | 5/2014 |
| JP | 2014-523603 | 9/2014 |
| WO | 2007/034827 | 3/2007 |
| WO | 2007/091687 | 8/2007 |
| WO | 2009/005311 | 1/2009 |
| WO | 2009/099211 | 8/2009 |
| WO | 2011/040528 | 4/2011 |
| WO | 2012/049905 | 4/2012 |
| WO | 2012/108384 | 8/2012 |
| WO | 2012/137584 | 10/2012 |
| WO | 2013/084442 | 6/2013 |
| WO | 2013/125567 | 8/2013 |
| WO | 2013/172025 | 11/2013 |
| WO | 2014/024218 | 2/2014 |
| WO | 2014/119783 | 8/2014 |
| WO | 2015/045886 | 4/2015 |

OTHER PUBLICATIONS

Final Office Action issued in U.S. Appl. No. 14/618,591, dated May 19, 2016.
Non-final Office Action issued in U.S. Appl. No. 14/618,254, dated Feb. 3, 2016.
Non-Final Office Action issued in U.S. Appl. No. 14/621,729, dated Mar. 9, 2016.
Final Office Action issued in U.S. Appl. No. 14/621,729, dated Sep. 28, 2016.
International Search Report of PCT application No. PCT/JP2015/000810 dated Apr. 7, 2015.
International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2015/000815 dated Apr. 7, 2015.
International Search Report of PCT application No. PCT/JP2014/004324 dated Nov. 25, 2014; with English translation.
Specification of U.S. Appl. No. 15/166,123, filed May 26, 2016.
Specification of U.S. Appl. No. 15/169,771, filed Jun. 1, 2016.
Specification of U.S. Appl. No. 15/206,273, filed Jul. 10, 2016.
Specification of U.S. Appl. No. 15/214,523, filed Jul. 20, 2016.
Specification of U.S. Appl. No. 15/214,803, filed Jul. 20, 2016.
Specification of U.S. Appl. No. 15/214,837, filed Jul. 20, 2016.
Specification of U.S. Appl. No. 15/215,592, filed Jul. 21, 2016.
Specification of U.S. Appl. No. 15/215,595, filed Jul. 21, 2016.
Specification of U.S. Appl. No. 15/215,599, filed Jul. 21, 2016.
Specification of U.S. Appl. No. 15/216,686, filed Jul. 21, 2016.
Specification of U.S. Appl. No. 15/219,462, filed Jul. 26, 2016.
Non-Final Office Action issued in U.S. Appl. No. 15/169,771, dated Aug. 16, 2017.
Non-Final Office Action issued in U.S. Appl. No. 15/214,803, dated Aug. 8, 2017.
Non-Final Office Action issued in U.S. Appl. No. 15/214,837, dated Sep. 12, 2017.
Non-Final Office Action issued in U.S. Appl. No. 15/215,595, dated Jul. 28, 2017.

(56) References Cited

OTHER PUBLICATIONS

Notice of Allowance issued in U.S. Appl. No. 15/215,595, dated Sep. 22, 2017.
Non-Final Office Action issued in U.S. Appl. No. 15/215,599, dated Aug. 25, 2017.
Non-Final Office Action issued in U.S. Appl. No. 15/219,462, dated Sep. 26, 2017.
Notice of Allowance issued in U.S. Appl. No. 15/169,771, dated Oct. 24, 2017.
Specification of U.S. Appl. No. 15/446,453, filed Mar. 1, 2017.
The Extended European Search Report dated Dec. 16, 2016 for the related European Patent Application No. 14883764.4.

* cited by examiner

LIGHT-EMITTING DEVICE HAVING SURFACE STRUCTURE FOR LIMITING DIRECTIONAL ANGLE OF LIGHT

BACKGROUND

1. Technical Field

The present disclosure relates to a light-emitting device and more particularly to a light-emitting device having a photoluminescent layer.

2. Description of the Related Art

Optical devices, such as lighting fixtures, displays, and projectors, are required to emit light in a desired direction in accordance with the intended use. However, photoluminescent materials, such as those used for fluorescent lamps and white light-emitting diodes (LEDs), emit light in all directions. Thus, those materials are used in combination with optical elements, such as reflectors and lenses, to emit light only in a particular direction. For example, Japanese Unexamined Patent Application Publication No. 2010-231941 discloses a lighting system including a light distributor and an auxiliary reflector to provide sufficient directionality.

SUMMARY

A light-emitting device according to an aspect includes: a photoluminescent layer that emits light; and a light-transmissive layer on which the emitted light is to be incident. At least one of the photoluminescent layer and the light-transmissive layer defines a surface structure. The surface structure has projections and/or recesses to limit a directional angle of the emitted light. The photoluminescent layer and the light-transmissive layer are curved.

It should be noted that comprehensive or specific embodiments may be implemented as a system or a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Overview of Embodiments

Figure 1A:
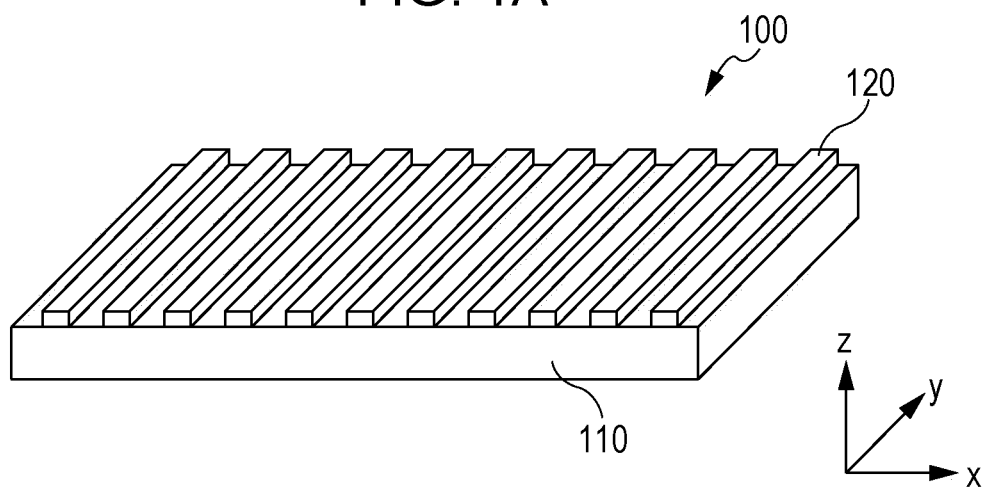
FIG. 1A is a schematic perspective view of an example of a light-emitting device according to a first embodiment.

A light-emitting device according to an embodiment includes a photoluminescent layer for emitting light having a wavelength $\lambda_a$ in air upon receiving excitation light, a light-transmissive layer located on or near the photoluminescent layer, and a surface structure formed on a surface of the light-transmissive layer and having projections and/or recesses. The surface structure limits the directional angle of the light having the wavelength $\lambda_a$ in air emitted from the photoluminescent layer. The photoluminescent layer and the light-transmissive layer are curved.

A light-emitting device according to an embodiment includes a photoluminescent layer for emitting light having a wavelength $\lambda_a$ in air upon receiving excitation light, a light-transmissive layer having a higher refractive index than the photoluminescent layer, and a surface structure formed on a surface of the light-transmissive layer and having projections and/or recesses. The surface structure limits the directional angle of the light having the wavelength $\lambda_a$ in air emitted from the photoluminescent layer. The photoluminescent layer and the light-transmissive layer are curved.

A light-emitting device according to an embodiment includes a photoluminescent layer for emitting light having a wavelength $\lambda_a$ in air upon receiving excitation light and a surface structure formed on a surface of the photoluminescent layer and having projections and/or recesses. The surface structure limits the directional angle of the light having the wavelength $\lambda_a$ in air emitted from the photoluminescent layer. The photoluminescent layer is curved.

A light-emitting device according to an embodiment includes a photoluminescent layer for emitting light having a wavelength $\lambda_a$ in air upon receiving excitation light, a light-transmissive layer in direct contact with the photoluminescent layer, and a surface structure formed at an interface between the photoluminescent layer and the light-transmissive layer and having projections and/or recesses. The surface structure limits the directional angle of the light having the wavelength $\lambda_a$ in air emitted from the photoluminescent layer. The photoluminescent layer and the light-transmissive layer are curved.

Any of these light-emitting devices may further include a substrate on which the photoluminescent layer is disposed. The photoluminescent layer and substrate may be curved.

A light-emitting device according to an embodiment includes a photoluminescent layer for emitting light having a wavelength $\lambda_a$ in air upon receiving excitation light and a surface structure formed on a surface of the photoluminescent layer and having projections and/or recesses. The surface structure limits the directional angle of the light having the wavelength $\lambda_a$ in air emitted from the photoluminescent layer. The thickness of the photoluminescent layer decreases or increases from the edge to the center of the photoluminescent layer.

For example, the thickness of the photoluminescent layer may decrease or increase from one end portion to the other end portion of the photoluminescent layer.

The light-emitting device may further include a substrate on which the photoluminescent layer is disposed. The surface structure may be disposed on the photoluminescent layer opposite the substrate.

In any of these light-emitting devices, the surface structure may limit the directional angle of light having the wavelength $\lambda_a$ in air emitted from the photoluminescent layer to less than 15 degrees.

In any of these light-emitting devices, the distance $D_{int}$ between adjacent projections and/or recesses of the surface structure and the refractive index $n_{wav-a}$ of the photoluminescent layer for light having the wavelength $\lambda_a$ in air may satisfy $\lambda_a/n_{wav-a} < D_{int} < \lambda_a$.

In any of these light-emitting devices, the surface structure may have at least one periodic structure. The at least one periodic structure may have a period $p_a$ that satisfies $\lambda_a/n_{wav-a} < p_a < \lambda_a$.

The wavelength $\lambda_a$ may be in the visible wavelength range (e.g., 380 to 780 nm). In applications utilizing infrared light, the wavelength $\lambda_a$ may be more than 780 nm. In applications utilizing ultraviolet light, the wavelength $\lambda_a$ may be less than 380 nm. In the present disclosure, all electromagnetic waves, including infrared light and ultraviolet light, are referred to as "light" for convenience.

The photoluminescent layer contains a photoluminescent material. The term "photoluminescent material" refers to a material that emits light in response to excitation light. The term "photoluminescent material" encompasses fluorescent and phosphorescent materials, inorganic and organic materials (e.g., dyes), and bulk semiconductors and quantum dots (i.e., semiconductor nanoparticles). The photoluminescent layer may contain a matrix material in addition to the photoluminescent material. Examples of matrix materials include resins and inorganic materials, such as glasses and oxides.

The light-transmissive layer is formed of a material, for example, an inorganic material or resin, having high transmittance to light emitted from the photoluminescent layer. The light-transmissive layer may be formed of a dielectric material. The dielectric material may be an insulator having low light absorptivity. The light-transmissive layer may be a substrate on which the photoluminescent layer is disposed. If the surface of the photoluminescent layer exposed to air has a submicron structure described later, the light-transmissive layer may be an air layer.

At least one of surfaces of the photoluminescent layer and surfaces of the light-transmissive layer defines a surface structure having projections and/or recesses. The term "surface" of a layer, as used herein, refers to an interface at which a portion of the layer is in direct contact with a substance that differs from that of the layer. If the light-transmissive layer is a gas layer (e.g., an air layer), a surface of the gas layer is an interface between the gas layer and an adjacent layer (e.g., the photoluminescent layer). Thus, the surface structure is defined as an interface between adjacent media having different refractive indices. Examples of "a surface structure having projections and/or recesses" include a surface structure having projections, a surface structure having recesses, and a surface structure having projections and recesses.

The surface structure typically includes a periodic structure. The "periodic structure" is defined by one- or two-dimensional periodic projections and/or recesses. In other words, the projections and/or recesses of the periodic structure are periodically arranged in at least one direction. The refractive index in a line or face crossing the projections and/or recesses of the periodic structure periodically varies along the at least one direction.

In a periodic structure, the centers of projections (or recesses) may be periodically arranged in plan view, or sides of projections (or recesses) may be periodically arranged in plan view.

The term "periodically" refers not only to periodically in the strict sense but also to approximately periodically. For example, when the distance between two adjacent centers of projections (or recesses) of a periodic structure ranges from 0.85 p to 1.15 p, the period of these projections (or recesses) can be approximated to a period p. For example, the periodicity may be based on side surfaces of projections (or recesses) in plan view, instead of the centers of projections (or recesses).

The term "projection", as used herein, refers to a raised portion with respect to a reference surface. The term "recess", as used herein, refers to a recessed portion with respect to a reference surface. The reference surface may be a surface extending between projections (or recesses). The reference surface may be a flat or curved surface. Depending on the shape, size, and distribution of the surface structure, the reference surface may be selected from two or more surfaces. In this case, whether a portion is a projection or recess depends on the selected reference surface. This relativity results from the surface structure being defined as an interface between media.

Figure 51:
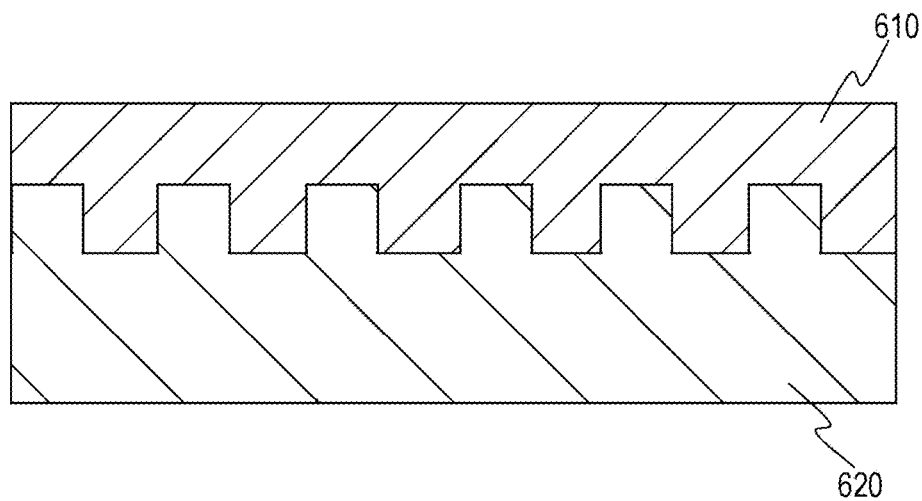
FIG. 51 is a schematic cross-sectional view of a surface structure having projections and/or recesses.

Although "projections" and "recesses" are defined as an interface between media in the strict sense, "projections" and "recesses" may be described below as if they are part of one medium. However, this is only for convenience of explanation and is not intended to limit the present disclosure. For example, in a cross-sectional view of FIG. 51, a member 610 has recesses, and a member 620 has projections, or alternatively the member 610 has projections, and the member 620 has recesses. In either case, the member 610 and the member 620 define projections and/or recesses.

For example, the distance between the centers of two adjacent projections and/or between the centers of two adjacent recesses is shorter than the wavelength $\lambda_a$ of light emitted from the photoluminescent layer in air. The distance may be submicron if light emitted from the photoluminescent layer is visible light, near-infrared light having a short wavelength, or ultraviolet light. Thus, such a surface structure is sometimes referred to as a "submicron structure". The submicron structure may include a region in which the distance between the centers is more than 1 micrometer (µm).

In the following description, the light is visible light, and the surface structure is a submicron structure, for example. However, the following description is true for other cases. For example, the following description is true for a case where the light is infrared light, and the surface structure is a micron structure.

In light-emitting devices according to various embodiments of the present disclosure, a unique electric field distribution is formed within the photoluminescent layer and the light-transmissive layer, as described in detail later with reference to the calculation and experimental results. This electric field distribution is formed by an interaction between guided light and a submicron structure. An optical mode in which such an electric field distribution is formed is referred to as a "quasi-guided mode". Specifically, the "quasi-guided mode" is a mode in which an optical electric-field in the photoluminescent layer and/or the light-transmissive layer is enhanced due to an optical confinement, and in which light is emitted from the photoluminescent layer and/or the light-transmissive layer through the submicron structure to a particular direction. The quasi-guided mode can be utilized to improve the luminous efficiency of photoluminescence, the directionality of light, and/or polarization selectivity, as described later. The term "quasi-guided mode" may be used in the following description to describe novel structures and/or mechanisms contemplated by the present inventors. Such a description is for illustrative purposes only and is not intended to limit the present disclosure in any way.

The distance $D_{int}$ between the centers of adjacent projections (or recesses) of the submicron structure, the wavelength $\lambda_a$ of light in air, and the refractive index $n_{wav-a}$ of the photoluminescent layer can satisfy $\lambda_a/n_{wav-a} < D_{int} < \lambda_a$. If the photoluminescent layer is formed of a medium containing a mixture of materials, the refractive index $n_{wav-a}$ represents the average of the refractive indices of the materials weighted by their respective volume fractions. The photoluminescent layer may include another layer in addition to a layer containing a photoluminescent material. If the other layer has a higher refractive index than the layer containing a photoluminescent material, the refractive index $n_{wav-a}$ represents the average of the refractive indices of these layers weighted by their respective volume fractions.

The effective refractive index $n_{eff}$ of the medium for light in a quasi-guided mode satisfies $n_a < n_{eff} < n_{wav-a}$, where $n_a$ denotes the refractive index of air. If light in a quasi-guided mode is totally reflected only in the photoluminescent layer at a reflection angle θ, the effective refractive index $n_{eff}$ may be represented by $n_{wav-a} \sin θ$. The effective refractive index $n_{eff}$ depends on the refractive index of a medium in which the electric field of a quasi-guided mode is distributed. Thus, if the submicron structure is formed on the light-transmissive layer, the effective refractive index $n_{eff}$ depends not only on the refractive index of the photoluminescent layer but also on the refractive index of the light-transmissive layer.

The distribution of the electric field of a quasi-guided mode varies with the polarization direction (e.g., TE mode or TM mode). Thus, the effective refractive index $n_{eff}$ in the TE mode may differ from the effective refractive index $n_{eff}$ in the TM mode.

The submicron structure is defined by at least one of the photoluminescent layer and the light-transmissive layer. If the photoluminescent layer is in direct contact with the light-transmissive layer, the submicron structure is defined at the interface therebetween. In this case, it is assumed that the photoluminescent layer and the light-transmissive layer have the submicron structure.

Alternatively, the photoluminescent layer may have no submicron structure, whereas the light-transmissive layer may have the submicron structure. Provided that the electric field of a guided mode reaches the submicron structure so as to form a quasi-guided mode, the light-transmissive layer may be spaced from the photoluminescent layer. The light-transmissive layer may have a higher refractive index than the photoluminescent layer. The light-transmissive layer may be disposed near the photoluminescent layer. In any of these cases, the electric field of a guided mode can reach the submicron structure and form a quasi-guided mode. The sentence "the light-transmissive layer is disposed near the photoluminescent layer" means that the distance between these layers is less than half the wavelength $\lambda_a$. The distance between the submicron structure and the photoluminescent layer may be less than half the wavelength $\lambda_a$.

If the submicron structure includes a periodic structure, the period $p_a$ of the periodic structure satisfies $\lambda_a/n_{wav-a} < p_a < \lambda_a$. In this case, light in the medium is repeatedly totally reflected and interacts repeatedly with the periodic structure to excite a quasi-guided mode. Thus, light in the quasi-guided mode is diffracted by the periodic structure while propagating through the medium. This phenomenon is different from the phenomenon in which light propagating through the free space is diffracted by a periodic structure. Light in a quasi-guided mode can be efficiently diffracted even if a periodic structure causes a small phase shift or even if a periodic structure has a small height.

Enhancement of the electric field due to a quasi-guided mode increases the luminous efficiency of photoluminescence, and light emission is coupled to the quasi-guided mode.

The angle of travel of light in a quasi-guided mode is changed by the diffraction angle determined by a periodic structure. Thus, light having a particular wavelength can be emitted in a particular direction. The directional angle of output light in the presence of a periodic structure is narrower than that in the absence of the periodic structure. If the effective refractive index $n_{eff}$ (=$n_{wav-a}$ in $\theta$) in the TE mode is different from that in the TM mode, this can improve polarization selectivity. For example, such a light-emitting device can emit intense linearly polarized light, e.g., in the TM mode, having a particular wavelength in the front direction. The directional angle of light emitted in the front direction is less than 15 degrees, for example.

The term "directional angle", as used herein, refers to the angle between (i) the direction in which linearly polarized light of a wavelength, which is emitted from a surface structure, shows a maximum intensity and (ii) the direction in which the linearly polarized light shows 50% of the maximum intensity. The term "front direction", as used herein, refers to the height direction of projections or the depth direction of recesses, or the direction perpendicular to the surface on which projections and/or recesses are arranged.

Although a periodic structure limits the directional angle of light having the wavelength $\lambda_a$, the periodic structure may not emit the entire light having the wavelength at narrow angles. In an example shown in in FIG. 37, although light having the wavelength $\lambda_a$ is mostly emitted at an angle range of 0 to 20 degrees, the light is slightly emitted at an angle range of 20 to 70 degrees. However, as a whole, the emitted light having the wavelength $\lambda_a$ has limited directional angles.

Unlike typically diffraction gratings, the periodic structure has a shorter period than the light wavelength $\lambda_a$. Typically diffraction gratings splits light having into a plurality of diffracted light, such as zero-order light (i.e., transmitted light) and ±1-order diffracted light. Higher-order diffracted light is emitted at an angle with respect to the output direction of zero-order light, thereby preventing from a narrow light distribution. In other words, in typically diffraction gratings, the directional angle of light cannot be limited to a narrow angle (e.g., approximately 15 degrees).

Higher periodicity of the submicron structure results in improved directionality, luminous efficiency, degree of polarization, and wavelength selectivity. The periodic structure may be a one-dimensional periodic structure, which has higher polarization selectivity, or a two-dimensional periodic structure, which allows for lower polarization.

The submicron structure may include periodic structures. For example, these periodic structures may have different periods or different periodic directions. The periodic structures may be formed on the same plane or may be stacked on top of each other. For example, the light-emitting device may include photoluminescent layers and light-transmissive layers, and each of the layers may have submicron structures.

The submicron structure can efficiently guide excitation light into the photoluminescent layer. That is, excitation light can be diffracted by the submicron structure to be coupled to a quasi-guided mode, thereby efficiently exciting the photoluminescent material in the photoluminescent layer. The wavelength $\lambda_{ex}$ of excitation light in air and the refractive index $n_{wav-ex}$ of the photoluminescent layer for the excitation light satisfy $\lambda_{ex}/n_{wav-ex} < D_{int} < \lambda_{ex}$, for example. If the submicron structure includes a periodic structure, the period $p_a$ of the periodic structure may satisfy $\lambda_{ex}/n_{wav-ex} < p_a < \lambda_{ex}$. The excitation light has a wavelength $\lambda_{ex}$ of 450 nm, for example, but may have a shorter wavelength than visible light. If the excitation light has a wavelength in the visible range, the excitation light may be emitted together with light emitted from the photoluminescent layer.

Underlying Knowledge Forming Basis of the Present Disclosure

The underlying knowledge forming the basis for the present disclosure will be described before describing specific embodiments of the present disclosure.

The present inventors have investigated the possibility of causing light to be emitted from the photoluminescent layer with particular directionality. Based on Fermi's golden rule, the emission rate r, which is a measure characterizing light emission, is represented by the formula (1):

$$\Gamma(r) = \frac{2\pi}{\hbar} \langle (d \cdot E(r)) \rangle^2 \rho(\lambda) \qquad (1)$$

In the formula (1), r denotes the vector indicating the position, λ denotes the wavelength of light, d denotes the dipole vector, E denotes the electric field vector, and ρ denotes the density of states. In many substances other than some crystalline substances, dipole vectors d are randomly oriented. The magnitude of the electric field E is substantially constant irrespective of the direction if the size and thickness of the photoluminescent layer are sufficiently larger than the wavelength of light. Hence, in most cases, the value of $\langle (d \cdot E(r)) \rangle^2$ is independent of the direction. Accordingly, the emission rate F is constant irrespective of the direction. Thus, in most cases, the photoluminescent layer emits light in all directions.

As can be seen from the formula (1), to achieve anisotropic light emission, it is necessary to align the dipole vectors d in a particular direction or to enhance a component of the electric field vector E in a particular direction. One of these approaches can be employed to achieve directional light emission. In light-emitting devices according to embodiments of the present disclosure, a quasi-guided mode is excited in the photoluminescent layer to enhance an electric field component in a particular direction. Structures for utilizing a quasi-guided mode have been studied and analyzed in detail as described below.

The present inventors have investigated the possibility of controlling light emission using a guided mode with an intense electric field.

Figure 38:
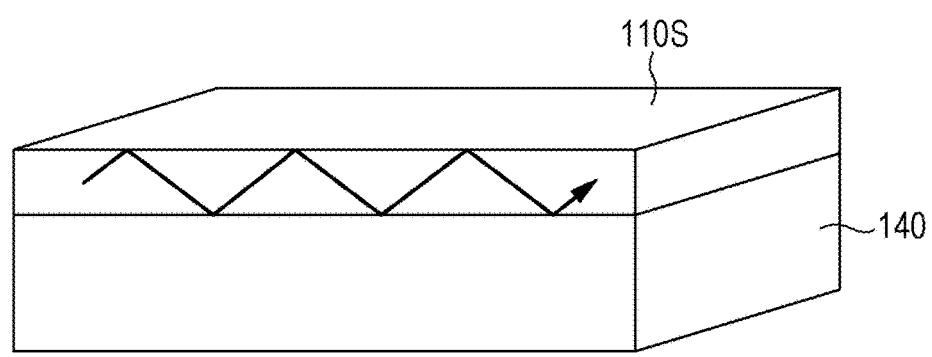
FIG. 38 is a schematic perspective view of a slab waveguide.

First, a waveguide containing a photoluminescent material was studied. The present inventors have studied a slab waveguide as a simple waveguide structure. The slab waveguide is a flat waveguide. FIG. 38 is a schematic perspective view of a slab waveguide 110S. The waveguide 110S is disposed on a transparent substrate 140. When the waveguide 110S has a higher refractive index than the transparent substrate 140, there is a guided mode in which light propagates through the waveguide 110S. If the slab waveguide 110S contains a photoluminescent material, the electric field of light emitted from the photoluminescent material largely overlaps the electric field of a guided mode, thus allowing most of the light to be coupled to the guided mode. If the photoluminescent layer has a thickness close to the wavelength of light, a situation can be created where there is only a guided mode.

However, this only results in light emission in a guided mode, and little light is extracted from the waveguide in the front direction. Accordingly, the present inventors have investigated the possibility of combining a waveguide containing a photoluminescent material with a periodic structure.

When the electric field of light is guided in a waveguide while overlapping a periodic structure located on or near the waveguide, a quasi-guided mode is excited. In a quasi-guided mode, a periodic structure restricts the electric field of light, confined in a waveguide, in a particular distribution so that the restricted electric field is enhanced in the waveguide. In addition, the periodic structure diffracts the light, incident from the waveguide, to a particular direction (e.g., front direction) so that a part of the confined light is extracted from the waveguide as a propagation light. The antinodes of the amplitude of the electric field may have the same period as a periodic structure. The electric field other than quasi-guided modes is not enhanced because such light is rarely confined in the waveguide. Thus, most light is coupled to a quasi-guided mode with a large electric field component. A directional light source can be achieved through this mechanism.

A quasi-guided mode is formed by an interaction between the electric field of a guided mode and a periodic structure. Even if the photoluminescent layer includes multiple layers, a quasi-guided mode is formed as long as the electric field of a guided mode reaches a periodic structure. Not all of the photoluminescent layer needs to be formed of a photoluminescent material, provided that at least a portion of the photoluminescent layer contains a photoluminescent material.

The medium that defines a periodic structure may be a dielectric material having low absorptivity. A periodic structure formed of a nonmetal can prevent plasmon resonance, to easily form a quasi-guided mode. In a periodic structure formed of a medium having low absorptivity, absorption responsible for low light emission can be reduced.

First Embodiment

A light-emitting device according to a first embodiment of the present disclosure will be described below with reference to the accompanying drawings.

1. Light-Emitting Device

FIG. 1A is a schematic perspective view of a light-emitting device 100 according to the first embodiment.

The light-emitting device 100 includes a photoluminescent layer 110 and light-transmissive members 120. The photoluminescent layer 110 functions as a waveguide. The light-transmissive members 120 constitute a light-transmissive layer. The light-transmissive members 120 arranged on the photoluminescent layer 110 form a periodic structure.

Figure 1B:
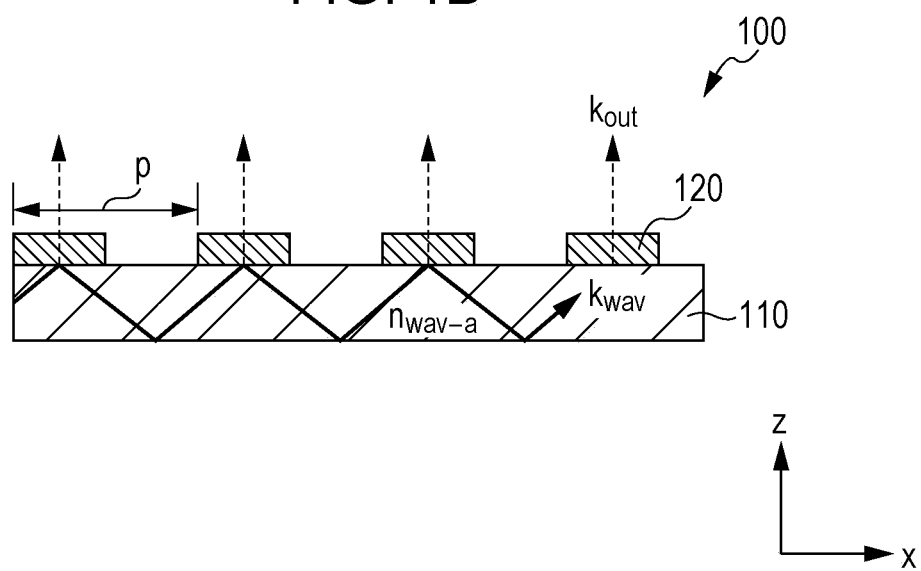
FIG. 1B is a schematic cross-sectional view of the light-emitting device illustrated in FIG. 1A.

In FIG. 1A, the periodic structure has stripe-shaped projections extending in the y direction. These projections are evenly spaced in the x direction. The periodic structure is a one-dimensional periodic structure. FIG. 1B is a cross-sectional view of the light-emitting device 100 taken along a plane parallel to the xz plane. The periodic structure composed of the light-transmissive members 120 has a period p. The periodic structure converts light in a quasi-guided mode, having a wave number $k_{wav}$ in the in-plane direction, into a propagation light which propagates to the outside of the waveguide. The wave number $k_{out}$ of the light can be represented by the formula (2):

$$k_{out} = k_{wav} - m\frac{2\pi}{p} \qquad (2)$$

In the formula (2), m denotes an integer indicating the diffraction order.

For simplicity, the following formulae (3) and (4) approximately hold inside and outside the waveguide.

$$\frac{k_{wav}\lambda_a}{2\pi} = n_{wav-a}\sin\theta_{wav} \qquad (3)$$

$$\frac{k_{out}\lambda_a}{2\pi} = n_{out}\sin\theta_{out} \qquad (4)$$

In these formulae, $\lambda_a$ denotes the wavelength of light in air, $n_{wav-a}$ denotes the refractive index of the waveguide, $\theta_{wav}$ denotes the propagation angle of light propagating through the waveguide, $n_{out}$ denotes the refractive index of a medium on the light emission side (e.g., a transparent substrate or air), and $\theta_{out}$ is the output angle of light emitted from the waveguide. The propagation angle $\theta_{wav}$ and the output angle $\theta_{out}$ are angles with respect to the front direction. The following formula (5) is derived from the formulae (2) to (4).

$$n_{out} \sin \theta_{out} = n_{wav-a} \sin \theta_{wav} - m\lambda_a/p \quad (5)$$

In the formula (5), if $n_{wav-a} \sin \theta_{wav} = m\lambda_a/p$ holds, then $\theta_{out}=0$. Thus, light can be emitted in the front direction.

In order to form a quasi-guided mode, in addition to satisfying the formula (5), there are some constraints.

First, total reflection of light is required for propagating the light in a waveguide. The conditions therefor are represented by the formula (6):

$$n_{out} < n_{wav-a} \sin \theta_{wav} \quad (5)$$

Second, in order to diffract light in a quasi-guided mode using a periodic structure and thereby emit light from a waveguide, $-1 < \sin \theta_{out} < 1$ has to be satisfied in the formula (5). Hence, the following formula (7) has to be satisfied:

$$-1 < \frac{n_{wav-a}}{n_{out}} \sin \theta_{wav} - \frac{m\lambda_a}{n_{out} p} < 1 \quad (7)$$

Third, in order to emit light from a waveguide in the front direction, $\theta_{out}$ in the formula (5) is zero. Hence, the following formula (8) has to be satisfied:

$$p = m\lambda_a/(n_{wav-a} \sin \theta_{wav}) \quad (8)$$

The following formula (9) is derived from the formulae (6) and (8) and $\sin \theta_{wav} < 1$.

$$\frac{m\lambda_a}{n_{wav-a}} < p < \frac{m\lambda_a}{n_{out}} \quad (9)$$

A periodic structure as illustrated in FIGS. 1A and 1B may be designed based on first-order diffracted light (i.e., m=1) because higher-order diffracted light (i.e, m≥2) has low diffraction efficiency. In this case, for example, the period p can be determined so as to satisfy the following formula (10), which is given by substituting m=1 into the formula (9).

$$\frac{\lambda_a}{n_{wav-a}} < p < \frac{\lambda_a}{n_{out}} \quad (10)$$

In the case that the photoluminescent layer 110 is not in direct contact with a transparent substrate, as illustrated in FIGS. 1A and 1B, $n_{out}$ denotes the refractive index of air. Thus, for example, the period p can be determined so as to satisfy the following formula (11), which is given by substituting $n_{out}=1$ into the formula (10).

$$\frac{\lambda_a}{n_{wav-a}} < p < \lambda_a \quad (11)$$

Figure 1C:
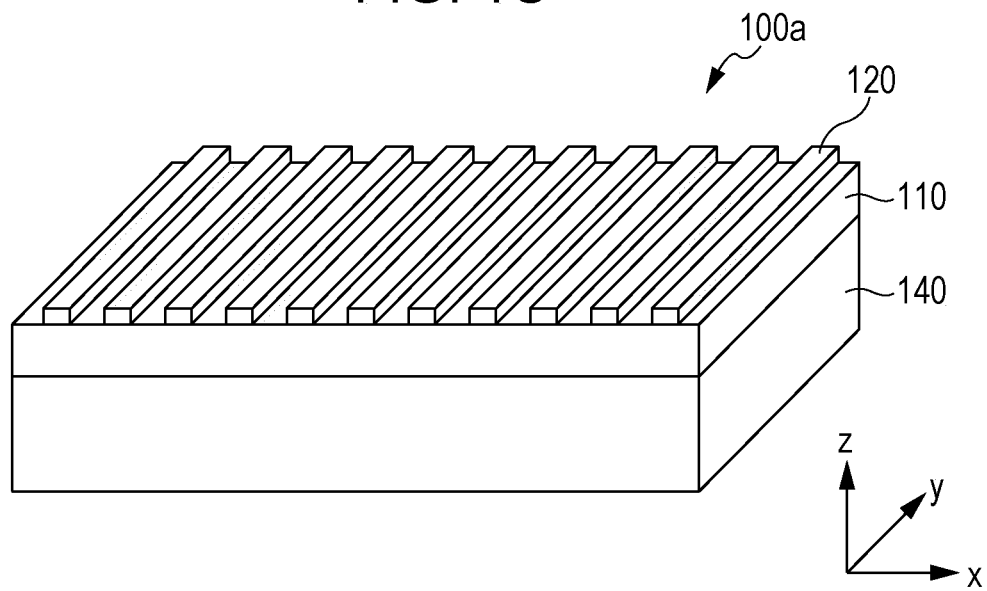
FIG. 1C is a schematic perspective view of an example of the light-emitting device according to the first embodiment.
Figure 1D:
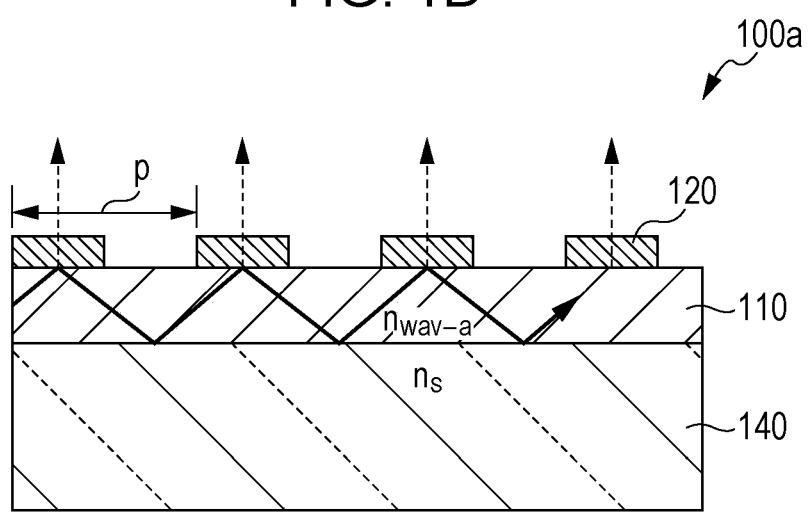
FIG. 1D is a schematic cross-sectional view of the light-emitting device illustrated in FIG. 1C.

FIGS. 1C and 1D are a schematic perspective view and a schematic cross-sectional view of a light-emitting device 100a according to the first embodiment. The light-emitting device 100a includes a transparent substrate 140 and a photoluminescent layer 110 and light-transmissive members 120 disposed on the transparent substrate 140. When the refractive index $n_s$ of the transparent substrate 140 in the light-emitting device 100a is higher than the refractive index of air, the period p can be determined so as to satisfy the following formula (12), which is given by substituting $n_{out}=n_s$ into the formula (10).

$$\frac{\lambda_a}{n_{wav-a}} < p < \frac{\lambda_a}{n_s} \quad (12)$$

Although m=1 is assumed in the formula (9) to give the formulae (11) and (12), the order m may be 2 or more.

For example, when both faces of the light-emitting device 100 are in direct contact with an air layer ($n_{out}=1$), as illustrated in FIGS. 1A and 1B, the period p can be determined so as to satisfy the following formula (13) where m is an integer of 1 or more.

$$\frac{m\lambda_a}{n_{wav-a}} < p < m\lambda_a \quad (13)$$

Figure 10:
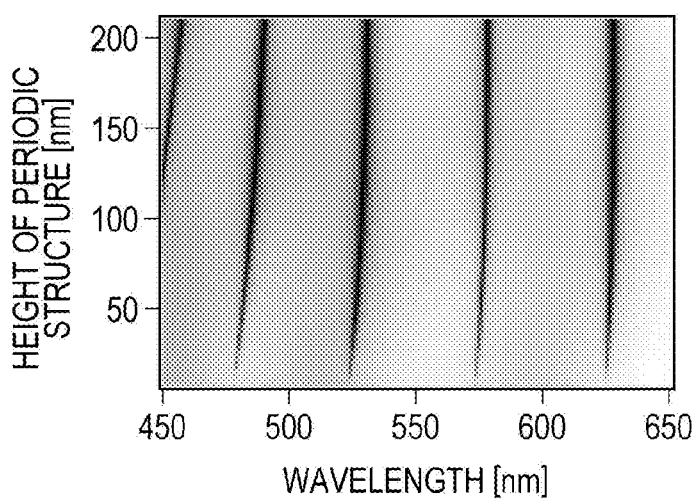
FIG. 10 is a graph showing the calculation results of enhancement of light emitted in the front direction with varying emission wavelengths and varying heights of a periodic structure.

When the photoluminescent layer 110 is disposed on the transparent substrate 140, as in the light-emitting device 100a illustrated in FIGS. 10 and 1D, the period p can be determined so as to satisfy the following formula (14) where m is an integer of 1 or more.

$$\frac{m\lambda_a}{n_{wav-a}} < p < \frac{m\lambda_a}{n_s} \quad (14)$$

Thus, when the periodic structure is designed such that the period p satisfies at least one of the formulae (9) to (14), directional light can be emitted from the photoluminescent layer in the front direction.

2. Calculational Verification 2-1. Period and Wavelength Dependence

The present inventors verified, by optical analysis, whether light emission in a particular direction as described above is actually possible.

The optical analysis was performed by calculations using DiffractMOD available from Cybernet Systems Co., Ltd. In these calculations, the absorbance of the photoluminescent layer for light incident on the light-emitting device in the front direction was calculated to determine enhancement of light emitted from the photoluminescent layer in the front direction. The process of light incident on the photoluminescent layer from the outside being coupled to a quasi-guided mode in the photoluminescent layer and being absorbed by the photoluminescent layer is opposite to the process of light generated by the photoluminescent layer being coupled to a quasi-guided mode and being emitted from the photoluminescent layer. The electric field distribution in the photoluminescent layer was also calculated for light incident on the photoluminescent layer from the outside, thereby determining the electric field distribution for a quasi-guided mode.

A one-dimensional periodic structure that has projections extending in the y direction and evenly spaced in the x direction as illustrated in FIG. 1A was used as a calculation model. The periodic structure had a rectangular cross-section, as illustrated in FIG. 1B. The photoluminescent layer had a thickness of 1 μm, the photoluminescent layer had a refractive index $n_{wav-a}$ of 1.8, the light-transmissive members had a height of 50 nm, and the light-transmissive members had a refractive index $n_p$ of 1.5. Polarized light in the TM mode was used as an emitted light. The polarized light had an electric field component along the y direction.

Figure 2:
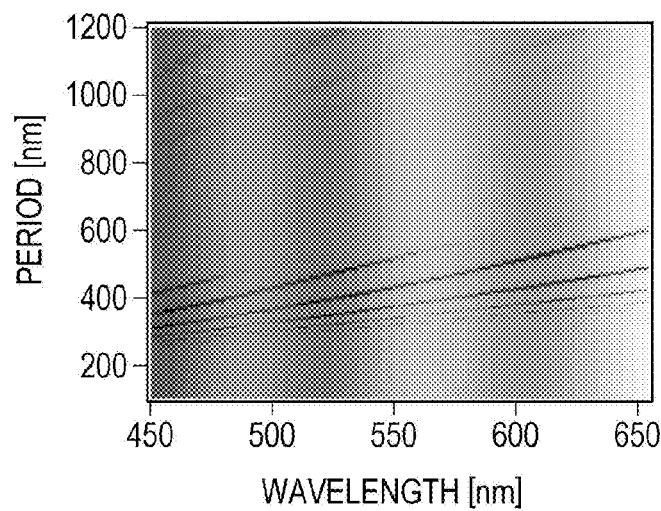
FIG. 2 is a graph showing the calculation results of enhancement of light emitted in the front direction with varying emission wavelengths and varying periods of a periodic structure.

FIG. 2 shows the calculation results of enhancement of light emitted in the front direction with varying emission wavelengths and varying periods of a periodic structure. In FIG. 2, light enhancement is indicated by the shadow, and a darker shadow indicates greater enhancement of light. The results in FIG. 2 show that light enhancement peaks at certain combinations of wavelength and period.

Figure 3:
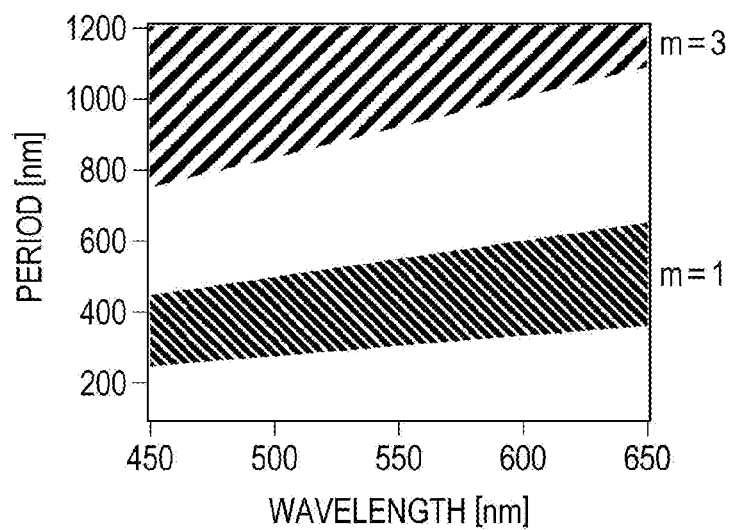
FIG. 3 is a graph showing a region that satisfies the formula (9) when m is 1 or 3.

FIG. 3 shows a region that satisfies the formula (9) when m is 1 or 3. A comparison between FIG. 2 and FIG. 3 shows that each of the peak positions in FIG. 2 is located in one of the regions of m=1 and m=3. The peak intensity is higher in m=1 than in m=3. This is because first-order diffracted light has higher diffraction efficiency than third- or higher-order diffracted light. The reason for no peak in the case of m=2 in FIG. 2 is that second-order diffracted light in the periodic structure has low diffraction efficiency.

The light enhancement peaks appear as lines in FIG. 2, and each of the regions of m=1 and m=3 in FIG. 3 includes lines. This indicates the presence of a plurality of quasi-guided modes.

2-2. Thickness Dependence

Figure 4:
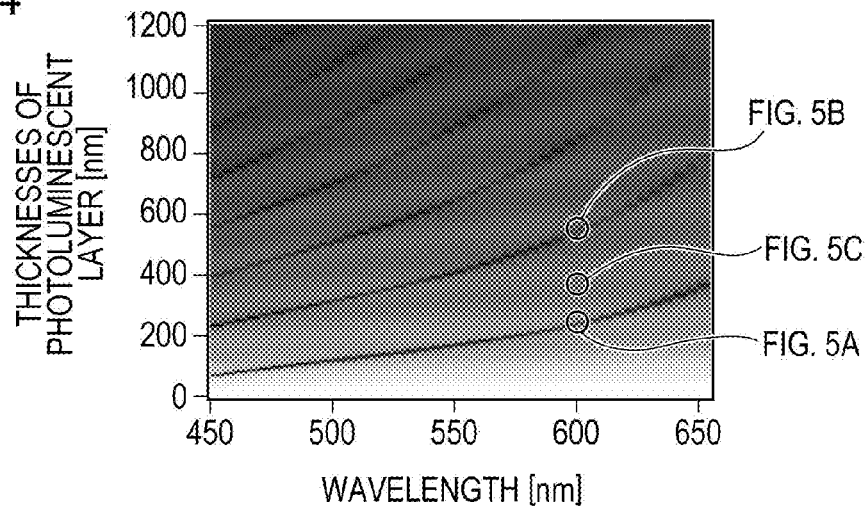
FIG. 4 is a graph showing the calculation results of enhancement of light emitted in the front direction with varying emission wavelengths and varying thicknesses of a photoluminescent layer.

FIG. 4 shows the calculation results of enhancement of light emitted in the front direction with varying emission wavelengths and varying thicknesses of a photoluminescent layer which functions as a waveguide.

Calculations were performed under the conditions described in section 2-1 except that the thickness of the photoluminescent layer was changed and the period of the periodic structure was fixed to 400 nm.

FIG. 4 shows that light enhancement is highest at a particular thickness of the photoluminescent layer.

Figure 5A:
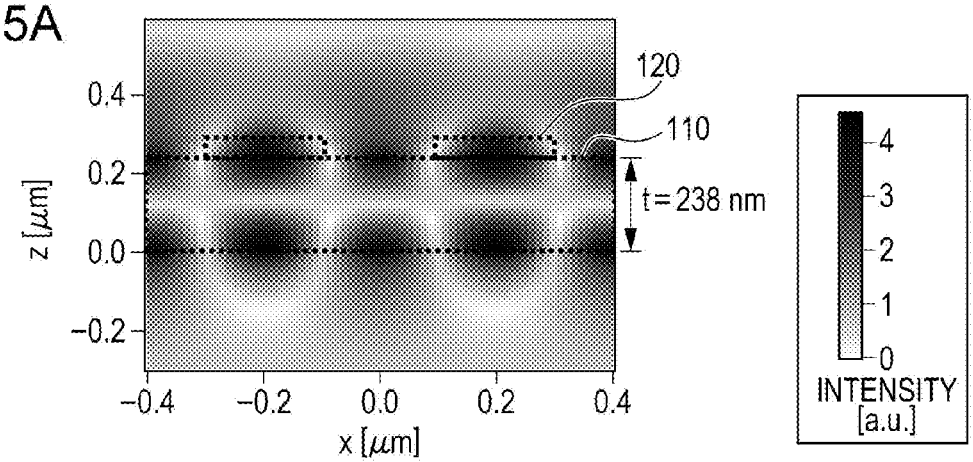
FIG. 5A is a graph showing the calculation results of the electric field distribution of a mode to guide light in the x direction.
Figure 5B:
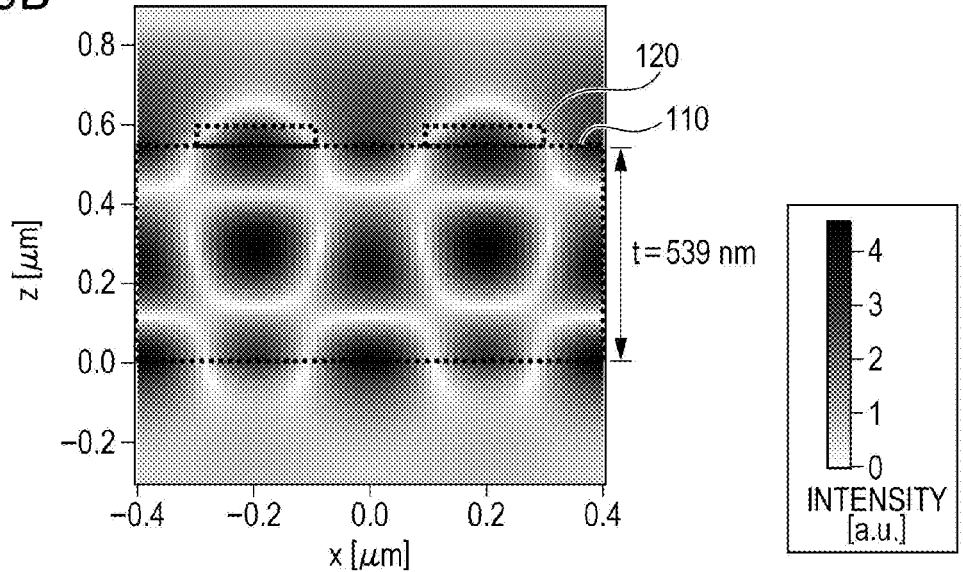
FIG. 5B is a graph showing the calculation results of the electric field distribution of a mode to guide light in the x direction.
Figure 5C:
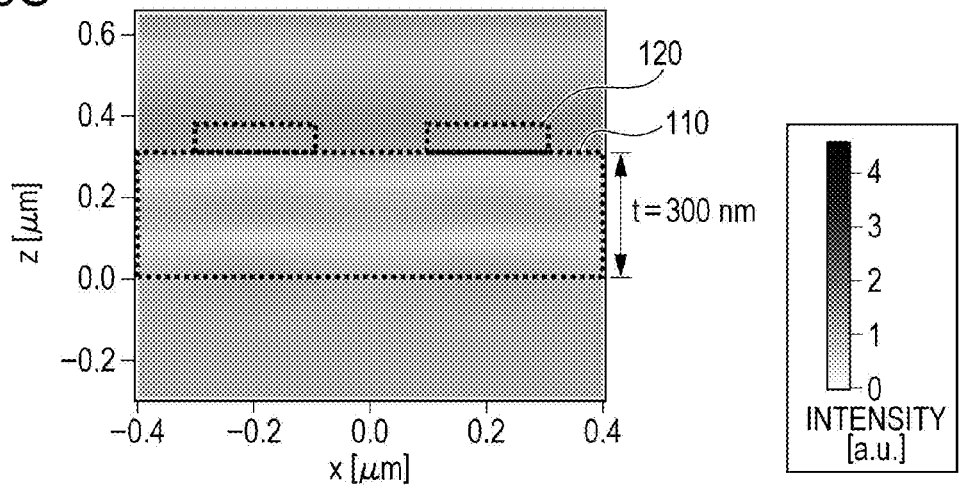
FIG. 5C is a graph showing the calculation results of the electric field distribution of a mode to guide light in the x direction.

FIG. 5A shows the calculation results of the electric field distribution of a mode to guide light in the x direction. The light wavelength was 600 nm, and the photoluminescent layer had a thickness of 238 nm. FIG. 5B shows the calculation results of the electric field distribution of a mode to guide light in the x direction. The light wavelength was 600 nm, and the photoluminescent layer had a thickness of 539 nm. These conditions correspond to the conditions under which light enhancement reaches its peaks in FIG. 4. FIG. 5O shows the calculation results of the electric field distribution of a mode to guide light in the x direction. The light wavelength was 600 nm, and the photoluminescent layer had a thickness of 300 nm. These conditions correspond to the conditions under which light enhancement has no peak in FIG. 4. In each figure, a darker region has higher electric field strength.

Comparing FIGS. 5A to 5O, some regions had high electric field strength in the case of t=238 or 539 nm, whereas the electric field strength was generally low in the case of t=300 nm. This is because a quasi-guided mode is formed in the case of t=238 or 539 nm, so that light in the quasi-guided mode is strongly confined. In FIGS. 5A and 5B, portions having the highest electric field strength (i.e., antinodes of the electric field distribution) are located inside and directly under each of the light-transmissive members 120. Thus, the electric fields have a correlation with the periodic structure. In other words, a guided mode based on the periodic structure. A comparison between FIG. 5A and FIG. 5B shows that these modes differ by one in the number of nodes (white regions) of the electric field in the z direction.

2-3. Polarization Dependence

Figure 6:
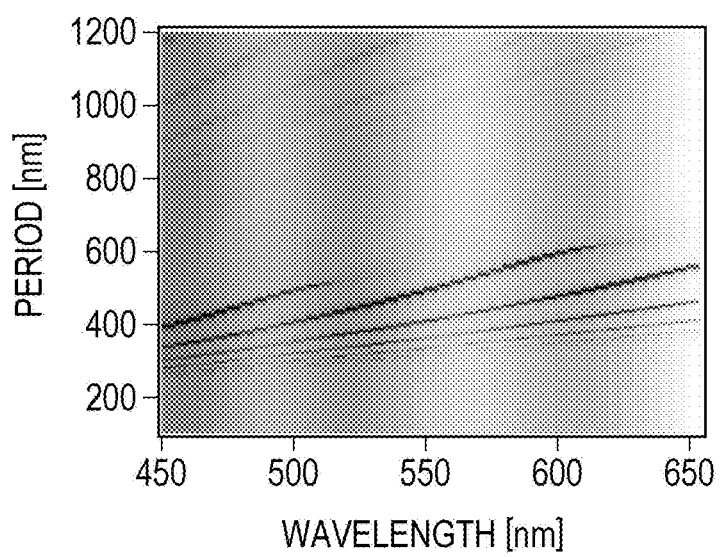
FIG. 6 is a graph showing the calculation results of enhancement of light emitted in the front direction with varying emission wavelengths and varying periods of a periodic structure.

In order to examine polarization dependence, light enhancement was calculated under the conditions described in section 2-1 except that polarized light in the TE mode was used as an emitted light. The polarized light had an electric field component perpendicular to the y direction. FIG. 6 shows the calculation results. Although the peak positions in FIG. 6 are slightly different from those in FIG. 2, the peak positions are located in the regions of m=1 and m=3 illustrated in FIG. 3. This demonstrates that a quasi-guided mode can be formed with polarized light both in the TM mode and in the TE mode.

2-4. Two-Dimensional Periodic Structure

Calculations were performed for a periodic structure having periodicity in two-dimensional directions.

Figure 7A:
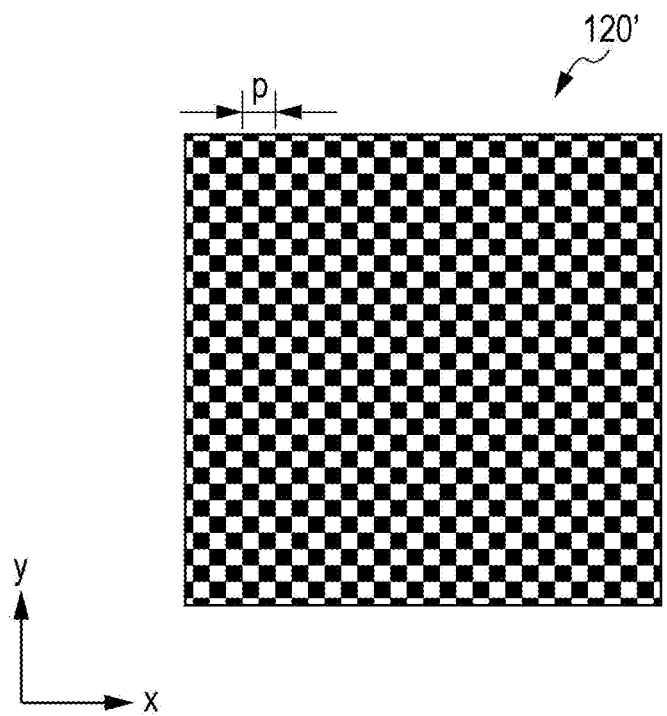
FIG. 7A is a schematic plan view of a two-dimensional periodic structure.

FIG. 7A illustrates part of a periodic structure having periodicity in the x and y directions. This periodic structure includes checkered light-transmissive members 120' on a photoluminescent layer. In FIG. 7A, black regions represent projections, and white regions represent recesses.

In such a two-dimensional periodic structure, diffraction occurs both in the x direction and in the y direction. Specifically, in addition to diffraction in the x direction alone and diffraction in the y direction alone, which are similar to diffraction in a one-dimensional direction, diffraction in a direction having an x direction component and a y direction component (e.g., at an angle of 45 degrees) occurs. Thus, the results for two-dimensional periodic structures can be different from the results for one-dimensional periodic structures.

Figure 7B:
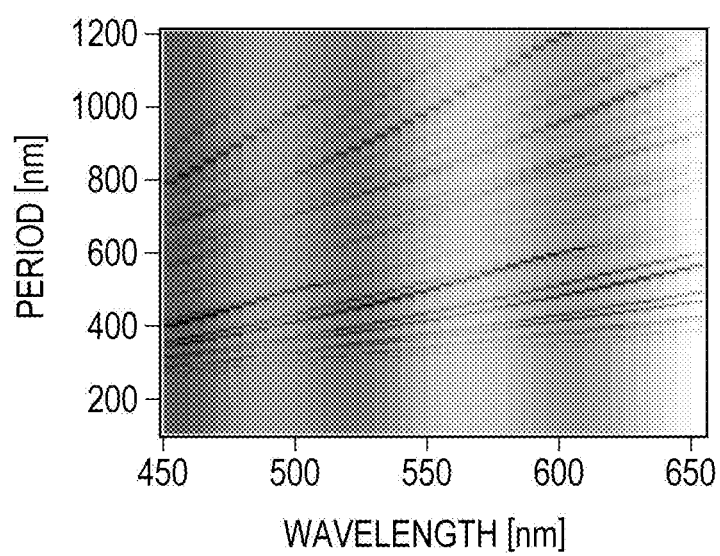
FIG. 7B is a graph showing the calculation results of enhancement of light emitted in the front direction with varying emission wavelengths and varying periods of a periodic structure.

FIG. 7B shows the calculation results of light enhancement in a two-dimensional periodic structure. The calculation model was that described in section 2-1 except for the shape of the periodic structure. The light enhancement peaks in FIG. 7B include the peaks in FIGS. 2 and 6. Thus, the enhancement peaks of polarized light in the TM mode and the enhancement peaks of polarized light in the TE mode appear in FIG. 7B. These results show that the two-dimensional periodic structure can output not only light in the TM mode but also light in the TE mode by diffraction.

Diffraction with a two-dimensional periodic structure can also satisfy the first-order diffraction conditions both in the x direction and in the y direction. Such diffracted light is emitted at an angle corresponding to $\sqrt{2}$ times (i.e., $2^{1/2}$ times) the period p. Thus, in addition to a peak corresponding to the period p, the light enhancement has a peak corresponding to $\sqrt{2}$ times the period p. Such peaks are also observed in FIG. 7B.

Figure 18A:
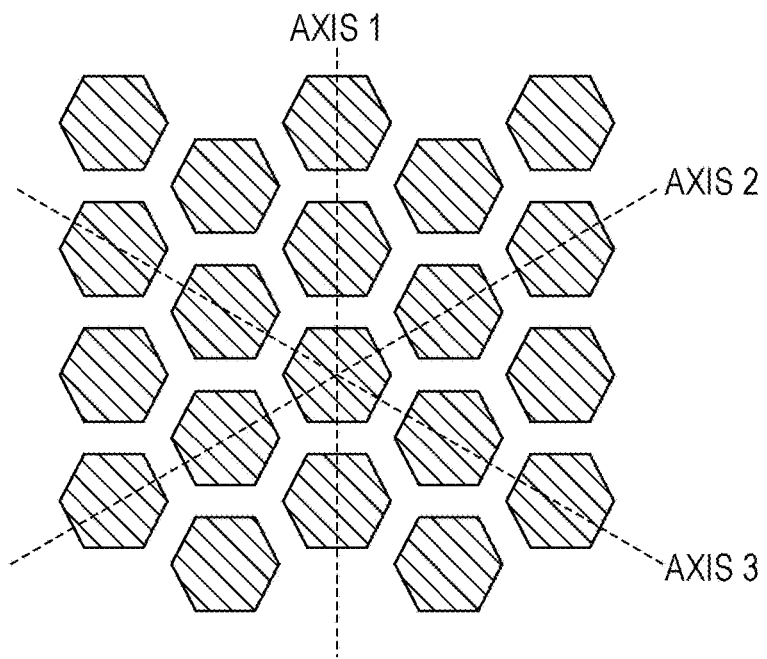
FIG. 18A is a schematic plan view of a two-dimensional periodic structure according to a modified example of the first embodiment.
Figure 18B:
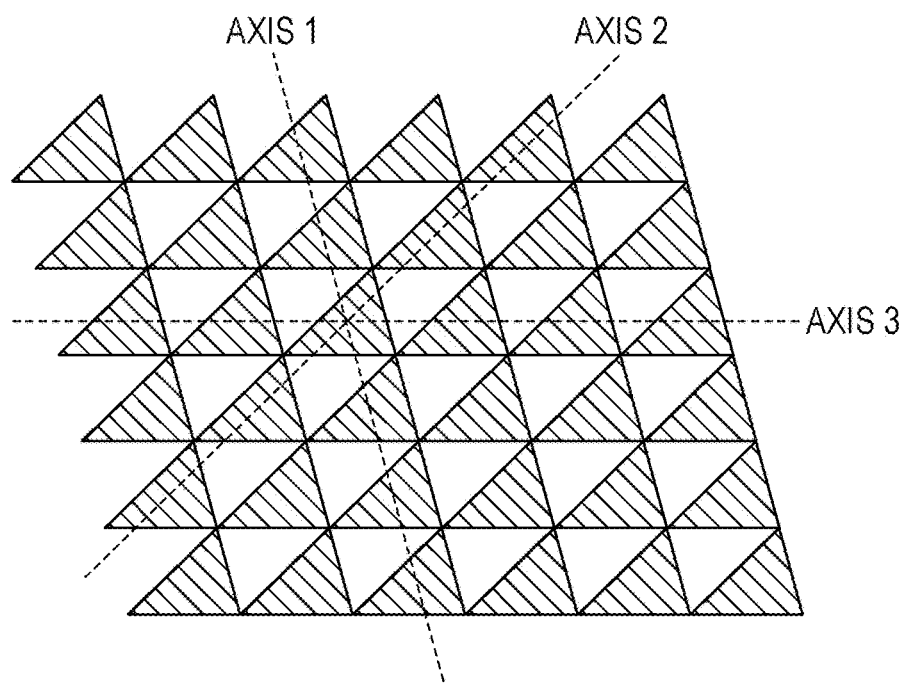
FIG. 18B is a schematic plan view of a two-dimensional periodic structure according to a modified example of the first embodiment.

The two-dimensional periodic structure is not limited to a square grid structure having the same period in the x and y directions, as illustrated in FIG. 7A. For example, the periodic structure may have hexagonal projections and/or recesses, as illustrated in FIG. 18A, or triangular projections and/or recesses, as illustrated in FIG. 18B. The periodic structure may have different periods in different directions. For example, the periodic structure may have different periods in the x and y directions.

3. Various Conditions

The effects of different conditions with respect to the photoluminescent layer, light-transmissive member, and transparent substrate will be described below.

3-1. Refractive Index of Light-Transmissive Layer

The refractive index of light-transmissive members that define a periodic structure has been studied.

Figure 8:
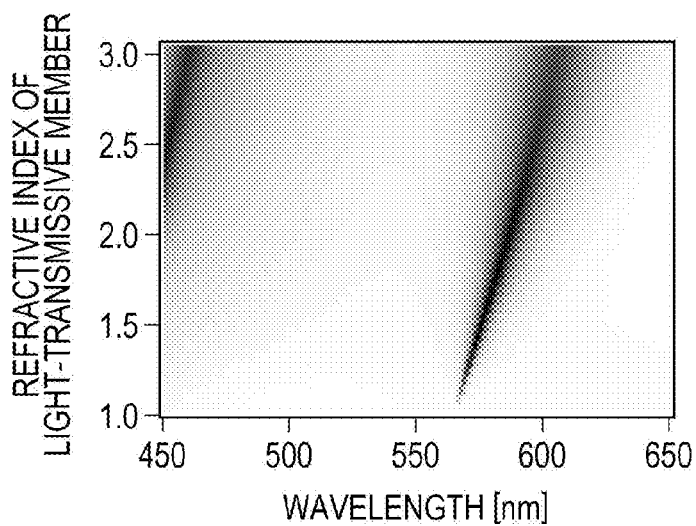
FIG. 8 is a graph showing the calculation results of enhancement of light emitted in the front direction with varying emission wavelengths and varying refractive indices of a light-transmissive member.
Figure 9:
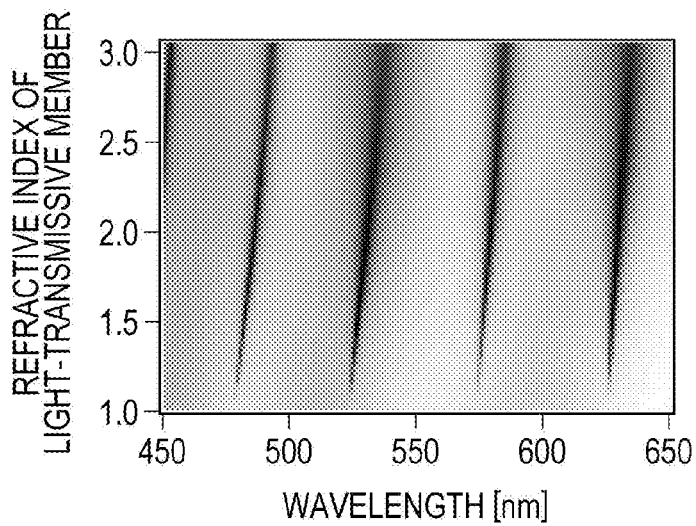
FIG. 9 is a graph showing the calculation results of enhancement of light emitted in the front direction with varying emission wavelengths and varying refractive indices of a light-transmissive member.

FIGS. 8 and 9 show the calculation results of enhancement of light emitted in the front direction with varying emission wavelengths and varying refractive indices of light-transmissive members.

In FIG. 8, calculations were performed under the conditions described in section 2-1 except that the refractive index $n_p$ of the light-transmissive members was changed, and the photoluminescent layer had a thickness of 200 nm, and the periodic structure had a period of 400 nm. In FIG. 9, calculations were performed under the conditions described in section 2-1 except that the refractive index $n_p$ of the light-transmissive members was changed and the periodic structure had a period of 400 nm.

In FIGS. 8 and 9, the wavelengths of light enhancement peaks shifted to longer wavelengths with increasing refractive index $n_p$ of the light-transmissive members. The peak wavelength shift was smaller when the photoluminescent layer had a thickness of 1000 nm (FIG. 9) than when the photoluminescent layer had a thickness of 200 nm (FIG. 8). This is probably for the following reason. The effective refractive index $n_{eff}$ for light in a quasi-guided mode depends on the refractive index distribution of a medium in a region in which the light is distributed. Since light in a quasi-guided mode is distributed in the photoluminescent layer and light-transmissive members, a larger thickness of the photoluminescent layer results in a relatively lower proportion of light distributed in the light-transmissive members, and therefore variations in the refractive index $n_p$ of the light-transmissive members have smaller effects on the effective refractive index $n_{eff}$. Thus, a larger thickness of the photoluminescent layer results in a smaller peak wavelength shift.

In FIGS. 8 and 9, a higher refractive index $n_p$ of the light-transmissive members results in a broader light enhancement peak and a lower peak value. This is because a higher refractive index $n_p$ of the light-transmissive members results in a smaller optical confinement effect (i.e., a lower Q value) and a higher proportion of light in a quasi-guided mode escaped from the light-transmissive members.

In order to maintain a high peak value of light enhancement, for example, the refractive index $n_p$ of the light-transmissive members may be lower than or equal to the refractive index $n_{wav-a}$ of the photoluminescent layer. This results in a higher Q value and a higher peak value of light enhancement. When the photoluminescent layer contains a material other than the photoluminescent material, the refractive index of the other material can be changed to adjust the peak value of light enhancement.

In FIGS. 8 and 9, a quasi-guided mode was observed even when the refractive index $n_p$ of the light-transmissive members was identical with the refractive index $n_{wav-a}$ of the photoluminescent layer (i.e., $n_p = n_{wav-a} = 1.8$). Thus, if the light-transmissive members and the photoluminescent layer are formed of the same material or, in other words, if the photoluminescent layer has projections and/or recesses on its main surface, various advantages of the present embodiment can also be achieved.

3-2. Height of Periodic Structure

The height of a periodic structure has been studied. In this section, the height of the light-transmissive members corresponds to the height of the periodic structure.

Figure 11:
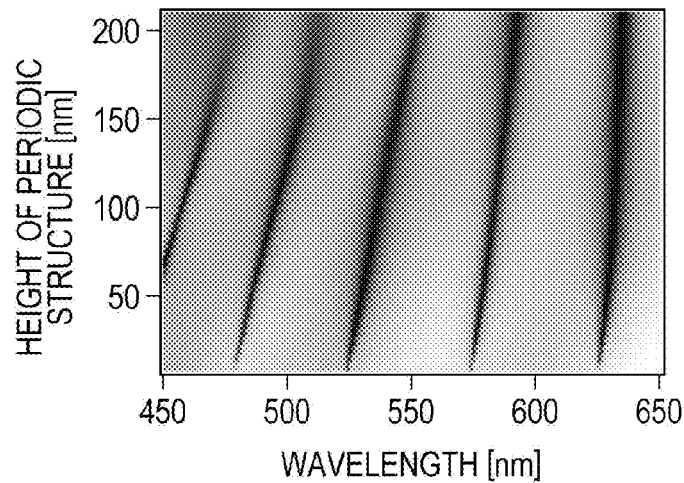
FIG. 11 is a graph showing the calculation results of enhancement of light emitted in the front direction with varying emission wavelengths and varying heights of a periodic structure.

FIGS. 10 and 11 show the calculation results of enhancement of light emitted in the front direction with varying emission wavelengths and varying heights of a periodic structure.

In FIG. 10, calculations were performed under the conditions described in section 2-1 except that the height of the light-transmissive members was changed and the periodic structure had a period of 400 nm. In FIG. 11, calculations were performed under the conditions described in section 2-1 except that the height of the light-transmissive members was changed, the light-transmissive member had a refractive index $n_p$ of 20, and the periodic structure had a period of 400 nm.

In FIG. 10, when the height of the periodic structure exceeds a certain level, the peak value and peak width of light enhancement do not change (that is, the Q value is maintained). In FIG. 11, a greater height of the periodic structure results in a lower peak value and a wider peak of light enhancement (that is, the Q value decreases). This is probably for the following reason. In the case where the refractive index $n_{wav-a}$ of the photoluminescent layer is higher than the refractive index $n_p$ of the light-transmissive members (e.g., in the case of FIG. 10), light is totally reflected on the interface between the photoluminescent layer and the light-transmissive members. Thus, only an evanescent field, the electric field leaking from the photoluminescent layer into the light-transmissive members, interacts with the periodic structure. In a region in the evanescent field spaced by some distance from the interface between the photoluminescent layer and the light-transmissive members, the electric field strength changes slightly with the distance from the interface. Thus, in a region where the periodic structure has a sufficient height, the interaction between the evanescent field and the periodic structure is almost constant irrespective of variations in the height of the periodic structure. Conversely, in the case where the refractive index $n_{wav-a}$ of the photoluminescent layer is lower than the refractive index $n_p$ of the periodic structure (e.g., in the case of FIG. 11), light is not totally reflected on the interface between the photoluminescent layer and the light-transmissive members and reaches the periodic structure. Thus, the interaction between light and the periodic structure increases with the height of the periodic structure.

In FIG. 11, in a region where the periodic structure has a height of 150 nm or less, the Q value is sufficiently high. Thus, if the refractive index $n_{wav-a}$ of the photoluminescent layer is lower than the refractive index $n_p$ of the periodic structure, the periodic structure can have a height of 150 nm or less, for example.

3-3. Polarization Direction

The polarization direction of an emitted light has been studied.

Figure 12:
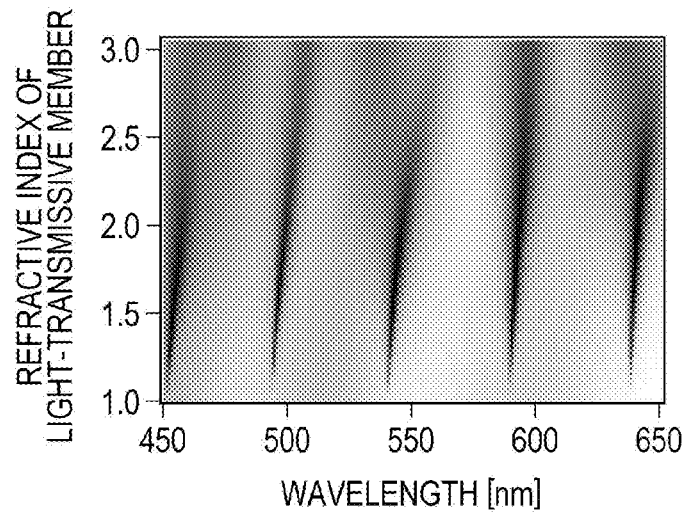
FIG. 12 is a graph showing the calculation results of enhancement of light emitted in the front direction with varying emission wavelengths and varying refractive indices of a light-transmissive member.

FIG. 12 shows the calculation results of enhancement of light emitted in the front direction with varying emission wavelengths and varying refractive indices of light-transmissive members. FIG. 12 shows the results of calculations performed under the same conditions as the calculations in FIG. 9 except that the polarization of light was in the TE mode, which has an electric field component perpendicular to they direction, as an emitted light.

In a region where the refractive index $n_p$ of the light-transmissive members is higher than the refractive index $n_{wav-a}$ of the photoluminescent layer, the peak value of light enhancement was lower for polarized light in the TE mode (FIG. 12) than for polarized light in the TM mode (FIG. 9), and the peak was wider (i.e., the Q value was much lower) for polarized light in the TE mode (FIG. 12) than for polarized light in the TM mode (FIG. 9). This is because the electric field of the TE mode leaks more easily from the photoluminescent layer into the light-transmissive members and is therefore more affected by the periodic structure than the electric field of the TM mode.

3-4. Refractive Index of Photoluminescent Layer

The refractive index of the photoluminescent layer has been studied.

Figure 13:
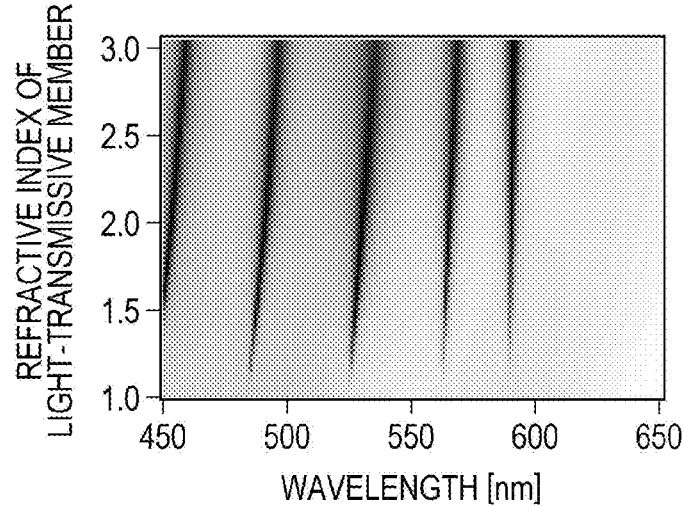
FIG. 13 is a graph showing the calculation results of enhancement of light emitted in the front direction with varying emission wavelengths and varying refractive indices of a light-transmissive member.

FIG. 13 shows the calculation results of enhancement of light emitted in the front direction with varying emission wavelengths and varying refractive indices of light-transmissive members. In FIG. 13, calculations were performed under the same conditions as the calculations in FIG. 9 except that the refractive index $n_{wav-a}$ of the photoluminescent layer was 1.5.

The advantages in FIG. 9 were also substantially achieved in FIG. 13. In FIG. 13, however, light having a wavelength of 600 nm or more was not emitted in the front direction. This is because $\lambda_a \geq 600$ nm results in $m\lambda_a/n_{wav-a} \geq 1 \times 600$ nm/1.5=400 nm=p, thus failing to satisfy the formula (9).

Analyses in sections 3-2 and 3-4 show that when the refractive index of the light-transmissive members is lower than the refractive index of the photoluminescent layer, or when the refractive index of the light-transmissive members is higher than the refractive index of the photoluminescent layer and the light-transmissive members have a height of 150 nm or less, the Q value and the peak value of light enhancement can be increased.

3-5. Transparent Substrate

If the transparent substrate 140 is in direct contact with the photoluminescent layer 110, as illustrated in FIGS. 1C and 1D, the period p can be determined to satisfy the formula (14).

Figure 14:
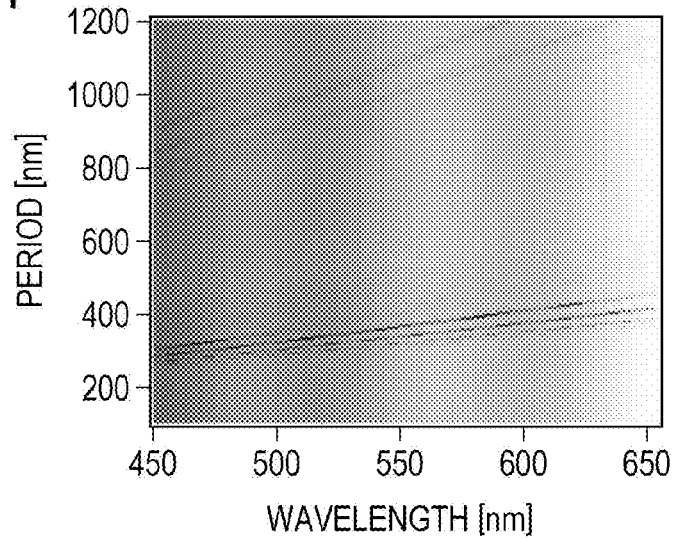
FIG. 14 is a graph showing the calculation results of enhancement of light emitted in the front direction with varying emission wavelengths and varying periods of a periodic structure.

FIG. 14 shows the calculation results for the case that the photoluminescent layer 110 and the light-transmissive members 120 are formed on the transparent substrate 140 having a refractive index of 1.5 under the conditions described in section 2-1. In FIG. 14, similar to the results illustrated in FIG. 2, light enhancement peaks at certain combinations of wavelength and period. However, the peak positions in FIG. 14 are different from those in FIG. 2.

Figure 15:
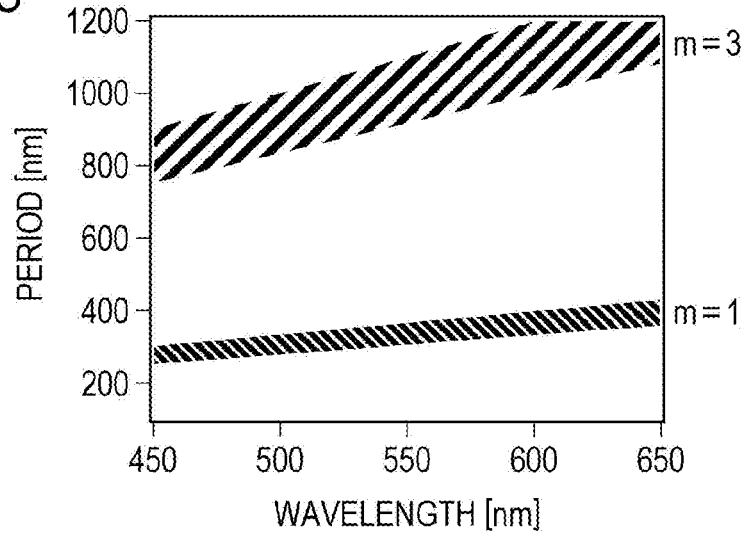
FIG. 15 is a graph showing a region that satisfies the formula (14) when m is 1 or 3.

FIG. 15 shows a region that satisfies the formula (14) when m is 1 or 3. Each of the peak positions in FIG. 14 is located in one of the regions of m=1 and m=3 in FIG. 15.

These results prove that a quasi-guided mode can be formed when the period p of the periodic structure satisfies the formula (14) and/or the formula (12) in the light-emitting device 100a including the photoluminescent layer 110 and the light-transmissive members 120 on the transparent substrate 140.

4. Modified Examples

Modified examples of the present embodiment will be described below. The present embodiment also includes combinations of these modified examples.

4-1. Light-Emitting Apparatus Including Excitation Light Source

Figure 16:
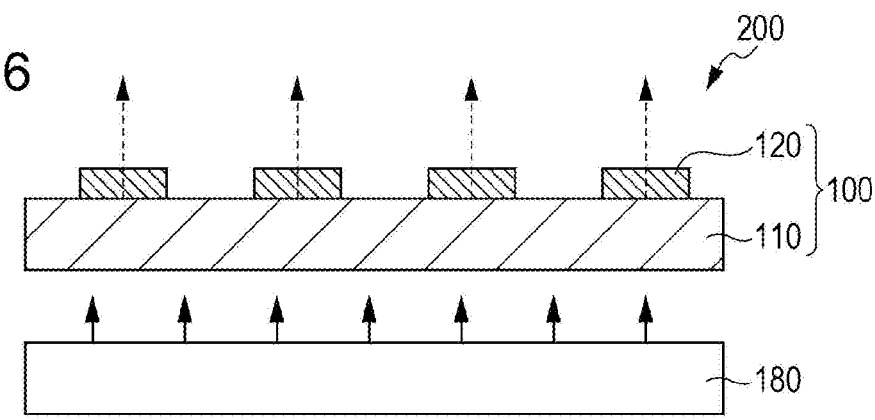
FIG. 16 is a schematic cross-sectional view of an example of a light-emitting apparatus according to the first embodiment.

FIG. 16 illustrates a light-emitting apparatus 200 including the light-emitting device 100 illustrated in FIGS. 1A and 1B and a light source 180 that emits excitation light.

Although the wavelength of excitation light emitted from the light source 180 is typically in the ultraviolet or blue range, it is not necessarily in these ranges, but may be determined depending on the photoluminescent material contained in the photoluminescent layer 110.

In FIG. 16, the light source 180 is disposed under the photoluminescent layer 110, and excitation light is incident on the bottom surface of the photoluminescent layer 110. However, the arrangement of the light source 180 and the incident surface of excitation light are not limited to these. For example, excitation light may be incident on the top surface of the photoluminescent layer 110. Excitation light may be incident on the photoluminescent layer 110 in a direction not perpendicular to a main surface (e.g., the top surface or the bottom surface) of the photoluminescent layer 110. Excitation light incident at the angle that causes total reflection in the photoluminescent layer 110 can more efficiently excite the photoluminescent material so as to increase the amount of light emission.

The terms "top surface" and "bottom surface" are herein used to distinguish two main surfaces of a layered member. Thus, these terms do not limit the orientation of a light-emitting device in use.

Figure 17A:
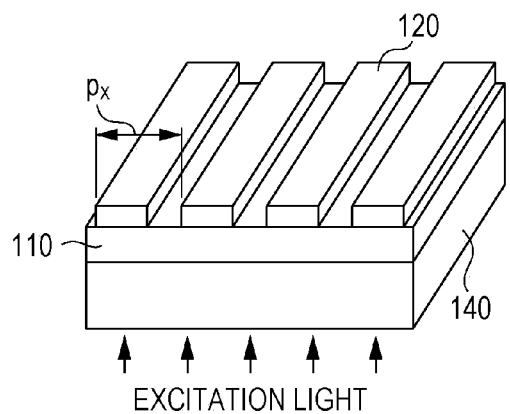
FIG. 17A is a schematic perspective view of an example of a light-emitting device having a one-dimensional periodic structure according to the first embodiment.
Figure 17B:
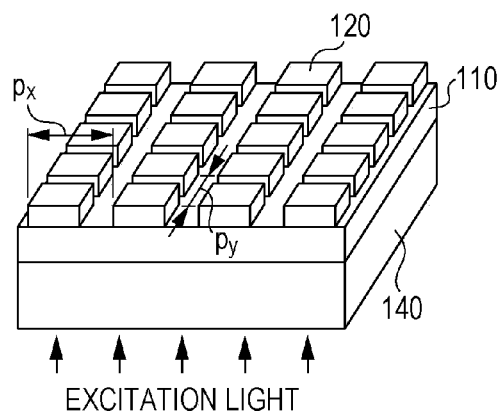
FIG. 17B is a schematic perspective view of a light-emitting device having a two-dimensional periodic structure according to a modified example of the first embodiment.
Figure 17C:
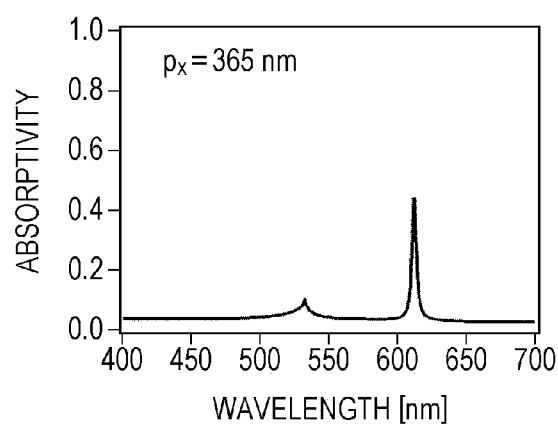
FIG. 17C is a graph of the absorption spectrum of light in the light-emitting device illustrated in FIG. 17A.

Excitation light can be coupled to a quasi-guided mode to efficiently emit light. FIGS. 17A to 17D illustrate such a method. In a light-emitting device illustrated in FIGS. 17A and 17B, a photoluminescent layer 110 and light-transmissive members 120 are formed on a transparent substrate 140. In FIG. 17A, as in FIGS. 1C and 1D, the light-transmissive members 120 extend in they direction and are arranged with a period $p_x$ in the x direction. In FIG. 17B, the light-transmissive members 120 are arranged in a matrix with a period $p_x$ in the x direction and with a period $p_y$ in the y direction.

The period $p_x$ is determined so as to satisfy the condition given by replacing p by $p_x$ in the formula (9), for example.

The period $p_y$ is determined so as to satisfy the following formula (15), for example, where m is an integer of 1 or more, $\lambda_{ex}$ denotes the wavelength of excitation light, and $n_{out}$ denotes the refractive index of a medium on the light emission side. The medium on the light emission side is a medium having the highest refractive index out of at least one medium (other than the light-transmissive members 120) in direct contact with the photoluminescent layer 110.

$$\frac{m\lambda_{ex}}{n_{wav-a}} < p_y < \frac{m\lambda_{ex}}{n_{out}} \qquad (15)$$

In FIG. 17B, $n_{out}$ denotes the refractive index $n_s$ of the transparent substrate 140. In the absence of the transparent substrate 140, as illustrated in FIG. 16, $n_{out}$ denotes the refractive index of air (i.e., $n_{out} \approx 1.0$). If the period $p_y$ satisfies the formula (15), excitation light can be efficiently converted into a quasi-guided mode.

The following formula (16) is given by substituting m=1 into the formula (15). If the period $p_y$ satisfies the formula (16), excitation light can be more efficiently converted into a quasi-guided mode.

$$\frac{\lambda_{ex}}{n_{wav-a}} < p_y < \frac{\lambda_{ex}}{n_{out}} \quad (16)$$

Excitation light efficiently converted into a quasi-guided mode can be efficiently absorbed by the photoluminescent layer 110.

Figure 17D:
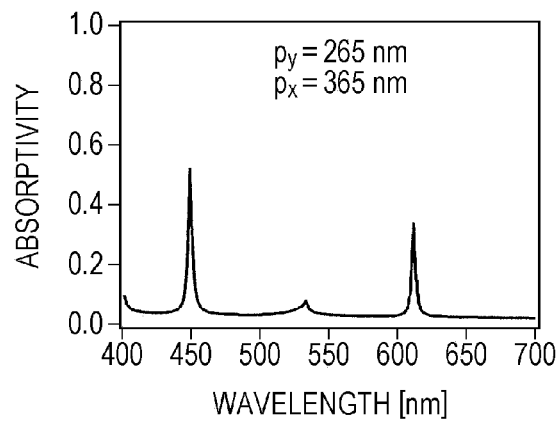
FIG. 17D is a graph of the absorption spectrum of light in the light-emitting device illustrated in FIG. 17B.

FIGS. 17O and 17D show the calculation results of absorption of light incident on the light-emitting device illustrated in FIGS. 17A and 17B as a function of wavelength. In these calculations, the periods $p_x$ and $p_y$ were respectively designed to be 365 nm and 265 nm, on the assumption that the light emission wavelength $\lambda_{wav-a}$ was approximately 600 nm, and the excitation light wavelength $\lambda_{ex}$ was approximately 450 nm. The photoluminescent layer 110 had an extinction coefficient of 0.003.

In FIG. 17D, absorption peaks appear at wavelengths of approximately 450 and 600 nm. These absorption peaks indicate that incident light is effectively converted into a quasi-guided mode and is efficiently absorbed by the photoluminescent layer. These results prove that excitation light and emitted light are effectively converted into a quasi-guided mode in the photoluminescent layer.

A two-dimensional periodic structure having different periodic components in the x and y directions can have high excitation efficiency and light emission intensity.

Although excitation light is incident on the bottom surface of the transparent substrate 140 in FIGS. 17A and 17B, excitation light may be incident on the periodic structure.

FIGS. 18A and 18B illustrate other two-dimensional periodic structures having different periodic components. The periodic structures illustrated in FIGS. 18A and 18B have periodic components in two or more axial directions (e.g., axes 1 to 3). Thus, the structures can have different periods in different axial directions. These periods may be set to increase the directionality of light beams of different wavelengths or to efficiently absorb excitation light. In any case, each period is determined to satisfy the formula (9) or (15).

4-2. Transparent Substrate Having Periodic Structure

Figure 19A:
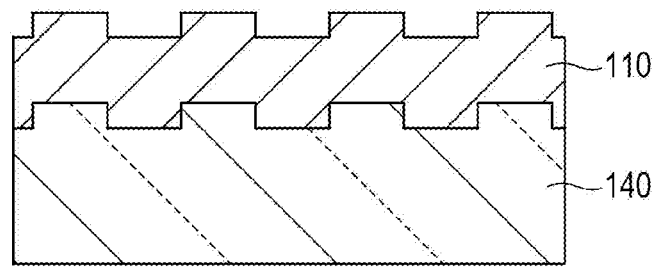
FIG. 19A is a schematic cross-sectional view of a light-emitting device having a periodic structure on a transparent substrate according to a modified example of the first embodiment.
Figure 19B:
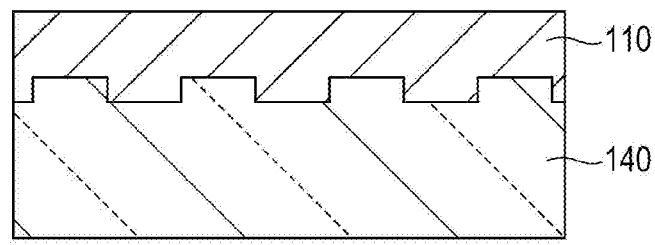
FIG. 19B is a schematic cross-sectional view of a light-emitting device having a periodic structure on a transparent substrate according to a modified example of the first embodiment.
Figure 19C:
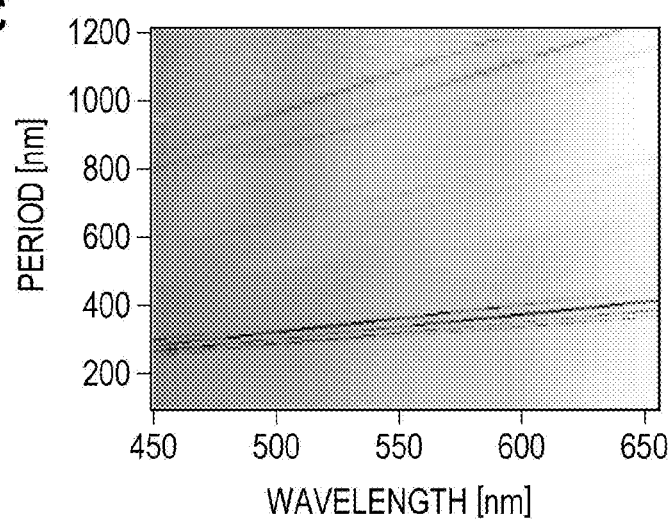
FIG. 19C is a graph showing the calculation results of enhancement of light emitted in the front direction with varying emission wavelengths and varying periods of a periodic structure.

As illustrated in FIGS. 19A and 19B, a periodic structure may be formed on a transparent substrate 140, and a photoluminescent layer 110 may be disposed on the periodic structure. In FIG. 19A, the transparent substrate 140 has a periodic structure on its top surface. The photoluminescent layer 110 is formed along the periodic structure. Consequently, a periodic structure with the same period as the periodic structure is formed on the top surface of the photoluminescent layer 110. In FIG. 19B, the top surface of the photoluminescent layer 110 is flattened. Also in these examples, directional light can be emitted when the period p of the periodic structure satisfies the formula (14), for example.

To verify the effect of these structures, enhancement of light emitted from the structure illustrated in FIG. 19A in the front direction was calculated with varying emission wavelengths and varying periods of the periodic structure. In these calculations, the transparent substrate 140 had a refractive index $n_p$ of 1.5, and the one-dimensional periodic structure on the top surface of the transparent substrate 140 had a height of 50 nm and a period of 400 nm. The photoluminescent layer 110 had a thickness of 1000 nm, the photoluminescent layer 110 had a refractive index $n_{wav-a}$ of 1.8, and the one-dimensional periodic structure on the top surface of the photoluminescent layer 110 had a height of 50 nm and a period of 400 nm. The one-dimensional periodic structure on the top surface of the transparent substrate 140 and the one-dimensional periodic structure on the top surface of the photoluminescent layer 110 have the same profile and include projections extending in the y direction and arranged in the x direction. Polarized light in the TM mode was used as an emitted light. The polarized light had an electric field component along the y direction. FIG. 19O shows the calculation results. Also in these calculations, light intensity peaks were observed at the periods that satisfy the condition represented by the formula (14).

4-3. Powder

As described above, light having any wavelength can be enhanced by adjusting the period of the periodic structure and/or the thickness of the photoluminescent layer. For example, in the light-emitting device 100 illustrated in FIGS. 1A and 1B, even if the photoluminescent material emits light over a wide wavelength range, only light having a particular wavelength can be enhanced. Thus, the light-emitting device 100 according to the present embodiment can be used for applications that do not require high directionality.

Figure 20:
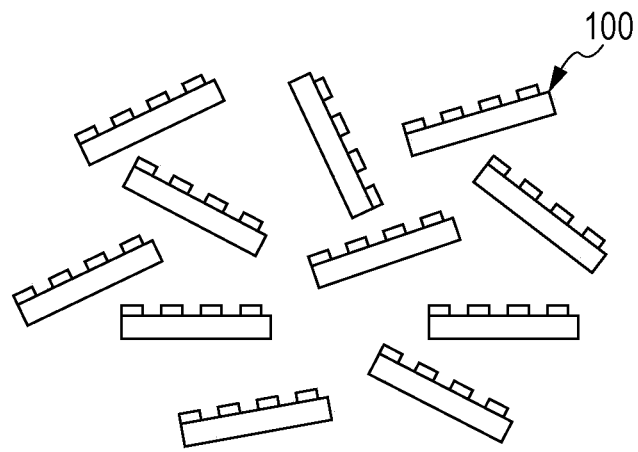
FIG. 20 is a schematic view of light-emitting devices in powder form according to a modified example of the first embodiment.

For example, as illustrated in FIG. 20, a powder having the structure illustrated in FIG. 1A or 1B may be used as a fluorescent material. The powder may be embedded in resin or glass.

Powders having the same periodic structure can enhance a particular wavelength alone. Thus, it is difficult to achieve light emission having a wide wavelength spectrum (e.g., light emission of white light). Accordingly, powders having the various periodic structure and/or the thickness of the photoluminescent layer can enhance wavelengths over a wide wavelength spectrum. In such a case, for example, each of the light-emitting devices 100 has a size in the range of micrometers to millimeters in the longitudinal direction and has a one- or two-dimensional periodic structure with several periods to several hundreds of periods.

4-4. Arrangement of Periodic Structures with Different Periods

Figure 21:
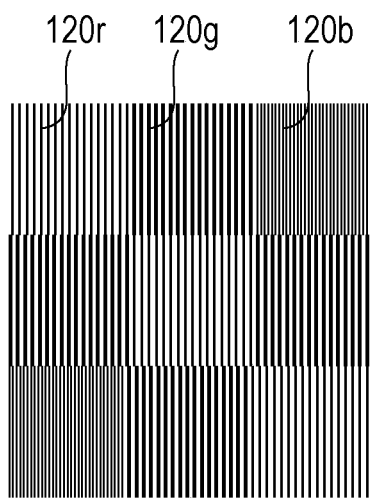
FIG. 21 is a schematic plan view of an array of periodic structures having different periods according to a modified example of the first embodiment.

FIG. 21 is a plan view of a two-dimensional array of periodic structures having different periods on a photoluminescent layer. In FIG. 21, three types of periodic structures 120r, 120g, and 120b are arranged. The periods of the periodic structures 120r, 120g, and 120b are set to emit, for example, light in the red, green, and blue wavelength ranges, respectively, in the front direction. Such structures having different periods can be arranged on the photoluminescent layer to emit directional light having a wide wavelength spectrum. The periodic structures are not necessarily formed as described above, but may be formed in any manner.

The size (e.g., the length of a side) of each of the periodic structures 120r, 120g, and 120b may be at least three times the period. For example, the length of a side may be less than 1 mm. Each of the periodic structures may be rectangular, triangular, or hexagonal.

Photoluminescent layers that emit red, green, and blue light may be disposed under the periodic structures 120r, 120g, and 120b, respectively. Alternatively, a common photoluminescent layer may be disposed under the periodic structures 120r, 120g, and 120b.

4-5. Arrangement of Periodic Structures with Different Orientations

Figure 22A:
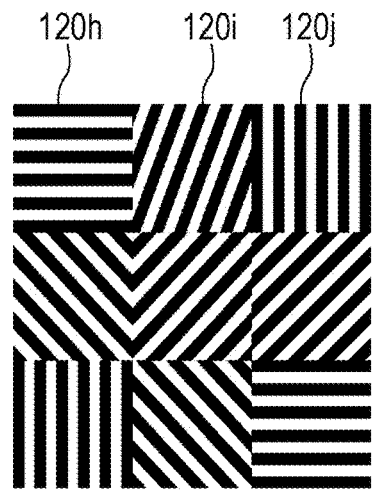
FIG. 22A is a schematic plan view of one-dimensional periodic structures having projections extending in different directions according to a modified example of the first embodiment.
Figure 22B:
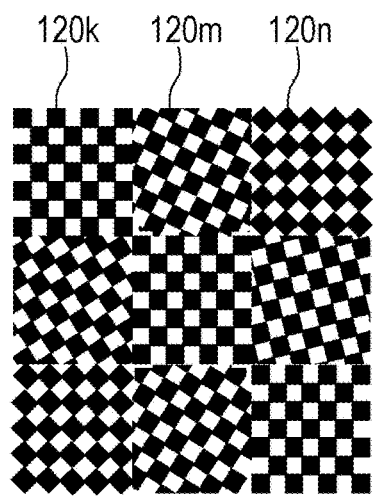
FIG. 22B is a schematic plan view of two-dimensional periodic structures having different periodic directions according to a modified example of the first embodiment.

FIG. 22A is a schematic plan view of one-dimensional periodic structures (including periodic structures 120h, 120i, and 120j) having projections extending in different directions. Periodic structures with the same period can produce unpolarized light in a particular wavelength range. Periodic structures having different periods can produce unpolarized white light. FIG. 22B is a schematic plan view of two-dimensional periodic structures (including periodic structures 120k, 120m, and 120n) having different array directions.

4-6. Stacked Periodic Structures

Figure 23:
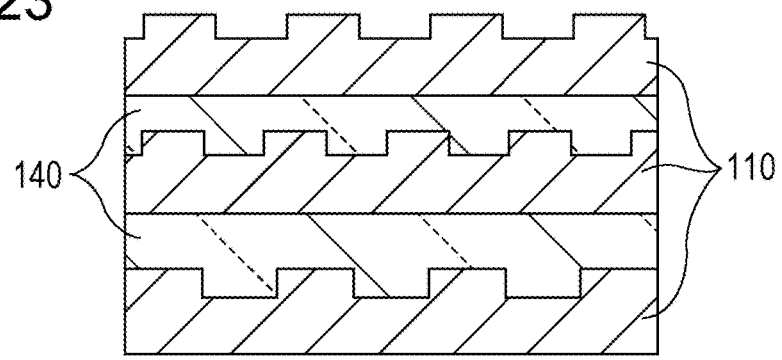
FIG. 23 is a schematic cross-sectional view of a light-emitting device including stacked periodic structures according to a modified example of the first embodiment.

FIG. 23 illustrates a light-emitting device including photoluminescent layers 110 each having a periodic structure on a surface thereof. A transparent substrate 140 is disposed between the photoluminescent layers 110. In FIG. 23, periodic structures having different periods are formed on three photoluminescent layers 110. The periods of these periodic structures are set to emit light in the red, blue, and green wavelength ranges in the front direction. Furthermore, the photoluminescent layers 110 contain photoluminescent materials corresponding to the wavelength ranges. Thus, layers having periodic structures with different periods can be stacked to emit directional light having a wide wavelength spectrum.

The type of photoluminescent material, the periodic structure, and the number of layers are not limited to those described above and may be appropriately determined. For example, a first photoluminescent layer having a first periodic structure may be opposed to a second photoluminescent layer having a second periodic structure with a light-transmissive substrate interposed therebetween. In this case, the formula (14) is satisfied in each layer. This is also true for three or more photoluminescent layers. The periodic structure of each layer may be of the same shape. In this case, emission intensity in a particular wavelength range can be increased.

4-7. Protective Layer

Figure 24:
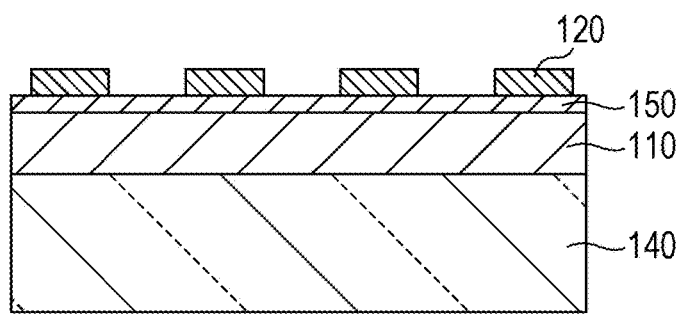
FIG. 24 is a schematic cross-sectional view of a light-emitting device including a protective layer according to a modified example of the first embodiment.

FIG. 24 is a schematic cross-sectional view of a structure including a protective layer 150 between a photoluminescent layer 110 and light-transmissive members 120. If the protective layer 150 has a lower refractive index than the photoluminescent layer 110, the thickness of the protective layer 150 may be less than half the wavelength of light to be emitted. This allows the electric field of light leaking from the photoluminescent layer 150 into the protective layer 150 to reach the light-transmissive members 120, and thus form a quasi-guided mode. If the protective layer 150 has a higher refractive index than the photoluminescent layer 110, light reaches the light-transmissive members 120 through the protective layer 150. Thus, the protective layer 150 may have any thickness. Even in such a case, the protective layer 150 may have a small thickness in order to increase light enhancement. This is because a decrease in the thickness of the protective layer 150 results in distribution of more light in a quasi-guided mode in the photoluminescent layer 110.

The protective layer 150 and the light-transmissive members 120 may be formed of the same material. In such a case, a light-transmissive layer having a periodic structure also functions as a protective layer. The light-transmissive members 120 may have a lower refractive index than the photoluminescent layer 110.

4-8. Photoluminescent Layer Having Periodic Structure

Figure 25:
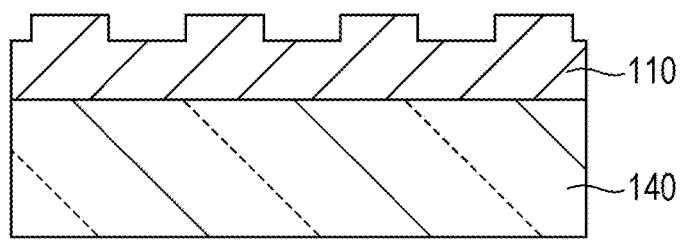
FIG. 25 is a schematic cross-sectional view of a light-emitting device including a photoluminescent layer having a periodic structure according to a modified example of the first embodiment.
Figure 26:
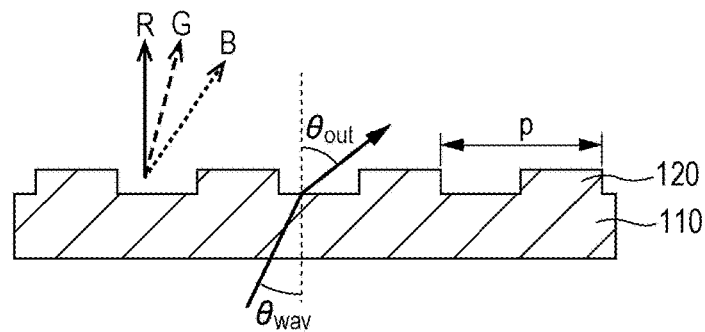
FIG. 26 is a schematic cross-sectional view illustrating the output direction of light emitted from the photoluminescent layer illustrated in FIG. 25.

FIG. 25 illustrates a light-emitting device including a photoluminescent layer 110 having a periodic structure. The light-emitting device may or may not include a substrate 140. FIG. 26 illustrates the photoluminescent layer 110 illustrated in FIG. 25.

For example, assume that the periodic structure is a one-dimensional periodic structure, and the formula (5) is satisfied. From the formula (5), $\theta_{out}$=arcsin $[(n_{wav-a} \sin \theta_{wav} - m\lambda/p)/n_{out}]$. Thus, in general, the output angle $\theta_{out}$ of light varies with the wavelength $\lambda$. Consequently, the color of visible light emitted from the light-emitting device varies with the observation direction.

This visual angle dependency can be reduced by, for example, selecting the material of the photoluminescent layer 110 and/or the outside medium so as to make $(n_{wav-a} \sin \theta_{wav} - m\lambda/p)/n_{out}$ constant for any wavelength $\lambda$. In this case, for example, the wavelength dispersion characteristics of $n_{wav-a}$ and $n_{out}$ are taken into consideration. For example, if the outside medium is air, the refractive index $n_{out}$ is approximately 1.0 irrespective of the wavelength. In this case, the material of the photoluminescent layer 110 may have a narrow wavelength dispersion of the refractive index $n_{wav-a}$. The material of the photoluminescent layer 110 may have a reciprocal dispersion; that is, the refractive index of the material decreases with decreasing wavelength of light.

4-9. Lens and Prism

Figure 27:
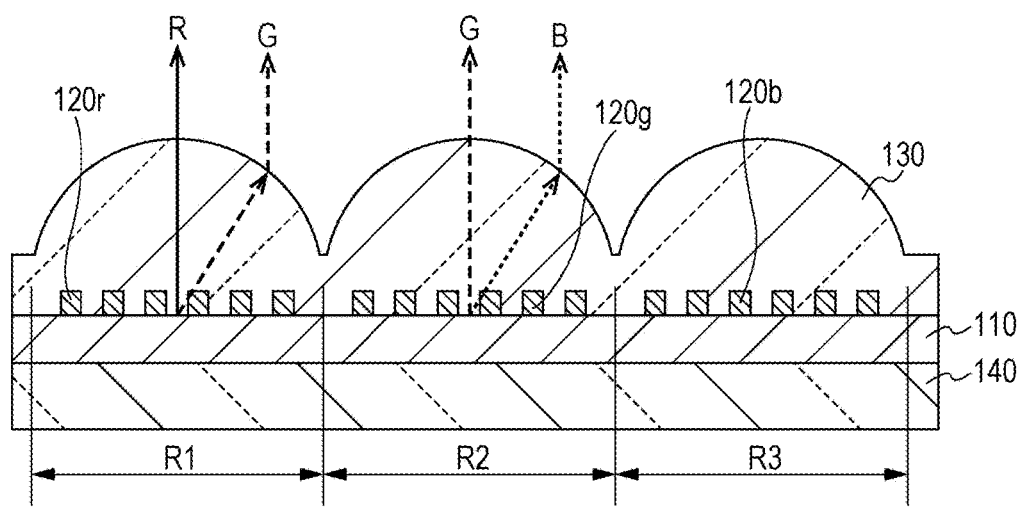
FIG. 27 is a schematic cross-sectional view of a light-emitting device including microlenses according to a modified example of the first embodiment.

FIG. 27 illustrates a light-emitting device including an array of microlenses 130 on the light emission side. The array of microlenses 130 can bend oblique light toward the front direction.

The light-emitting device illustrated in FIG. 27 includes regions R1, R2, and R3. The region R1 includes a periodic structure 120r. For example, the periodic structure 120r emits red light R in the front direction and obliquely emits green light G. A microlens 130 refracts the oblique green light G toward the front direction. Consequently, a mixture of red light R and green light G can be observed in the normal direction. Thus, the microlenses 130 can reduce variations in the output angle of light having different wavelengths.

Although an array of microlenses 130 is illustrated in FIG. 27, another structure is also possible.

A lenticular lens may be used as an optical element for refracting oblique light instead of the microlens array. Such an optical element may be a prism or prism array. For example, a prism corresponding to each periodic structure may be arranged. Prisms of any shape may be used. For example, triangular or pyramidal prisms may be used.

4-10. Stacked Photoluminescent Layers

Figure 28A:
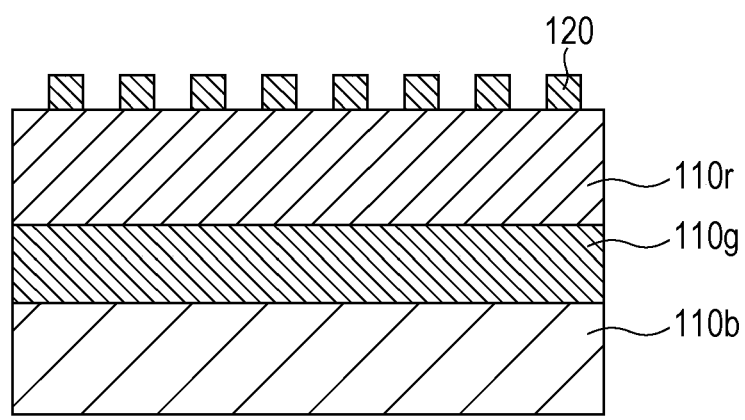
FIG. 28A is a schematic cross-sectional view of a light-emitting device that includes photoluminescent layers having different emission wavelengths according to a modified example of the first embodiment.
Figure 28B:
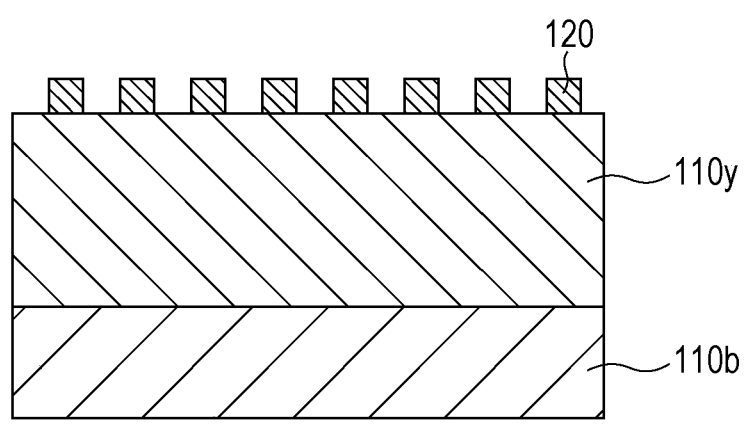
FIG. 28B is a schematic cross-sectional view of a light-emitting device that includes photoluminescent layers having different emission wavelengths according to a modified example of the first embodiment.

FIG. 28A illustrates a light-emitting device that includes stacked photoluminescent layers 110b, 110g, and 110r having different emission wavelengths. The light-emitting device can emit white light. The stacking sequence is not limited to that illustrated in the figure. As illustrated in FIG. 28B, a photoluminescent layer 110y that emits yellow light may be disposed on a photoluminescent layer 110b that emits blue light. The photoluminescent layer 110y may contain yttrium-aluminum-garnet (YAG).

A single photoluminescent layer may contain photoluminescent materials having different emission wavelengths. These photoluminescent materials may be dispersed in a matrix material. Such a light-emitting device can emit white light, for example.

Figure 29A:
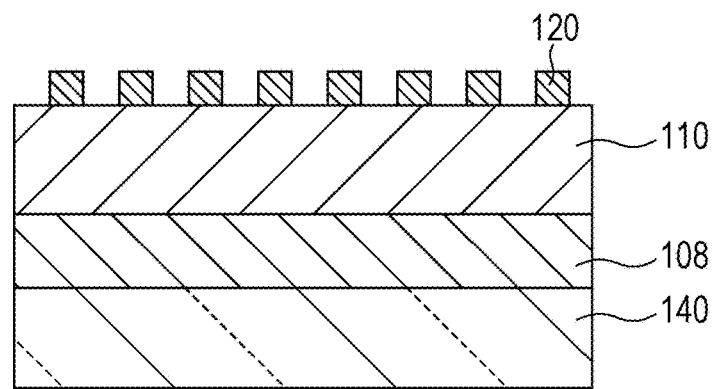
FIG. 29A is a schematic cross-sectional view of a light-emitting device including a diffusion-barrier layer according to a modified example of the first embodiment.

4-11. Diffusion-Barrier Layer, Low-Refractive-Index Layer, and Crystal Growth Layer As illustrated in FIGS. 29A to 29O, a light-emitting device may include a diffusion-barrier layer 108 under a photoluminescent layer. The diffusion-barrier layer 108 can block the diffusion of impurities from a substrate to the photoluminescent layer 110, for example, during the formation of the photoluminescent layer 110 by heat treatment (e.g., more than 1000° C.). This can prevent degradation of light-emitting properties.

Figure 29B:
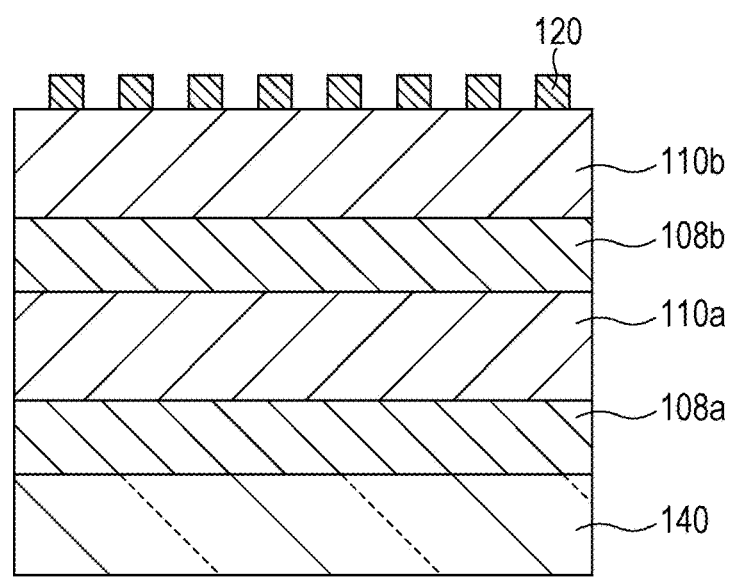
FIG. 29B is a schematic cross-sectional view of a light-emitting device including a diffusion-barrier layer according to a modified example of the first embodiment.

For example, as illustrated in FIG. 29A, the diffusion-barrier layer 108 may be disposed between a substrate 140 and the photoluminescent layer 110. As illustrated in FIG. 29B, a diffusion-barrier layer 108a may be disposed under a photoluminescent layer 110a, and a diffusion-barrier layer 108b may be disposed under a photoluminescent layer 110b.

Figure 29C:
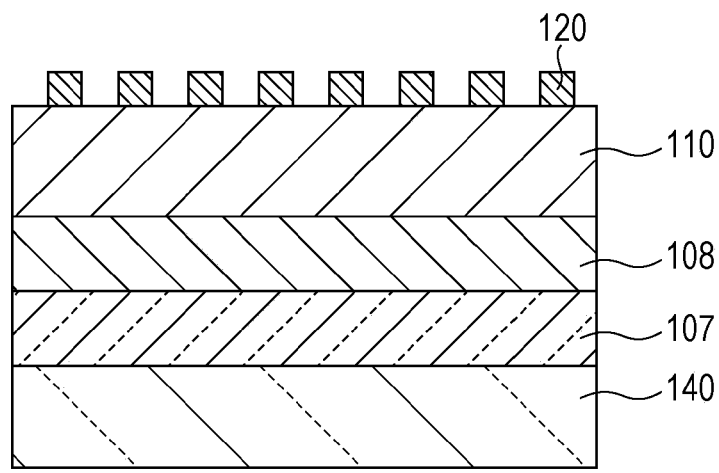
FIG. 29C is a schematic cross-sectional view of a light-emitting device including a diffusion-barrier layer according to a modified example of the first embodiment.
Figure 29D:
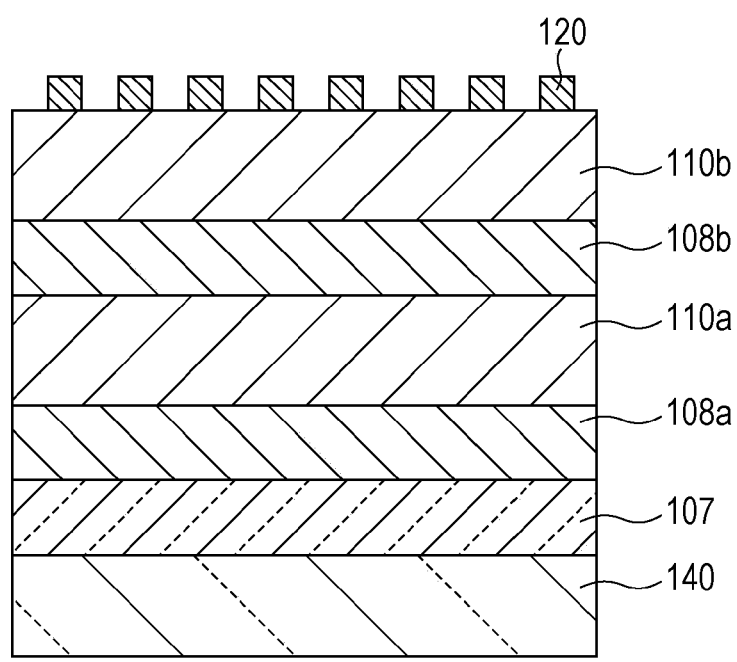
FIG. 29D is a schematic cross-sectional view of a light-emitting device including a diffusion-barrier layer according to a modified example of the first embodiment.

If the substrate 140 has a higher refractive index than the photoluminescent layer 110, a low-refractive-index layer 107 may be disposed on the substrate 140, as illustrated in FIGS. 29O and 29O. In FIG. 29C, a diffusion-barrier layer 108 is disposed between the low-refractive-index layer 107 and the photoluminescent layer 110. In FIG. 29O, a diffusion-barrier layer 108a is disposed under a photoluminescent layer 110a, and a diffusion-barrier layer 108b is disposed under a photoluminescent layer 110b.

The low-refractive-index layer 107 has a lower refractive index than the photoluminescent layer 110. The low-refractive-index layer 107 may be formed of $MgF_2$, LiF, $CaF_2$, $BaF_2$, $SrF_2$, quartz, a resin, or room-temperature curing glass, such as hydrogen silsesquioxane (HSQ) spin-on glass (SOG). The thickness of the low-refractive-index layer 107 may be greater than the wavelength of light. Examples of the material of the substrate 140 include $MgF_2$, LiF, $CaF_2$, $BaF_2$, $SrF_2$, glasses (e.g., soda-lime glass), resins, MgO, $MgAl_2O_4$, sapphire ($Al_2O_3$), $SrTiO_3$, $LaAlO_3$, $TiO_2$, $Gd_3Ga_5O_{12}$, LaSrAlO$_4$, $LaSrGaO_4$, $LaTaO_3$, SrO, yttria-stabilized zirconia (YSZ, $ZrO_2 \cdot Y_2O_3$), YAG, and $Tb_3Ga_5O_{12}$.

The material of the diffusion-barrier layer 108, 108a, or 108b depends on the element to be prevented from diffusing. The material of the diffusion-barrier layer 108, 108a, or 108b may be oxide or nitride crystals with strong covalent bonding. Each of the diffusion-barrier layers 108, 108a, and 108b may have a thickness of 50 nm or less.

Figure 30A:
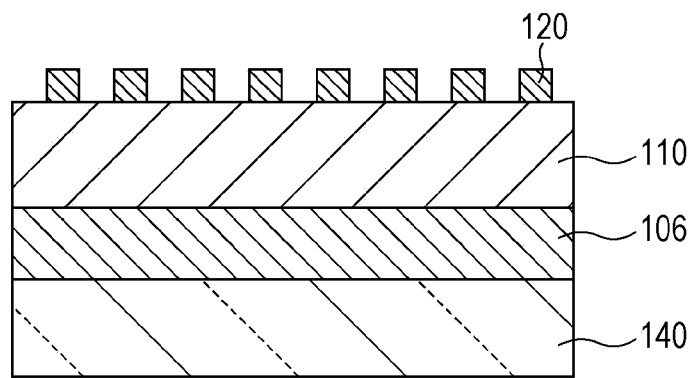
FIG. 30A is a schematic cross-sectional view of a light-emitting device including a crystal growth layer according to a modified example of the first embodiment.

When the photoluminescent layer 110 is formed of an inorganic material, the photoluminescent layer 110 may have poor light-emitting properties due to low crystallinity of the inorganic material. In order to increase the crystallinity of the inorganic material of the photoluminescent layer 110, a light-emitting device illustrated in FIG. 30A includes a crystal growth layer (or seed layer) 106 under the photoluminescent layer 110. The material of the crystal growth layer 106 is lattice-matched to the crystals of the photoluminescent layer 110. The lattice matching is within ±5%, for example.

If the substrate 140 has a higher refractive index than the photoluminescent layer 110, the crystal growth layer 106 can have a lower refractive index than the photoluminescent layer 110.

Figure 30B:
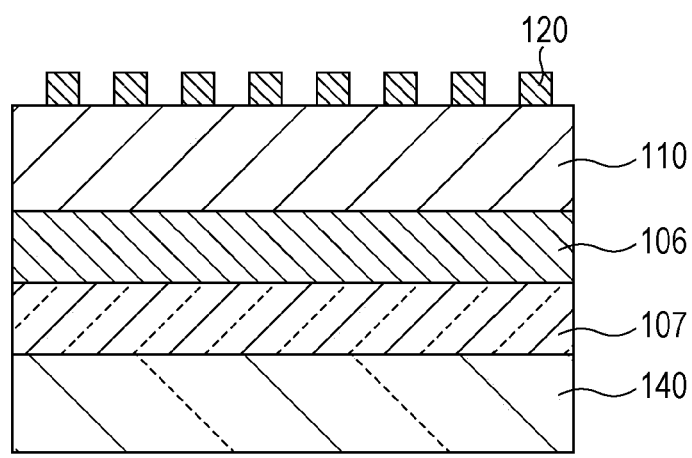
FIG. 30B is a schematic cross-sectional view of a light-emitting device including a crystal growth layer according to a modified example of the first embodiment.
Figure 30C:
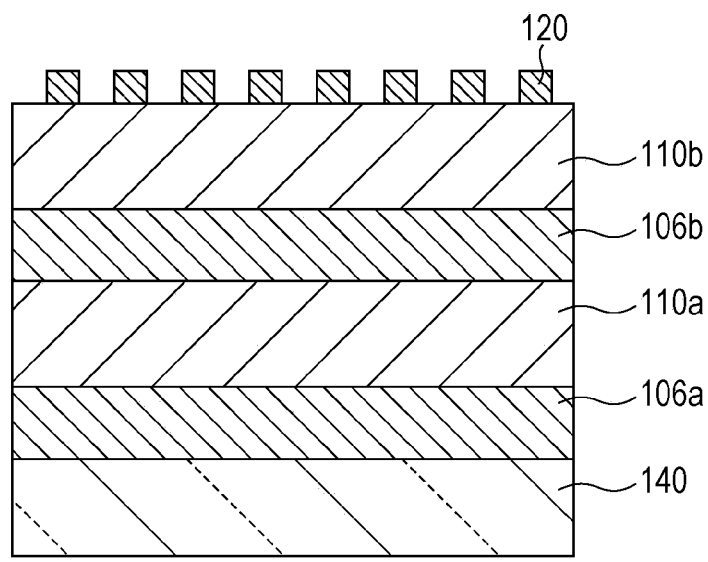
FIG. 30C is a schematic cross-sectional view of a light-emitting device including a crystal growth layer according to a modified example of the first embodiment.

A light-emitting device illustrated in FIG. 30B includes a low-refractive-index layer 107 disposed on the substrate 140 and a crystal growth layer 106 disposed on the low-refractive-index layer 107. A light-emitting device illustrated in FIG. 30O includes a crystal growth layer 106a disposed under a photoluminescent layer 110a and a crystal growth layer 106b disposed under a photoluminescent layer 110b. Each of the crystal growth layers 106, 106a, and 106b may have a thickness of 50 nm or less.

4-12. Surface Protective Layer

Figure 31A:
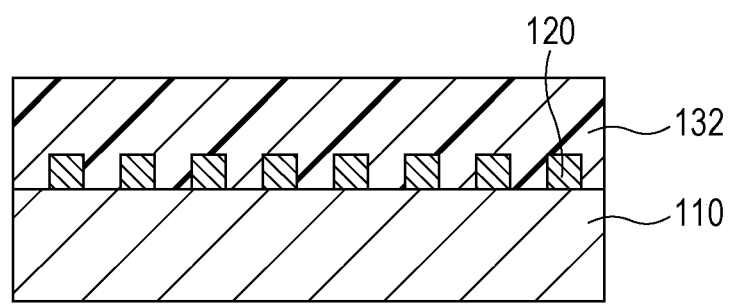
FIG. 31A is a schematic cross-sectional view of a light-emitting device including a surface protective layer according to a modified example of the first embodiment.
Figure 31B:
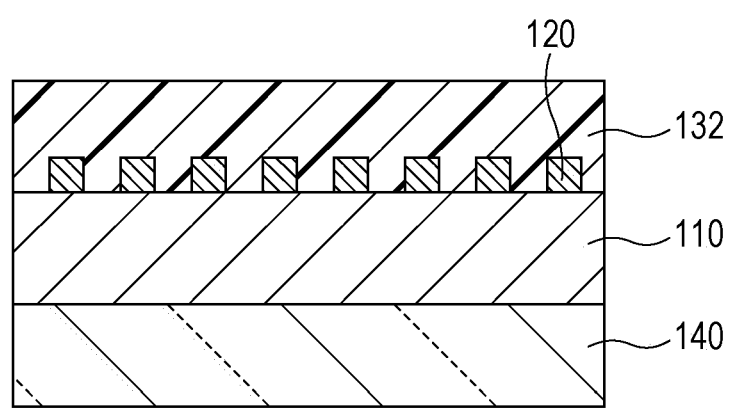
FIG. 31B is a schematic cross-sectional view of a light-emitting device including a surface protective layer according to a modified example of the first embodiment.

A light-emitting device illustrated in FIGS. 31A and 31B includes a surface protective layer 132 for protecting the periodic structure. In FIGS. 31A and 31B, the surface protective layer 132 covers light-transmissive members 120 and has a flat top surface. The light-emitting device illustrated in FIG. 31A includes no substrate, and the light-emitting device illustrated in FIG. 31B includes a substrate. The light-emitting device illustrated in FIG. 31A may include another surface protective layer under the photoluminescent layer 110. In FIGS. 31A and 31B, the light-transmissive members 120 may be formed of the material of the photoluminescent layer 110. In other words, the photoluminescent layer 110 may have the periodic structure.

Examples of the material of the surface protective layer 132 include resins, hard coat materials, $SiO_2$, alumina ($Al_2O_3$), silicon oxycarbide (SiOC), and diamond-like carbon (DLC). The surface protective layer 132 may have a thickness in the range of 100 nm to 10 µm.

The surface protective layer 132 can protect the periodic structure from scratches, water, oxygen, acids, alkalis, and/or heat. The surface protective layer 132 can prevent degradation of the light-emitting device.

4-13. Thermally Conductive Layer

Figure 32A:
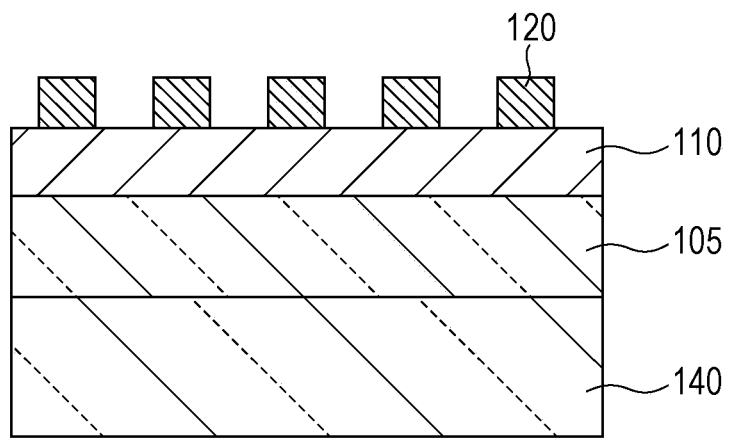
FIG. 32A is a schematic cross-sectional view of a light-emitting device including a thermally conductive layer according to a modified example of the first embodiment.

A light-emitting device illustrated in FIG. 32A includes a light-transmissive thermally conductive layer 105 between the photoluminescent layer 110 and the substrate 140. The thermally conductive layer 105 efficiently dissipates heat from the photoluminescent layer 110. Thus, the thermally conductive layer 105 can reduce the temperature rise of the light-emitting device and prevent degradation of the light-emitting device.

The thermally conductive layer 105 may have a lower refractive index than the photoluminescent layer 110. If the substrate 140 has a lower refractive index than the photoluminescent layer 110, the thermally conductive layer 105 may have a higher refractive index than the photoluminescent layer 110. In this case, the thermally conductive layer 105 may have a thickness of 50 nm or less. The material of the thermally conductive layer 105 can be appropriately selected in consideration of the refractive index of the substrate 140.

Figure 32B:
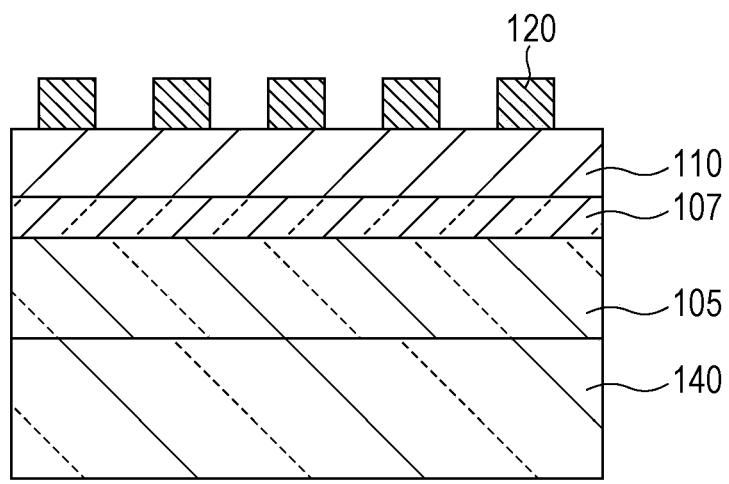
FIG. 32B is a schematic cross-sectional view of a light-emitting device including a thermally conductive layer according to a modified example of the first embodiment.
Figure 32C:
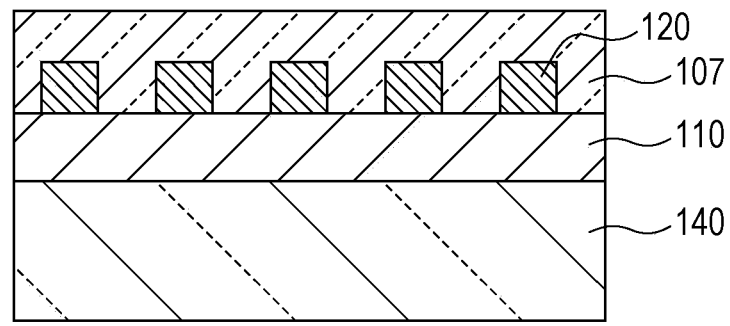
FIG. 32C is a schematic cross-sectional view of a light-emitting device including a thermally conductive layer according to a modified example of the first embodiment.

A light-emitting device illustrated in FIG. 32B includes a low-refractive-index layer 107 between the photoluminescent layer 110 and the thermally conductive layer 105. In this case, the thermally conductive layer 105 can have an increased thickness.

Figure 32D:
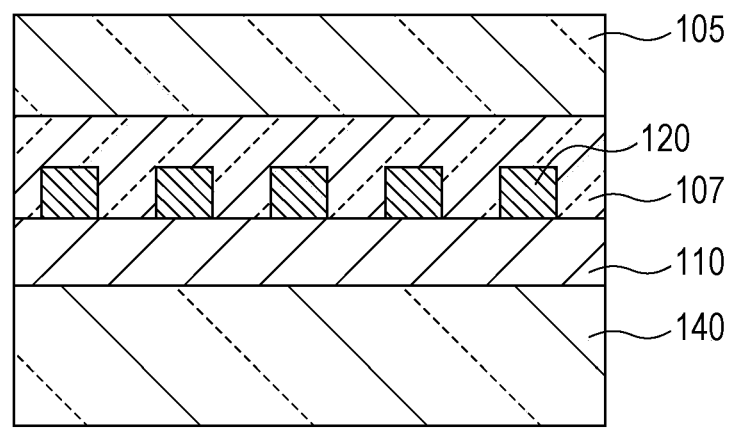
FIG. 32D is a schematic cross-sectional view of a light-emitting device including a thermally conductive layer according to a modified example of the first embodiment.

A light-emitting device illustrated in FIG. 32O includes a thermally conductive low-refractive-index layer 107, which covers the periodic structure. A light-emitting device illustrated in FIG. 32D includes a low-refractive-index layer 107 that covers the periodic structure, and a light-transmissive thermally conductive layer 105 that covers the low-refractive-index layer 107.

The material of the thermally conductive layer 105 may be $Al_2O_3$, MgO, $Si_3N_4$, ZnO, AlN, $Y_2O_3$, diamond, graphene, $CaF_2$, or $BaF_2$. Among these materials, $CaF_2$ and $BaF_2$ can be utilized in the low-refractive-index layer 107.

5. Materials

Any material may be used in a member that defines a periodic structure.

If the photoluminescent layer contains a medium (e.g., a matrix material) other than photoluminescent materials, the medium may be a dielectric material having relatively low light absorptivity. The material of the light-transmissive layer may be a dielectric material having relatively low light absorptivity. These materials can improve the optical confinement effect (i.e., increase the Q value) and can increase the peak value of light enhancement.

Examples of the dielectric material include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentoxide ($Ta_2O_5$), zirconia ($ZrO_2$), zinc selenide (ZnSe), and zinc sulfide (ZnS).

The light-transmissive layer may have a refractive index in the range of approximately 1.3 to 1.5. The material of the light-transmissive layer may be $MgF_2$, $CaF_2$, $SiO_2$, glass, or resin.

The term "photoluminescent material" encompasses fluorescent and phosphorescent materials, inorganic and organic materials (e.g., dyes), and bulk semiconductors and quantum dots (i.e., semiconductor nanoparticles).

Examples of fluorescent materials that emit blue light include $M_{10}(PO_4)_5Cl_2:Eu^{2+}$ (where M is at least one element selected from Ba, Sr, and Ca), $BaMgAl_{10}O_{17}:Eu^{2+}$, $M_3MgSi_2O_8:Eu^{2+}$ (where M is at least one element selected from Ba, Sr, and Ca), and $M_5SiO_4Cl_{15}:Eu^{2+}$ (where M is at least one element selected from Ba, Sr, and Ca). Examples of fluorescent materials that emit green light include $M_2MgSi_2O_7:Eu^{2+}$ (where M is at least one element selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M_2SiO_4:Eu^{2+}$ (where M is at least one element selected from Ba, Sr, and Ca), $BaSi_3O_4N_2:Eu^2$, $Ca_8Mg(SiO_4)_4Cl_2:Eu^{2'}$, $Ca_3SiO_4O_2:Eu^{2'}$, $CaSi_{12-(m+n)}Al_{(m+n)}O_nN_{16-n}:Ce^{3+}$, and β-SiAlON:$Eu^{2+}$.

Examples of fluorescent materials that emit red light include $CaAlSiN_3:Eu^{2+}$, $SrAlSi_4O_7:Eu^{2+}$, $M_2Si_5N_8:Eu^{2+}$ (where M is at least one element selected from Ba, Sr, and Ca), $MSiN_2:Eu^{2+}$ (where M is at least one element selected from Ba, Sr, and Ca), $MSi_2O_2N_2:Yb^{2+}$ (where M is at least one element selected from Sr and Ca), $Y_2O_2S:Eu^{3+}$, $Sm^{3+}$, $La_2O_2S:Eu^{3+}$, $Sm^{3+}$, $CaWO_4:Li^{1+}$, $Eu^{3+}$, $Sm^{3+}$, $M_2SiS_4:Eu^{2+}$ (where M is at least one element selected from Ba, Sr, and Ca), and $M_3SiO_5:Eu^{2+}$ (where M is at least one element selected from Ba, Sr, and Ca).

Examples of fluorescent materials that emit yellow light include $Y_3Al_5O_{12}:Ce^{3+}$, $CaSi_2O_2N_2:Eu^{2+}$, $Ca_3Sc_2Si_3O_{12}:Ce^{3+}$, $CaSc_2O_4:Ce^{3+}$, $MSi_2O_2N_2:Eu^2$ (where M is at least one element selected from Ba, Sr, and Ca), and $M_7(SiO_3)_6Cl_2:Eu^2$ (where M is at least one element selected from Ba, Sr, and Ca).

Examples of the quantum dots include CdS quantum dots, CdSe quantum dots, core-shell CdSe/ZnS quantum dots, and alloy CdSSe/ZnS quantum dots. Different materials and sizes of quantum dots result in various emission wavelengths. Examples of matrices for quantum dots include glasses and resins.

The transparent substrate is formed of a light-transmitting material. The transparent substrate may have a lower refractive index than the photoluminescent layer.

Examples of the material of the transparent substrate include magnesium fluoride ($MgF_2$), lithium fluoride (LiF), calcium fluoride ($CaF_2$), quartz ($SiO_2$), glasses, and resins.

If excitation light is incident on the photoluminescent layer without passing through the substrate, the substrate is not necessarily transparent.

6. Production Method

Various production methods will be described below.

The light-emitting device 100a illustrated in FIGS. 1C and 1D can be produced by the following method. First, the photoluminescent layer 110 (e.g., a thin film) is formed on the transparent substrate 140. The photoluminescent layer 110 can be formed by vapor deposition, sputtering, or coating of a fluorescent material. A light-transmissive material (e.g., a dielectric material) is then applied to the photoluminescent layer 110 and is patterned, for example, by photolithography. Thus, the light-transmissive members 120 and the periodic structure are formed.

Alternatively, the periodic structure may be formed by nanoimprinting. In the light-emitting device illustrated in FIG. 25, part of the photoluminescent layer 110 may be processed to form the periodic structure. The periodic structure is defined by the photoluminescent layer 110.

The light-emitting device 100 illustrated in FIGS. 1A and 1B can be produced by separating the photoluminescent layer 110 and the light-transmissive members 120 from the substrate in the light-emitting device 100a. In this case, the substrate may not be a transparent substrate.

The light-emitting device illustrated in FIG. 19A can be produced by the following method. A periodic structure is formed on a portion of the transparent substrate 140. The periodic structure can be formed by a semiconductor process or nanoimprinting. The photoluminescent layer 110 is formed on the periodic structure. The photoluminescent layer 110 can be formed by vapor deposition or sputtering. Thus, the periodic structure is formed on the top surface of the photoluminescent layer 110. Alternatively, the photoluminescent layer 110 can be formed by coating. The recesses of the periodic structure are filled with the photoluminescent layer 110, thereby producing the light-emitting device illustrated in FIG. 19B.

These production methods are for illustrative purposes only, and the light-emitting devices according to the embodiments of the present disclosure may be produced by other methods.

7. Experimental Examples

A sample of a light-emitting device according to the present embodiment having the structure illustrated in FIG. 19A was produced. The characteristics of the sample were evaluated.

Figure 33:
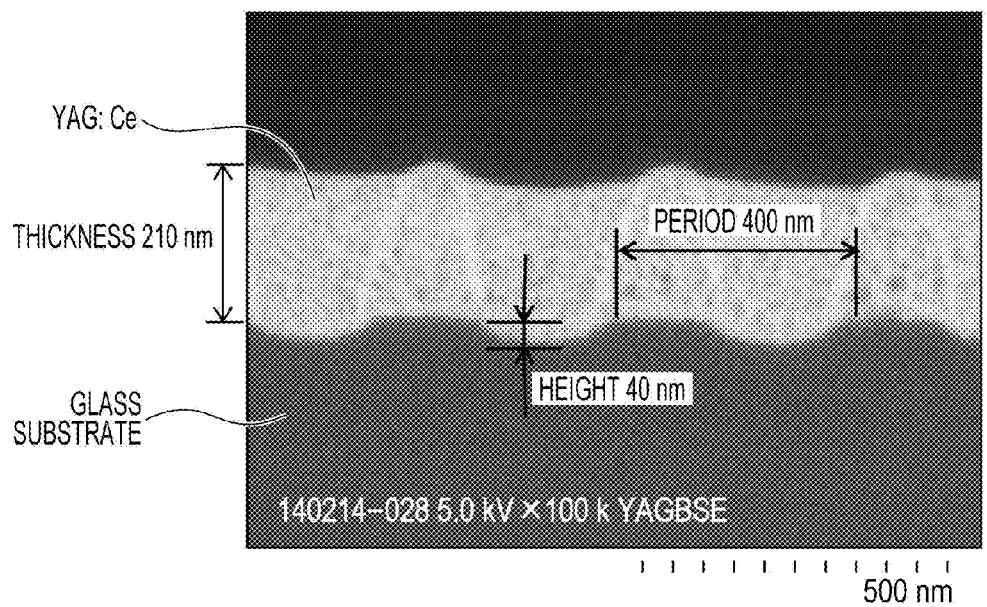
FIG. 33 is a cross-sectional transmission electron microscopy (TEM) image of a light-emitting device sample.

The sample was produced as described below. A one-dimensional periodic structure composed of stripe-shaped projections was formed on a glass substrate. The periodic structure has a period of 400 nm and a height of 40 nm. A photoluminescent material YAG:Ce was applied to the glass substrate. The resulting film had a thickness of 210 nm. FIG. 33 is a cross-sectional TEM image of the sample.

The sample was excited by LED light (wavelength: 450 nm). The spectrum of light emitted from the sample in the front direction was measured. Specifically, spectra of TM mode component and TE mode component of the emitted light were observed. The TM mode component is the linearly polarized light component parallel to the longitudinal direction of the stripe-shaped projections, and the TE mode component is the linearly polarized light component perpendicular to the longitudinal direction of the stripe-shaped projections. For comparison purposes, a sample having no periodic structure was produced under the same conditions, and the spectrum of output light was measured.

Figure 34:
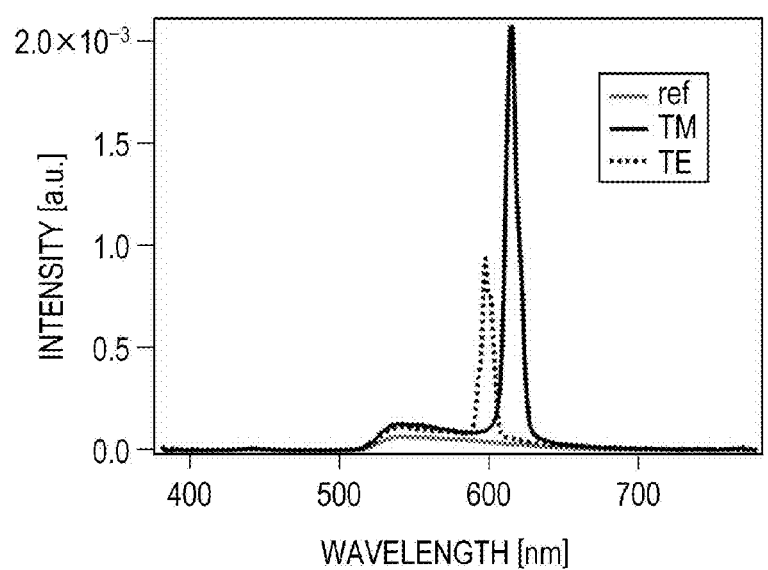
FIG. 34 is a graph showing the spectrum of light emitted from a light-emitting device sample in the front direction.

FIG. 34 shows these spectra. The light intensity at a particular wavelength was much higher in the light-emitting device having the periodic structure than in the light-emitting device having no periodic structure. The light enhancement effect was higher in the TM mode component than in the TE mode component.

Figure 35A:
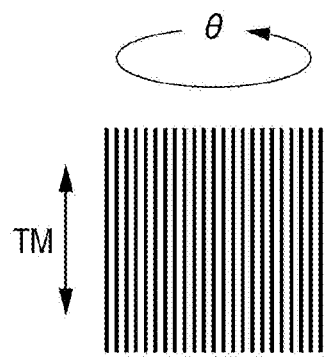
FIG. 35A is a schematic view illustrating the relationship between the direction of linearly polarized light in the TM mode, the direction of stripe-shaped projections of a one-dimensional periodic structure, and the rotational direction of a light-emitting device.
Figure 35B:
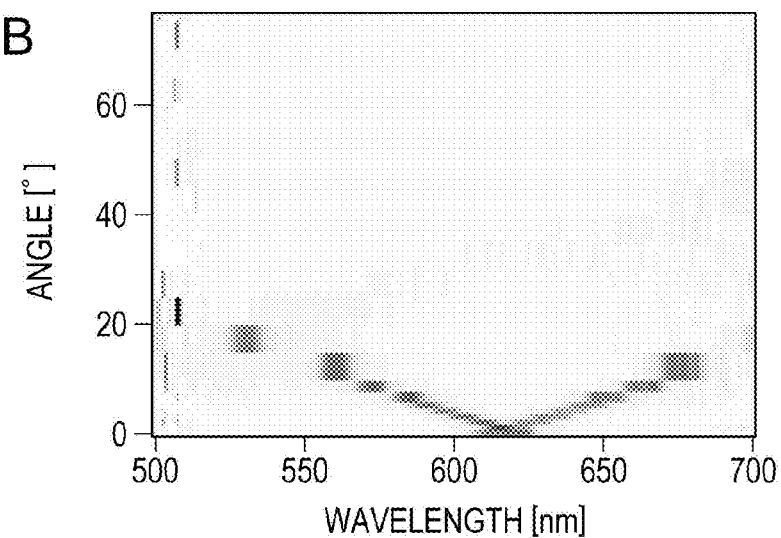
FIG. 35B is a graph showing the measurement results of the output angle dependence of the spectrum of a TM mode component.
Figure 35C:
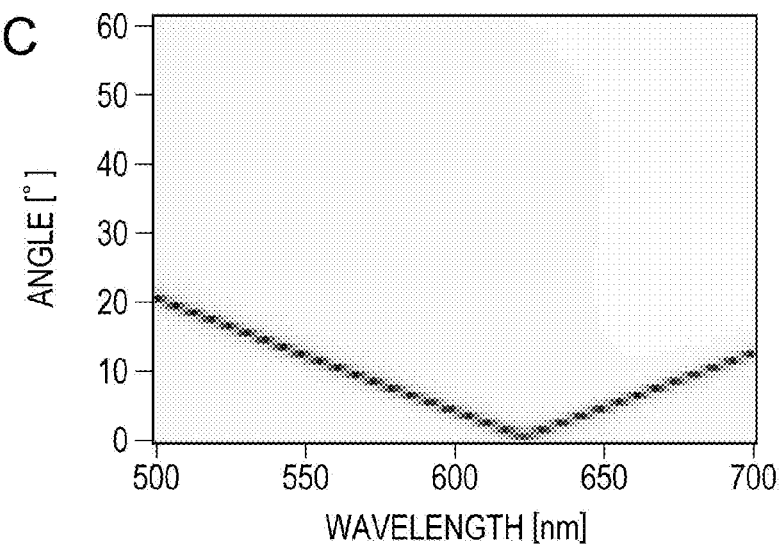
FIG. 35C is a graph showing the calculation results of the output angle dependence of the spectrum of a TM mode component.
Figure 35D:
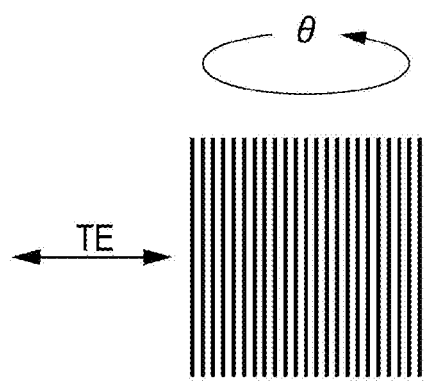
FIG. 35D is a schematic view illustrating the relationship between the direction of linearly polarized light in the TE mode, the direction of stripe-shaped projections of a one-dimensional periodic structure, and the rotational direction of a light-emitting device.

FIG. 35A is a schematic view illustrating the direction of linearly polarized light in the TM mode, the direction of stripe-shaped projections of a one-dimensional periodic structure of a light-emitting device, and the rotational direction of the light-emitting device. In this measurement, the light-emitting device was rotated about an axis parallel to the longitudinal direction of the projections of the one-dimensional periodic structure. The angle θ corresponds to the angle between the front direction of the light-emitting device and the direction in which the output light is detected. FIGS. 35B and 35O show the measurement and calculation results of the output angle dependence of the spectrum of a TM mode component, respectively.

Figure 35E:
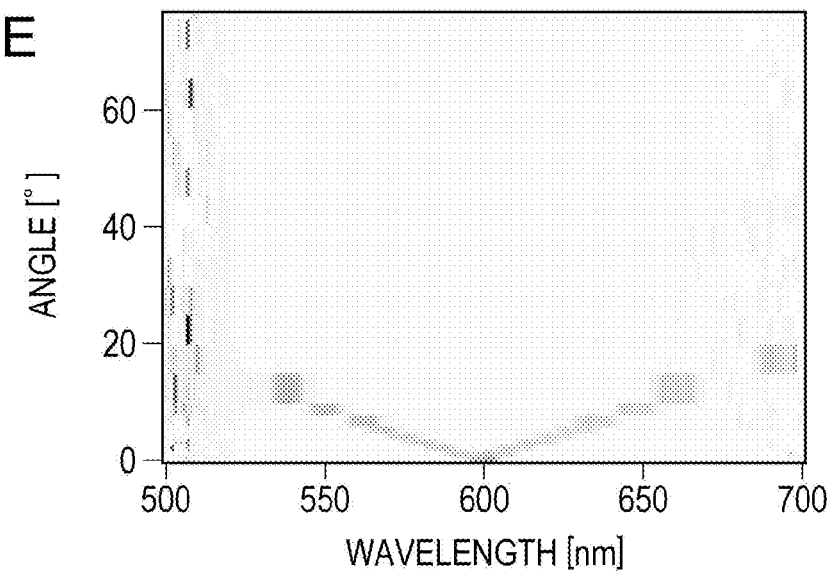
FIG. 35E is a graph showing the measurement results of the output angle dependence of the spectrum of a TE mode component.
Figure 35F:
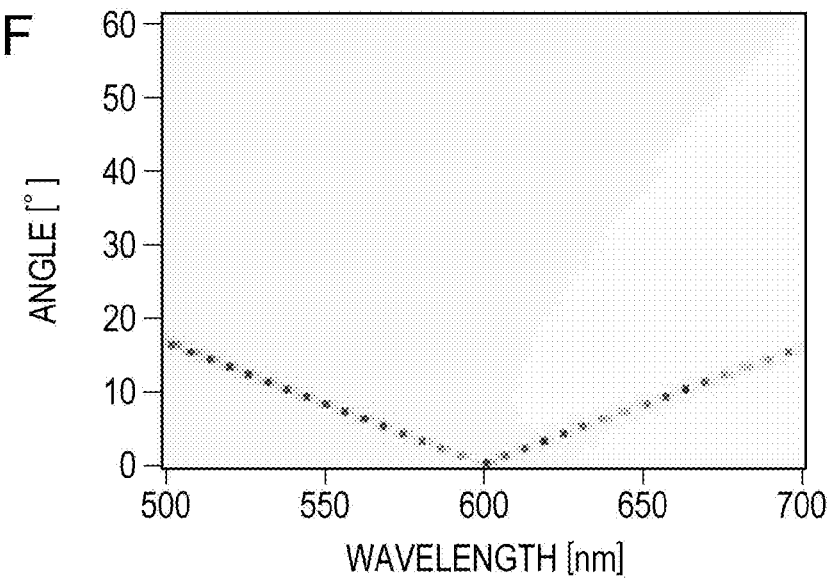
FIG. 35F is a graph showing the calculation results of the output angle dependence of the spectrum of a TE mode component.

FIG. 35O is a schematic view illustrating the direction of linearly polarized light in the TE mode, the direction of stripe-shaped projections of a one-dimensional periodic structure of a light-emitting device, and the rotational direction of the light-emitting device. The rotational direction and the angle θ were determined in the same manner as in FIG. 35A, FIGS. 35E and 35F show the measurement and calculation results of the output angle dependence of the spectrum of a TE mode component, respectively.

Figure 36A:
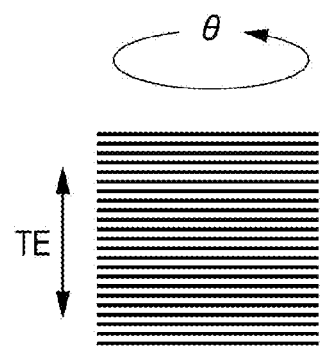
FIG. 36A is a schematic view illustrating the relationship between the direction of linearly polarized light in the TE mode, the direction of stripe-shaped projections of a one-dimensional periodic structure, and the rotational direction of a light-emitting device.
Figure 36B:
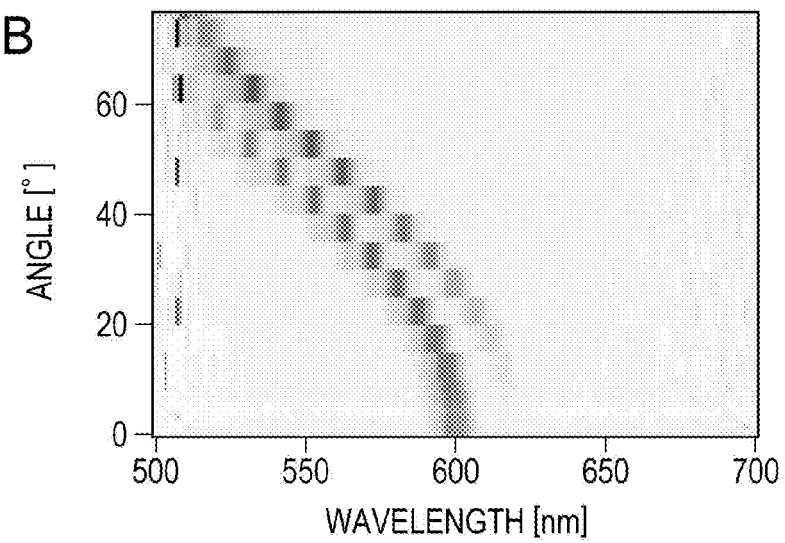
FIG. 36B is a graph showing the measurement results of the output angle dependence of the spectrum of a TE mode component.
Figure 36C:
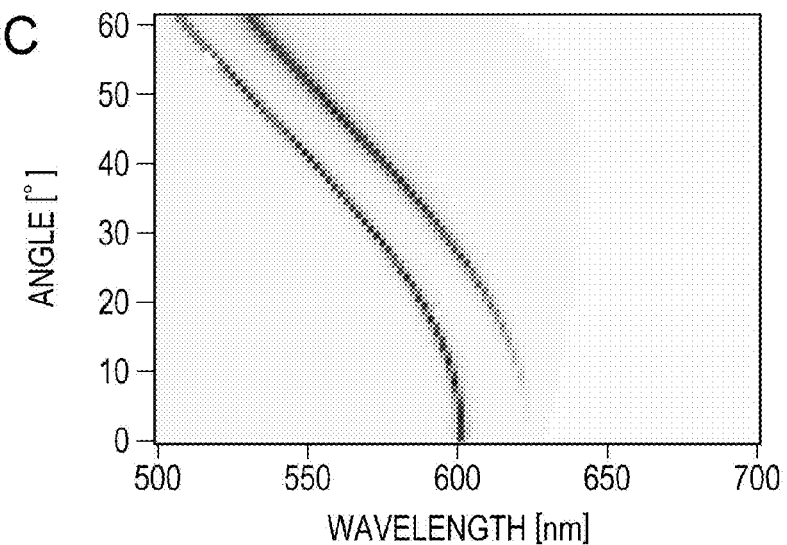
FIG. 36C is a graph showing the calculation results of the output angle dependence of the spectrum of a TE mode component.

FIG. 36A is a schematic view illustrating the direction of linearly polarized light in the TE mode, the direction of stripe-shaped projections of a one-dimensional periodic structure of a light-emitting device, and the rotational direction of the light-emitting device. In this measurement, the light-emitting device was rotated about an axis parallel to the transverse direction of the projections of the one-dimensional periodic structure. The angle θ corresponds to the angle between the front direction of the light-emitting device and the direction in which the output light is detected. FIGS. 36B and 36O show the measurement and calculation results of the output angle dependence of the spectrum of a TE mode component, respectively.

Figure 36D:
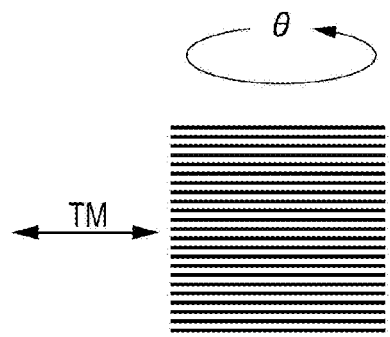
FIG. 36D is a schematic view illustrating the relationship between the direction of linearly polarized light in the TM mode, the direction of stripe-shaped projections of a one-dimensional periodic structure, and the rotational direction of a light-emitting device.
Figure 36E:
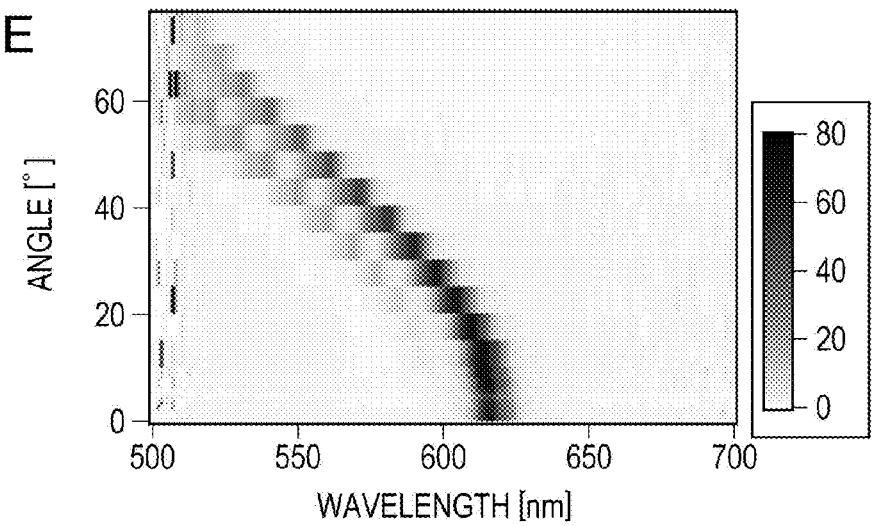
FIG. 36E is a graph showing the measurement results of the output angle dependence of the spectrum of a TM mode component.
Figure 36F:
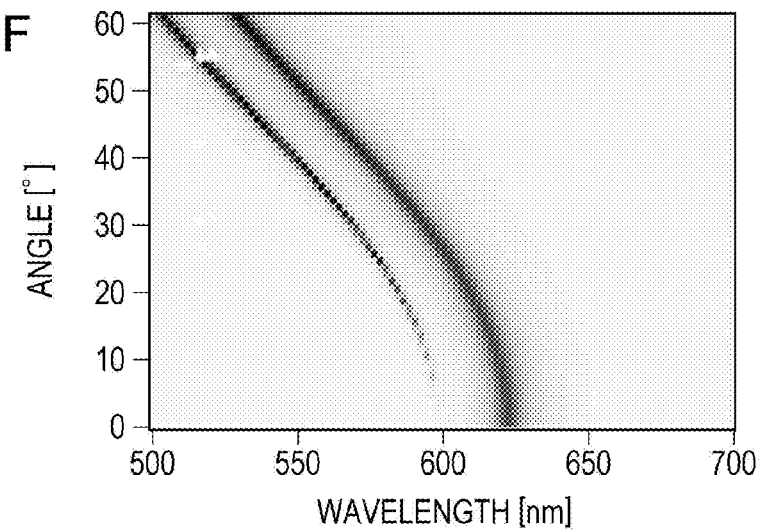
FIG. 36F is a graph showing the calculation results of the output angle dependence of the spectrum of a TM mode component.

FIG. 36D is a schematic view illustrating the direction of linearly polarized light in the TM mode, the direction of stripe-shaped projections of a one-dimensional periodic structure of a light-emitting device, and the rotational direction of the light-emitting device. The rotational direction and the angle θ were determined in the same manner as in FIG. 36A. FIGS. 36E and 36F show the measurement and calculation results of the output angle dependence of the spectrum of a TM mode component, respectively.

As is clear from FIGS. 35A to 35F and FIGS. 36A to 36F, the light enhancement effect was higher in the TM mode component than in the TE mode component. Thus, the emitted light was mainly the polarized light in the TM mode. The wavelength of enhanced light shifted with output angle. For example, light having a wavelength of 610 nm was emitted in the front direction with high directionality. The measurement results shown in FIGS. 35B, 35E, 36B, and 36E are substantially consistent with the calculation results shown in FIGS. 35O, 35F, 36O, and 36F, respectively. The experiments proved the validity of the calculations.

Figure 37:
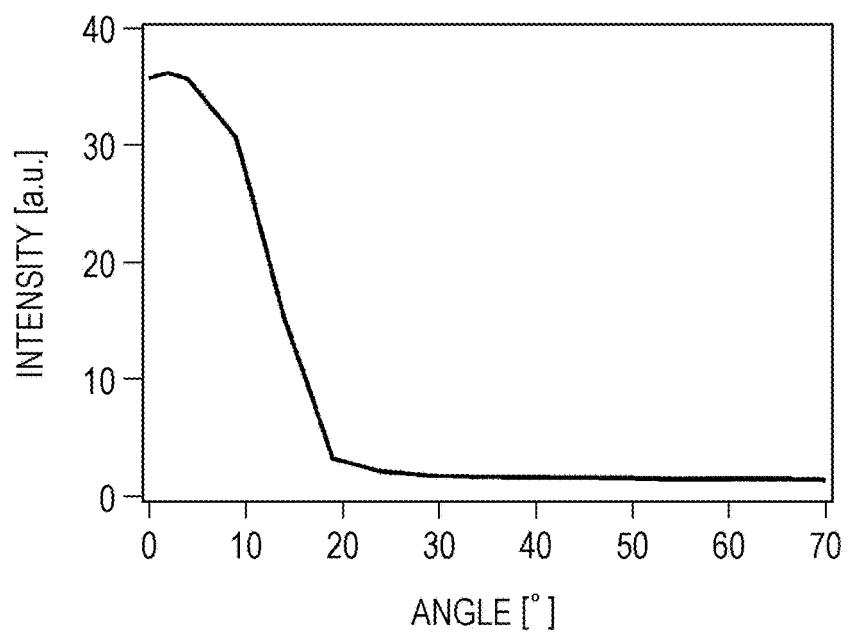
FIG. 37 is a graph showing the measurement results of the output angle dependence of the intensity of a TM mode component with a wavelength of 610 nm.

FIG. 37 shows the angular dependence of the intensity of the TM mode component with a wavelength of 610 nm for the arrangement and rotational direction illustrated in FIG. 36O. As illustrated in FIG. 37, light is significantly enhanced only in the front direction (θ=0 degrees). The directional angle of light emitted in the front direction was less than 15 degrees. The major component of emitted light was the TM mode component, and thus polarized light was emitted.

Although the photoluminescent material in this experiment was YAG:Ce, which emits light in a wide wavelength range, directional and polarized light can also be emitted in a narrow wavelength range using a photoluminescent material that emits light in the narrow wavelength range. Use of a photoluminescent material for a narrow wavelength range can prevent light having another wavelength component from being emitted in a direction other than the front direction, and therefore avoid generation of light in another polarization state.

Second Embodiment

A light-emitting device according to a second embodiment of the present disclosure will be described below with reference to the accompanying drawings. Points of difference between the first embodiment and the second embodiment will be mainly described below, and common points therebetween may be omitted below. The second embodiment is not limited to the following configurations but also includes various combinations of the following configurations and the configurations described in the first embodiment.

1. Light-Emitting Device

Figure 39:
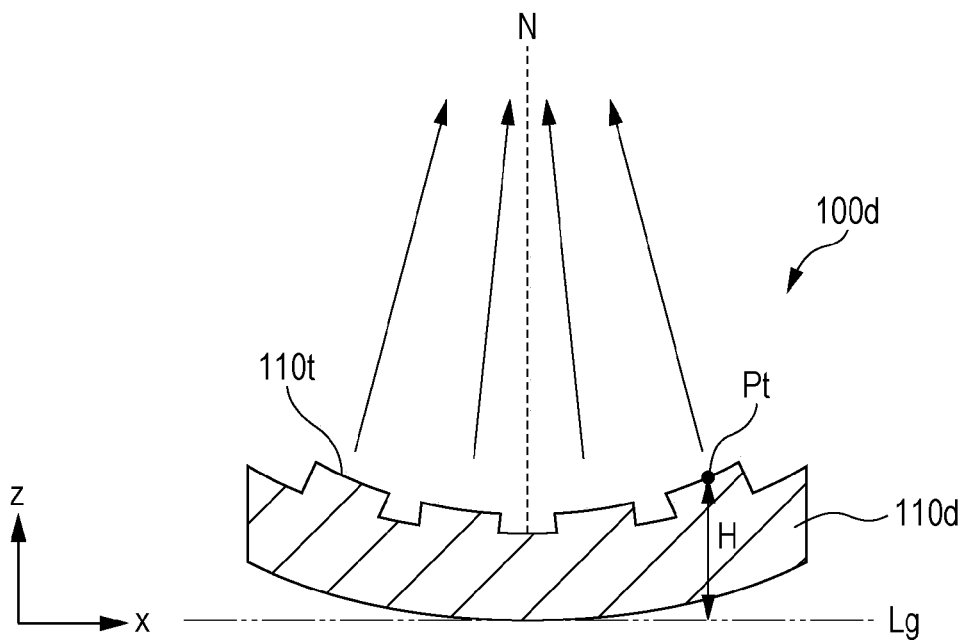
FIG. 39 is a schematic cross-sectional view of a light-emitting device according to a second embodiment.

FIG. 39 is a schematic cross-sectional view of a light-emitting device 100d.

The light-emitting device 100d includes a photoluminescent layer 110d having a periodic structure. In other words, the periodic structure is defined by an interface between the photoluminescent layer 110d and an air layer. The air layer is an exemplary light-transmissive layer.

The photoluminescent layer 110d is curved as a whole. The photoluminescent layer 110d has a concave top surface and a convex bottom surface.

The term "concave surface", as used herein, refers to a substantially concave surface obtained by ignoring a periodic structure. For example, when regions, which extend between/among projections, of a surface of the photoluminescent layer are included in a single virtual concave face, the surface of the photoluminescent layer may be a substantially concave surface. For example, when the tops of projections in a surface of the photoluminescent layer are included in a single virtual concave face, the surface of the photoluminescent layer may be a substantially concave surface. That is, a substantially concave surface is defined as an envelope of projections or recesses.

The concave surface may be a curved surface formed by rotation of an arcuate or elliptical arc shaped plane curve. The concave surface may be paraboloidal.

The periodic structure is located along the concave surface of the photoluminescent layer 110d. The periodic structure includes projections. Each of the projections may have a flat or curved top surface 110t. If the projections have curved top surfaces 110t, these top surfaces 110t may be included in a virtual concave face.

In the same manner as the periodic structure in the first embodiment, the periodic structure of the photoluminescent layer 110d can limit the directional angle of light emitted from the photoluminescent layer 110d. For example, each part of light, having a wavelength $\lambda_a$, is emitted from a corresponding projection in the direction normal to the top surface 110t of the corresponding projection.

In FIG. 39, the projections of the periodic structure are arranged along the concave surface of the photoluminescent layer 110d. Thus, the top surfaces 110t are inclined toward the center of the concave surface of the photoluminescent layer 110d. In other words, the distance H between a tangent plane Lg in contact with the center of the convex surface of the photoluminescent layer 110d and a point Pt on the top surfaces 110t of the projections decreases as the point Pt comes closer to the center of the concave surface of the photoluminescent layer 110d.

Light emitted in the direction normal to the top surface 110t of the corresponding projection approaches a normal line N that passes through a point of contact between the convex surface of the photoluminescent layer 110d and the tangent plane Lg and that is perpendicular to the tangent plane Lg. Thus, the curved photoluminescent layer 110d can condense light having a particular wavelength.

Light emitted from a corresponding projection has a very small directional angle in the direction normal to the top surface 110t of the corresponding projection. Thus, the light contains a component emitted in a direction that deviates from the normal direction. The curved photoluminescent layer 110d can make such a component come closer to the normal line N. This can improve the directionality of light emission.

Improved directionality of light emission can result in a smaller optical component for receiving light from the light-emitting device.

2. Modified Examples

Modified examples of the present embodiment will be described below. The present embodiment also includes combinations of these modified examples.

2-1. Light-Transmissive Layer

Figure 40:
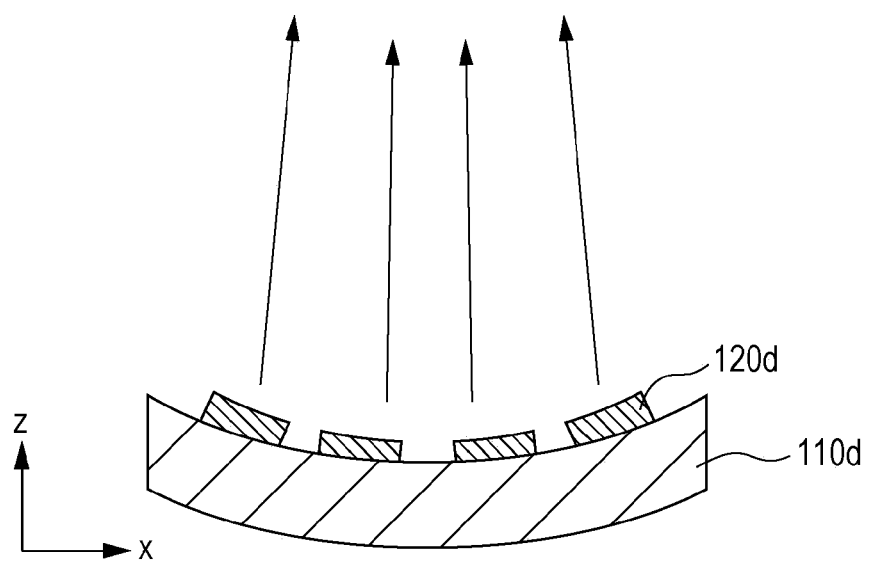
FIG. 40 is a schematic cross-sectional view of a light-emitting device including a light-transmissive layer according to a modified example of the second embodiment.

FIG. 40 illustrates a light-emitting device that includes a curved photoluminescent layer 110d and light-transmissive members 120d arranged on the photoluminescent layer 110d. The light-transmissive members 120d constitute a light-transmissive layer. The light-transmissive members 120d may be formed of a dielectric material having low light absorptivity.

In FIG. 40, the periodic structure is defined by the top surfaces and side surfaces of the light-transmissive members 120d and the top surface of the photoluminescent layer 110d not covered with the light-transmissive members 120d. Another light-emitting device may include a curved photoluminescent layer and a light-transmissive layer having a periodic structure.

If the light-transmissive members 120d and the photoluminescent layer 110d of the light-emitting device illustrated in FIG. 40 are formed of the same material, the light-emitting device corresponds to the light-emitting device 100d illustrated in FIG. 39.

Although the light-transmissive members 120d are in direct contact with the photoluminescent layer 110d in FIG. 40, the light-transmissive members 120d may be spaced from the photoluminescent layer 110d. If the light-transmissive members 120d have a higher refractive index than the photoluminescent layer 110d, the distance between the light-transmissive members 120d and the photoluminescent layer 110d may be arbitrarily determined. If the light-transmissive members 120d have a lower refractive index than the photoluminescent layer 110d, the distance between the periodic structure and the photoluminescent layer 110d can be less than half the wavelength of light.

2-2. Transparent Substrate

Figure 41:
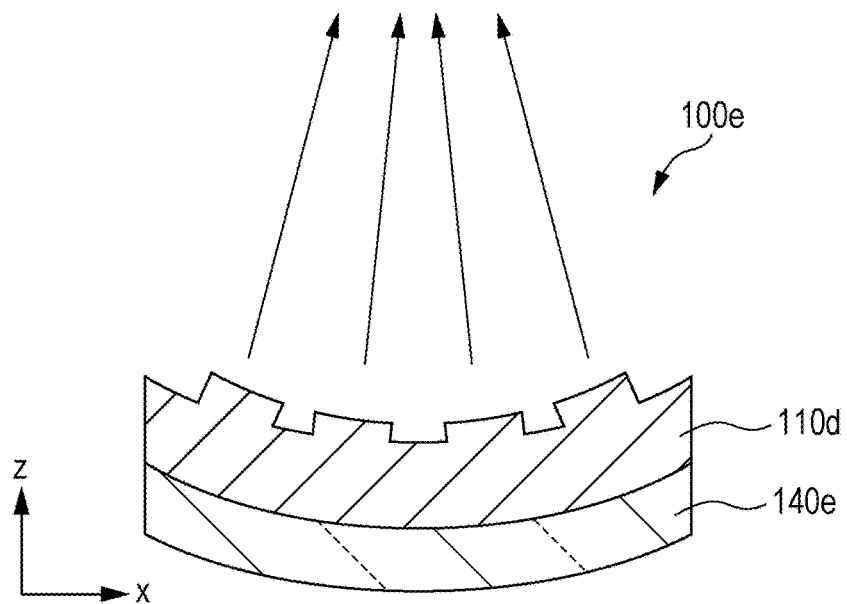
FIG. 41 is a schematic cross-sectional view of a light-emitting device having a transparent substrate according to a modified example of the second embodiment.

FIG. 41 illustrates a light-emitting device that includes a photoluminescent layer 110d and a transparent substrate 140e on which the photoluminescent layer 110d is disposed. In FIG. 41, the photoluminescent layer 110d and the transparent substrate 140e are curved. The light-emitting device 100e has an arcuate cross-section, as a whole. The material and characteristics of the transparent substrate 140e may be the same as those in the first embodiment.

Although the photoluminescent layer 110d has a periodic structure in FIG. 41, the light-emitting device 100d illustrated in FIG. 39 may be disposed on the transparent substrate 140e.

The transparent substrate 140e may have a periodic structure, as illustrated in FIGS. 19A and 19B.

2-3. Intermediate Layer

Figure 42:
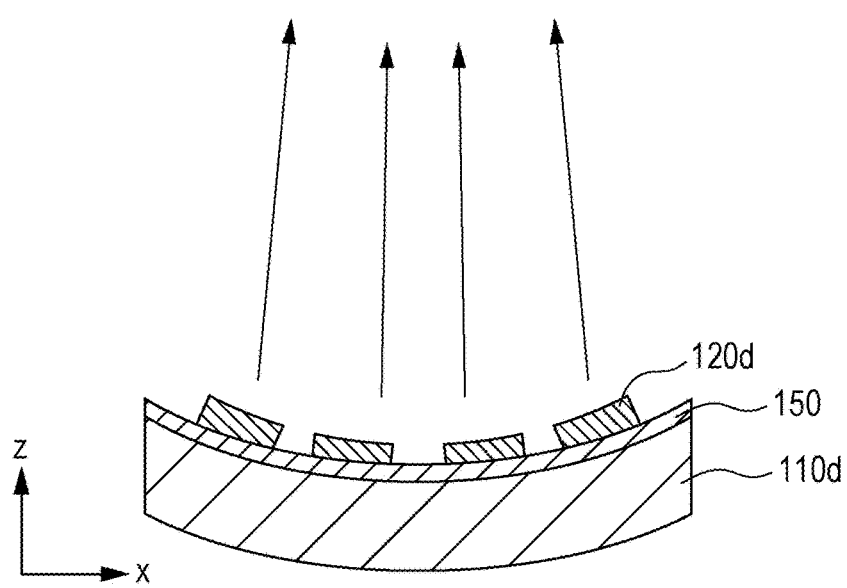
FIG. 42 is a schematic cross-sectional view of a light-emitting device having a protective layer according to a modified example of the second embodiment.

FIG. 42 illustrates a light-emitting device that includes an intermediate layer between a photoluminescent layer 110d and light-transmissive members 120d. The intermediate layer may be a protective layer, as illustrated in FIG. 24. The intermediate layer may include layers of different materials.

Figure 43:
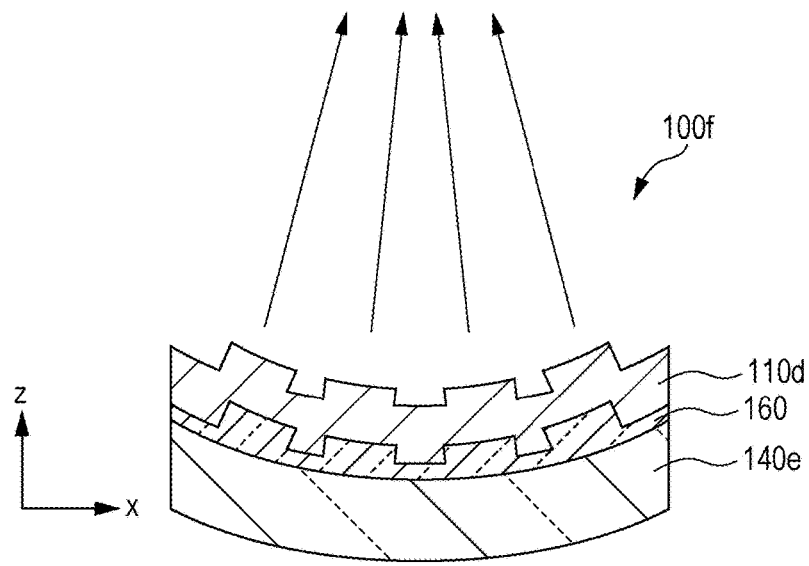
FIG. 43 is a schematic cross-sectional view of a light-emitting device having an intermediate layer according to a modified example of the second embodiment.

FIG. 43 illustrates a light-emitting device 1001 that includes an intermediate layer 160 between a photoluminescent layer 110d and a transparent substrate 140e. The intermediate layer 160 has a periodic structure. In FIG. 43, the intermediate layer 160 has the periodic structure, and the photoluminescent layer 110d is formed on the intermediate layer 160. Consequently, the photoluminescent layer 110d has a periodic structure corresponding to the periodic structure of the intermediate layer 160. The photoluminescent layer 110d may have a smoothed surface, as in FIG. 19B.

The material of the intermediate layer 160 may be different from the material of the transparent substrate 140e, For example, the transparent substrate 140e may be formed of sapphire, and the intermediate layer 160 may be formed of quartz ($SiO_2$).

Although the intermediate layer 160 in FIG. 43 is a continuous layer having projections, the intermediate layer 160 may be composed of members that are spaced from one another.

2-4. Other Modified Examples

Various light-emitting devices according to the first embodiment and modified examples thereof may be curved to produce light-emitting devices according to the present embodiment.

Light-emitting devices may include a diffusion-barrier layer, as illustrated in FIGS. 29A to 29D, and/or a light-transmissive thermally conductive layer, as illustrated in FIGS. 32A and 32B. Light-emitting devices may include a surface protective layer, as illustrated in FIGS. 31A and 31B.

3. Production Method

Various methods for producing a light-emitting device will be described below.

First, a transparent substrate is prepared. A film containing a photoluminescent material is formed on the transparent substrate, for example, by sputtering, a sol-gel method, or chemical vapor deposition (CVD). The film is then fired in a reducing atmosphere or in the air. When the photoluminescent material is an inorganic material, firing can improve crystallinity. When the transparent substrate is a quartz substrate, the firing temperature ranges from approximately 950° C. to 1200° C., for example. When the transparent substrate is a soda-lime glass substrate, the film may be fired by laser or plasma.

Firing reduces the volume of the film. The film shrinks not only in the thickness direction but also along the contact surface between the film and the substrate. Thus, the transparent substrate and the film are curved such that the surface of the transparent substrate on which the film is formed becomes a concave surface. Consequently, a multilayer body of the curved photoluminescent layer and the curved transparent substrate is formed.

A surface of the photoluminescent layer is then processed to form a periodic structure. In this manner, a light-emitting device including a transparent substrate as illustrated in FIG. 42 is produced.

Alternatively, a dielectric film may be formed on the photoluminescent layer and may be patterned. Thus, a light-transmissive layer having a periodic structure can be formed.

Alternatively, the periodic structure may be formed by nanoimprinting.

The photoluminescent layer or a multilayer body of the photoluminescent layer and the light-transmissive layer may be separated from the substrate. Thus, as illustrated in FIG. 39 or 40, a light-emitting device with no substrate is produced.

Before a layer is formed on the transparent substrate, a periodic structure may be formed on the transparent substrate, for example, by a semiconductor process or nanoimprinting. The periodic structure may be formed by processing a surface of the transparent substrate. Alternatively, a film of a material that is different from the material of the transparent substrate is formed on the transparent substrate, and the film may be patterned or nanoimprinted to form a periodic structure. Thus, as illustrated in FIG. 43, a light-emitting device including an intermediate layer can be provided.

The photoluminescent layer may have a smoothed surface.

4. Measurement Example of Curvature

A surface profile of a sample of a light-emitting device including a curved photoluminescent layer was measured.

The sample included a photoluminescent layer on a transparent substrate but had no periodic structure on the photoluminescent layer. For example, the surface profile of the sample corresponds to a substantially concave surface profile obtained by ignoring the periodic structure in the light-emitting device 100e illustrated in FIG. 41.

The sample was produced as described below. First, a quartz substrate 15 mm square was prepared. The quartz substrate had a thickness of 0.5 mm. A film of a photoluminescent material YAG:Ce was formed on the quartz substrate (thickness: approximately 300 nm). The YAG:Ce film was fired in a reducing atmosphere at a firing temperature of approximately 1000° C. for 4 hours, Consequently, the sample having a multilayer structure of the quartz substrate and the photoluminescent layer was formed.

The surface profile of the photoluminescent layer of the sample was measured with a Bruker stylus profiler DEKTAK XT ("DEKTAK" is a registered trademark of Bruker Nano Inc.). The tip of the stylus had a radius of 12.5 µm.

Figure 44:
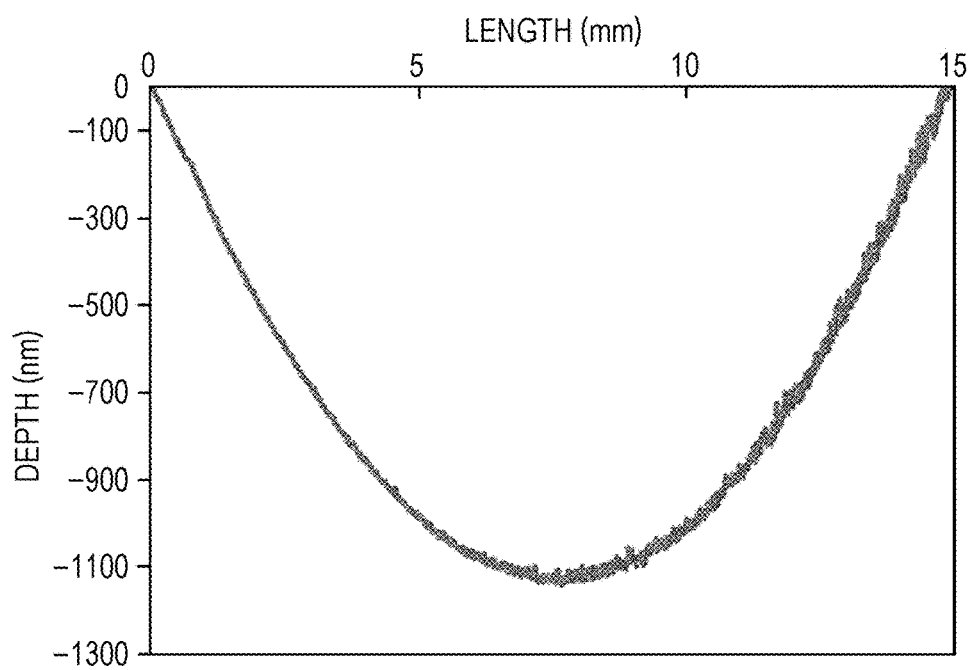
FIG. 44 is a graph showing the measurement results of the surface profile of a curved photoluminescent layer.

FIG. 44 shows the measurement results of the surface profile of the sample. The vertical axis in FIG. 44 represents the depth (negative height) from a virtual tangent plane to the top surface of the photoluminescent layer. The virtual tangent plane is a plane in contact with the edge of the top surface of the photoluminescent layer.

As shown in FIG. 44, the depth of the center of the top surface of the photoluminescent layer from the edge of the top surface was approximately 1.1 µm.

A light-emitting device having almost the same curvature as this sample can condense light to a point approximately 25.6 m distant from the surface thereof, if the surface is an arc-shaped surface and the light is vertically emitted from each point on the surface. Thus, the present embodiment can improve the directionality of light emission.

Third Embodiment

A light-emitting device according to a third embodiment of the present disclosure will be described below with reference to the accompanying drawings. Points of difference between the first or second embodiment and the third embodiment will be mainly described below.

1. Light-Emitting Device

Figure 45:
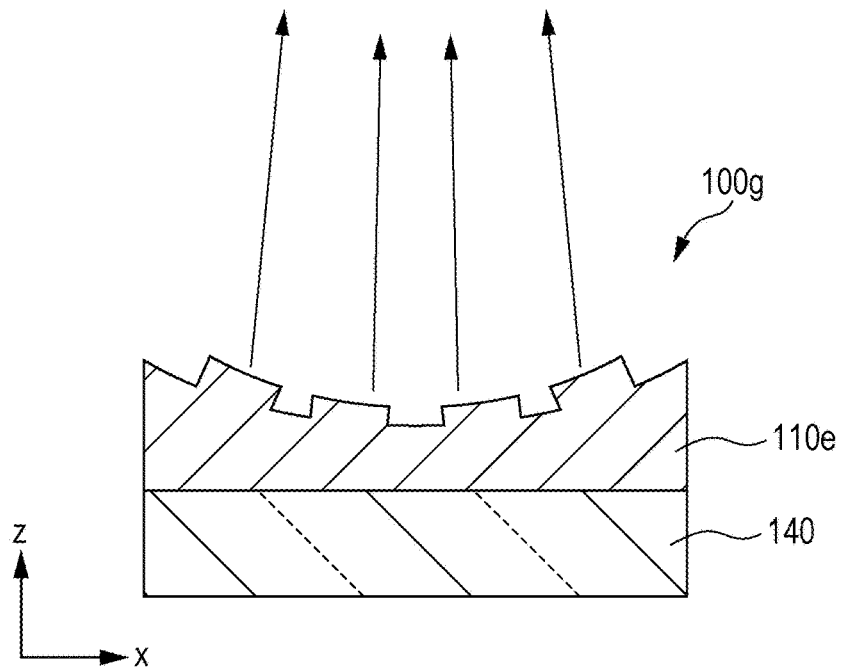
FIG. 45 is a schematic cross-sectional view of a light-emitting device according to a third embodiment.

FIG. 45 is a schematic cross-sectional view of a light-emitting device 100g.

The light-emitting device 100g includes a transparent substrate 140 and a photoluminescent layer 110e. The photoluminescent layer 110e has a periodic structure. In the light-emitting device 100g, the photoluminescent layer 110e has a flat bottom surface and a concave top surface. In other words, the photoluminescent layer 110e of the light-emitting device 100g has a different thickness at each position. In FIG. 45, the thickness of the photoluminescent layer 110e decreases from the edge to the center of the photoluminescent layer 110e.

Figure 46:
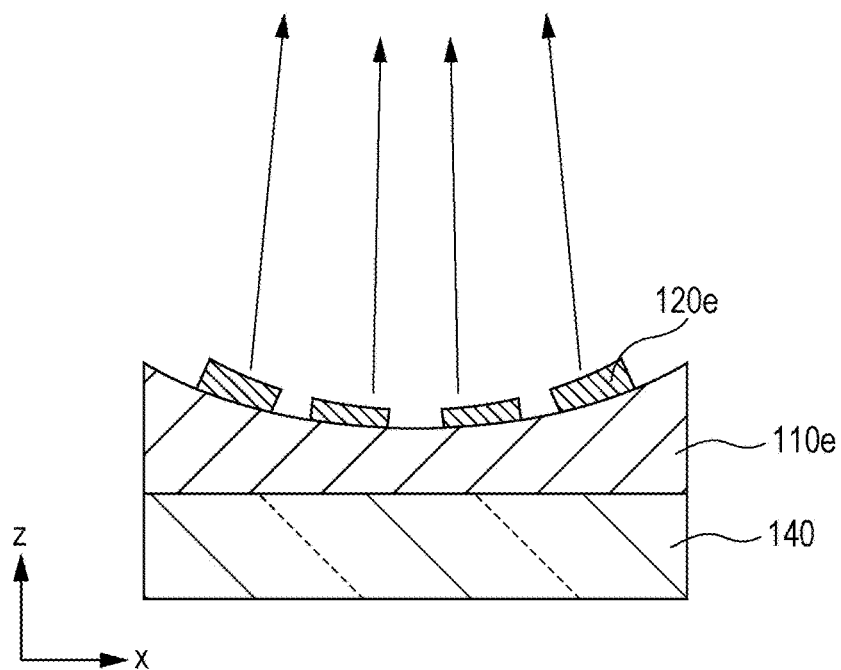
FIG. 46 is a schematic cross-sectional view of a light-emitting device including a light-transmissive layer according to a modified example of the third embodiment.

FIG. 46 illustrates a light-emitting device that includes light-transmissive members 120e on a photoluminescent layer 110e. The light-transmissive members 120e constitute a light-transmissive layer. The light-transmissive members 120e may be formed of a dielectric material having low light absorptivity.

In FIGS. 45 and 46, the transparent substrate 140 is not curved and has flat top and bottom surfaces. Thus, the photoluminescent layer 110e also has a flat bottom surface facing the top surface of the transparent substrate 140. The light-emitting devices illustrated in FIGS. 45 and 46 may not include the transparent substrate 140.

2. Effects of Thickness Distribution of Photoluminescent Layer

As described in section 2-2 in the first embodiment, in a light-emitting device having a periodic structure, the thickness of a photoluminescent layer can be adjusted to enhance light having a particular wavelength. A photoluminescent layer having varying thicknesses can emit light having varying wavelengths.

Figure 47:
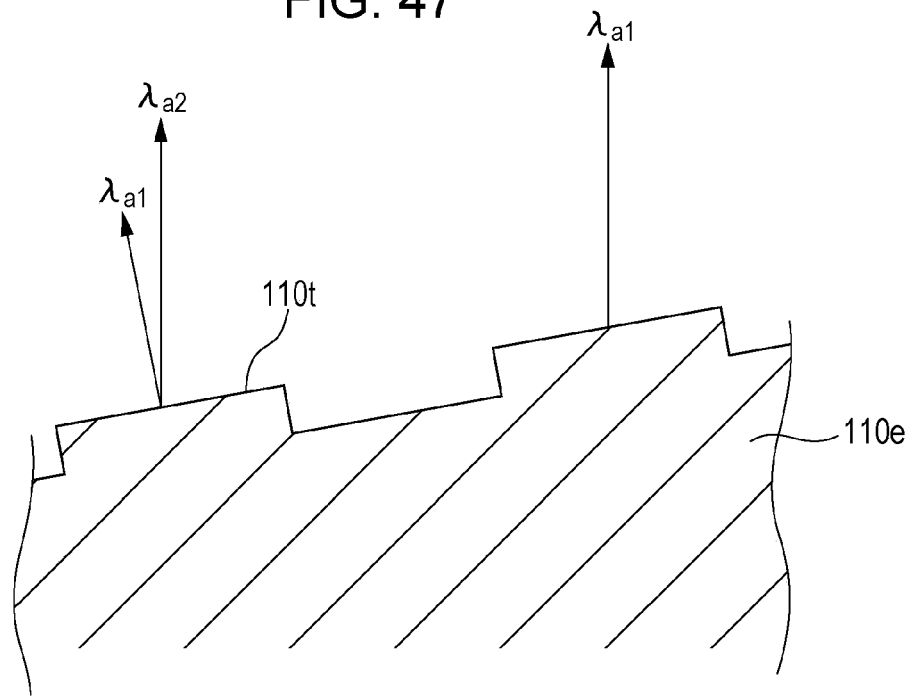
FIG. 47 is a schematic fragmentary enlarged cross-sectional view of a photoluminescent layer.
Figure 48:
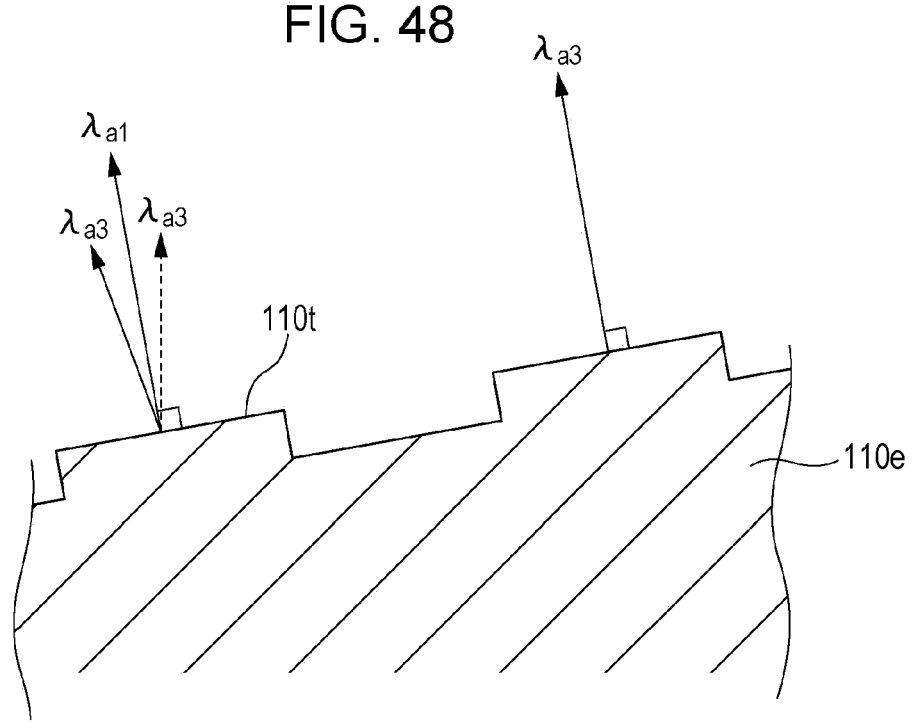
FIG. 48 is a schematic fragmentary enlarged cross-sectional view of a photoluminescent layer.

FIGS. 47 and 48 are schematic fragmentary enlarged cross-sectional views of the photoluminescent layer 110e of the light-emitting device 100g. FIGS. 47 and 48 illustrate two projections of the periodic structure. In FIGS. 47 and 48, the left side is closer to the center of the top surface of the photoluminescent layer 110e, and the right side is closer to the edge of the top surface of the photoluminescent layer 110e.

In FIG. 47, light having a wavelength $\lambda_{a1}$ is emitted from the top surface 110t of the right projection in the direction normal to the transparent substrate 140. Light having a wavelength $\lambda_{a2}$, which is different from the wavelength $\lambda_{a1}$, is emitted from the top surface 110t of the left projection in the direction normal to the transparent substrate 140. Thus, the wavelength of light emitted in a particular direction (e.g., in the front direction of the light-emitting device) can be broadened by the varying thickness of the photoluminescent layer 110e as illustrated in FIG. 45.

In FIG. 47, light having the wavelength $\lambda_{a1}$ is emitted from the top surface 110t of the left projection in a direction inclined to the center of the top surface of the photoluminescent layer 110e with respect to the direction normal to the transparent substrate 140. Thus, at least part of light having the wavelength $\lambda_{a1}$ emitted from the concave top surface of the photoluminescent layer 110e can approach the normal line that passes through the center of the top surface of the photoluminescent layer 110e and that is perpendicular to the bottom surface of the photoluminescent layer 110e.

In FIG. 48, light having a wavelength $\lambda_{a1}$ is emitted from the top surface 110t of the left projection in the direction normal to the top surface 110t. Light having a wavelength $\lambda_{a3}$, which is different from the wavelength $\lambda_{a1}$, is emitted from the top surface 110t of the right projection in the direction normal to the top surface 110t. Thus, light beams of different wavelengths emitted from the concave top surface of the photoluminescent layer 110e can approach the normal line that passes through the center of the top surface of the photoluminescent layer 110e and that is perpendicular to the bottom surface of the photoluminescent layer 110e. Thus, light beams of different wavelengths emitted from the light-emitting device are mixed and can have smaller color variations.

3. Modified Examples

Modified examples of the present embodiment will be described below. The present embodiment also includes combinations of these modified examples.

3-1. Convex Photoluminescent Layer

Figure 49:
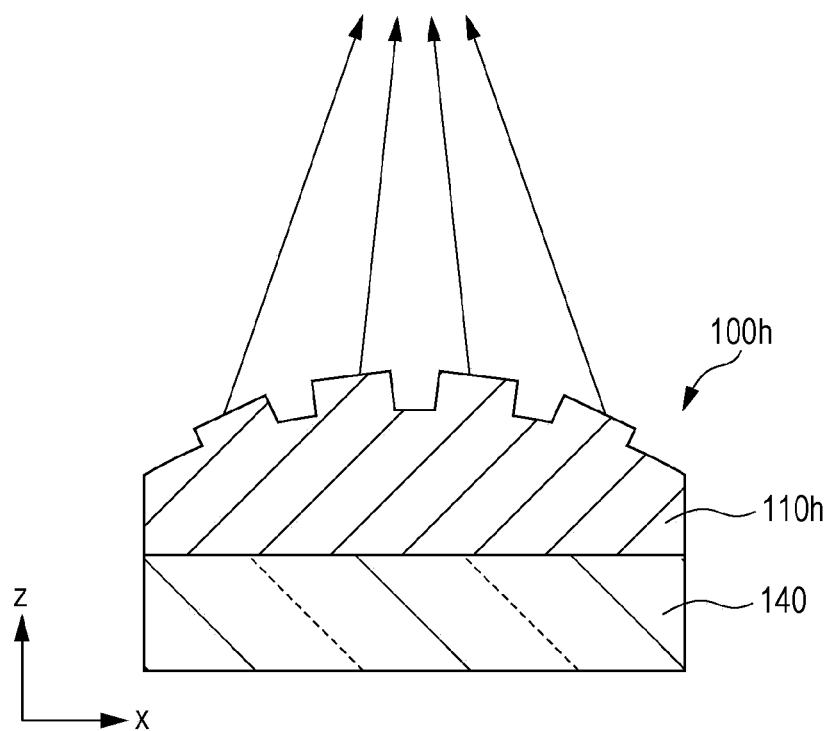
FIG. 49 is a schematic cross-sectional view of a light-emitting device including a convex photoluminescent layer according to a modified example of the third embodiment.

FIG. 49 illustrates a light-emitting device 100h that includes a photoluminescent layer 110h having an increasing thickness from the edge to the center. In FIG. 49, the photoluminescent layer 110h has a substantially convex top surface. In FIG. 49, the photoluminescent layer 110h has a periodic structure on its top surface.

FIG. 48 can be assumed to be a fragmentary enlarged cross-sectional view of the photoluminescent layer 110h of the light-emitting device 100h. In FIG. 48, the left side is closer to the edge of the top surface of the photoluminescent layer 110h, and the right side is closer to the center of the top surface of the photoluminescent layer 110h.

In FIG. 48, light having a wavelength $\lambda_{a1}$ is emitted from the top surface 110t of the left projection in the direction normal to the top surface 110t. In FIG. 48, light having a wavelength $\lambda_{a3}$, which is different from the wavelength $\lambda_{a1}$, is also emitted from the top surface 110t of the left projection. For example, in the case of a one-dimensional periodic structure of the photoluminescent layer 110h, light having the wavelength $\lambda_{a3}$ is emitted in two directions symmetrical with respect to the direction normal to the top surface 110t. Light emitted in the two directions corresponds to light having a positive diffraction order m and light having a negative diffraction order m. For example, light having the positive diffraction order m approaches the normal line that passes through the center of the top surface of the photoluminescent layer 110h and that is perpendicular to the bottom surface of the photoluminescent layer 110h. On the other hand, light having the negative diffraction order m propagates in a direction away from the normal line.

The order and sign of diffracted light emitted from the periodic structure depend on the design of the periodic structure. The structure as illustrated in FIG. 49 can selectively emit diffracted light having a particular order m from the photoluminescent layer and thereby allows light to converge. For example, the diffraction order of emitted light can be changed with the cross-sectional shape of the projections, such as trapezoidal or triangular.

Furthermore, as is clear from FIG. 47, even when the photoluminescent layer 110e containing a photoluminescent material that emits light having a particular wavelength is used, the order of diffracted light can be controlled with a periodic structure to achieve high directionality. Although light having wavelengths other than a particular wavelength can be removed through a color filter, a photoluminescent material is advantageously used to limit the wavelength because this can reduce the loss.

The photoluminescent layer 110h illustrated in FIG. 49 may be formed by sputtering, for example. In this case, the relative positions of the center of the target and the rotation center of the transparent substrate 140 can be adjusted to provide a distribution of the thickness of the photoluminescent layer 110h.

3-2. Photoluminescent Layer Having Inclined Plane

Figure 50:
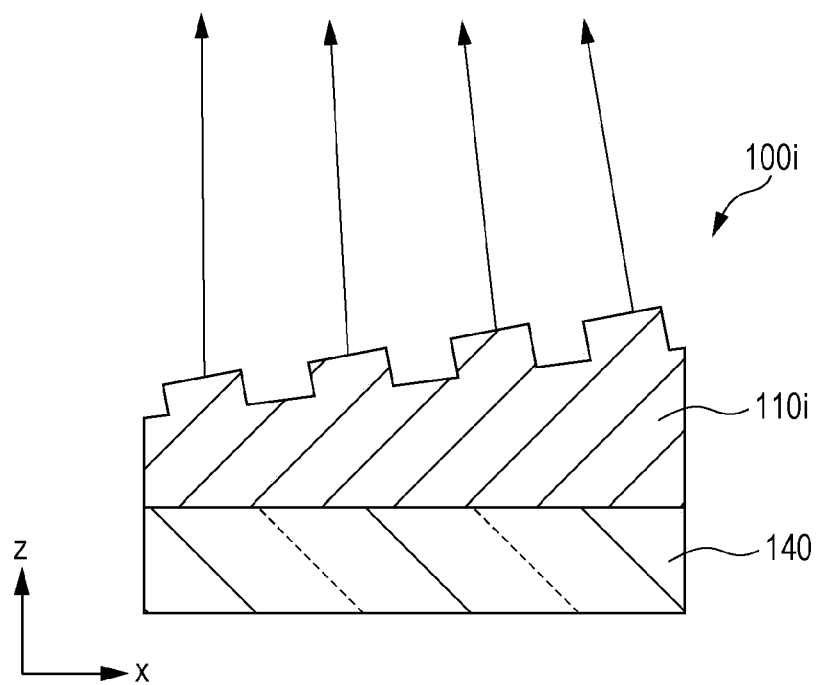
FIG. 50 is a schematic cross-sectional view of a light-emitting device including a photoluminescent layer having an inclined plane according to a modified example of the third embodiment.

FIG. 50 illustrates a light-emitting device 100i that includes a photoluminescent layer 110i having a monotonously decreasing or increasing thickness from one end portion to the other end portion. The light-emitting device 100i includes a transparent substrate 140 on which the photoluminescent layer 110i is disposed. The light-emitting device 100i may not include the transparent substrate 140. In FIG. 50, the photoluminescent layer 110i has a flat bottom surface in direct contact with the transparent substrate 140. The photoluminescent layer 110i has a periodic structure 120i on its top surface.

As in the light-emitting devices described above, the light-emitting device 100i illustrated in FIG. 50 can emit light having a particular wavelength in a particular direction and thus condense the light.

Although the thickness of the photoluminescent layer 110i illustrated in FIG. 50 changes linearly from one end portion to the other end portion, the thickness may change non-linearly. The photoluminescent layer 110i may have a flat or curved top surface. The light-emitting device 100i may be produced by dividing the light-emitting device 100g illustrated in FIG. 45 or the light-emitting device 100h illustrated in FIG. 49.

3-3. Other Modified Examples

The top surface of the photoluminescent layer of each of the light-emitting devices according to the first embodiment and its modified examples and the second embodiment and its modified examples may be a concave, convex, or inclined surface.

Although the photoluminescent layer in the embodiments illustrated in FIGS. 45, 46, and 49 has a curved top surface, the top surface of the photoluminescent layer may be composed of plane regions.

It goes without saying that various modifications in light-emitting devices including an almost flat photoluminescent layer are also applicable to light-emitting devices including a photoluminescent layer having different thicknesses at different in-plane positions.

Light-emitting devices according to the present disclosure can be used in lighting fixtures, displays, and projectors.

What is claimed is:

1. A light-emitting device comprising:
  a photoluminescent layer that emits light, the photoluminescent layer being curved; and
  a light-transmissive layer on which the emitted light is to be incident, the light-transmissive layer being curved,
  wherein at least one of the photoluminescent layer and the light-transmissive layer defines a surface structure that has projections and/or recesses to limit a directional angle of the emitted light, and
  the surface structure satisfies $\lambda_a/n_{wav-a} < D_{int} < \lambda_a$, where $D_{int}$ denotes a distance between adjacent two of the projections or between adjacent two of the recesses, $n_{wav-a}$ denotes a refractive index of the photoluminescent layer for the emitted light, and $\lambda_a$ denotes a wavelength of the emitted light in air.

2. The light-emitting device according to claim 1, wherein the surface structure is defined by a surface of the light-transmissive layer.

3. The light-emitting device according to claim 2, wherein the distance between the surface structure and the photoluminescent layer is less than half of a wavelength of the emitted light.

4. The light-emitting device according to claim 2, wherein the lighttransmissive layer has a higher refractive index than the photoluminescent layer.

5. The light-emitting device according to claim 1, wherein the light-transmissive layer is in direct contact with the photoluminescent layer, and
  the surface structure is defined by an interface between the photoluminescent layer and the light-transmissive layer.

6. The light-emitting device according to claim 1, wherein the light-transmissive layer includes light-transmissive members spaced from one another on the photoluminescent layer, and
  the surface structure is defined by (i) regions, which are not covered with the light-transmissive members, of a surface of the photoluminescent layer, and (ii) regions, which are not in direct contact with the photoluminescent layer, of surfaces of the light-transmissive members.

7. The light-emitting device according to claim 1, further comprising a substrate, having a curved surface on which the photoluminescent layer is disposed.

8. The light-emitting device according to claim 1, wherein the projections and/or recesses are arranged along a curved face, and
  the emitted light is extracted through the surface structure.

9. The light-emitting device according to claim 1, wherein the surface structure limits the directional angle of the emitted light having a wavelength to less than 15 degrees.

10. The light-emitting device according to claim 1, wherein the surface structure includes a periodic structure that satisfies $\lambda_a/n_{wav-a} < p_a < \lambda_a$, where $p_a$ denotes a period of the periodic structure, $n_{wav-a}$ denotes a refractive index of the photoluminescent layer for the emitted light, and $\lambda_a$ denotes a wavelength of the emitted light in air.

11. A light-emitting device comprising:
  a photoluminescent layer that emits light, the photoluminescent layer having a curved surface,
  wherein the curved surface includes a surface structure having projections and/or recesses to limit a directional angle of the emitted light, and
  the surface structure satisfies $\lambda_a/n_{wav-a} < D_{int} < \lambda_a$, where $D_{int}$ denotes a distance between adjacent two of the projections or between adjacent two of the recesses, $n_{wav-a}$ denotes a refractive index of the photoluminescent layer for the emitted light, and $\lambda_a$ denotes a wavelength of the emitted light in air.

12. The light-emitting device according to claim 11, wherein the photoluminescent layer has another curved surface that is opposed to the curved surface and is curved along the curved surface.

13. The light-emitting device according to claim 11, wherein a thickness of the photoluminescent layer decreases or increases from an edge to a center thereof.

14. The light-emitting device according to claim 11, further comprising a substrate having a curved surface on which the photoluminescent layer is disposed.

15. The light-emitting device according to claim 11, wherein the emitted light is extracted through the surface structure.

16. The light-emitting device according to claim 11, wherein the surface structure limits the directional angle of the emitted light having a wavelength to less than 15 degrees.

17. The light-emitting device according to claim 11, wherein the surface structure includes a periodic structure that satisfies $\lambda_a/n_{wav-a} < p_a < \lambda_a$, where $p_a$ denotes a period of the periodic structure, $n_{wav-a}$ denotes a refractive index of the photoluminescent layer for the emitted light, and $\lambda_a$ denotes a wavelength of the emitted light in air.

18. A light-emitting device comprising:
  a photoluminescent layer that emits light, a thickness of the photoluminescent layer decreasing or increasing from one end to another end thereof, wherein the photoluminescent layer has a surface structure having projections and/or recesses to limit a directional angle of the emitted light, and the surface structure satisfies $\lambda_a/n_{wav-a} < D_{int} < \lambda_a$, where $D_{int}$ denotes a distance between adjacent two of the projections or between adjacent two of the recesses, $n_{wav-a}$ denotes a refractive index of the photoluminescent layer for the emitted light, and $\lambda_a$ denotes a wavelength of the emitted light in air.

* * * * *